United States Patent
Koyama

(10) Patent No.: US 8,933,624 B2
(45) Date of Patent: *Jan. 13, 2015

(54) LIGHT EMITTING DEVICE

(71) Applicant: Semiconductor Energy Laboratory Co., Ltd., Kanagawa-ken (JP)

(72) Inventor: Jun Koyama, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/783,924

(22) Filed: Mar. 4, 2013

(65) Prior Publication Data

US 2013/0214261 A1 Aug. 22, 2013

Related U.S. Application Data

(60) Continuation of application No. 13/189,231, filed on Jul. 22, 2011, now Pat. No. 8,390,190, which is a continuation of application No. 11/820,394, filed on Jun. 19, 2007, now Pat. No. 7,986,094, which is a (Continued)

(30) Foreign Application Priority Data

Oct. 26, 1999 (JP) ................................. 11-304679
Nov. 29, 1999 (JP) ................................. 11-337003

(51) Int. Cl.
*H01L 51/00* (2006.01)
*G09G 3/20* (2006.01)
(Continued)

(52) U.S. Cl.
CPC .......... *H01L 51/5012* (2013.01); *G09G 3/2077* (2013.01); *G09G 2300/0842* (2013.01);
(Continued)

(58) Field of Classification Search
CPC ............ H01L 27/1214; H01L 51/5012; H01L 51/5203; H01L 27/33; H01L 33/08; H05B 33/0803
USPC .................................................. 313/504, 512
See application file for complete search history.

(56) References Cited

U.S. PATENT DOCUMENTS 4,356,429 A 10/1982 Tang
4,520,075 A 5/1985 Igarashi et al.
(Continued)

FOREIGN PATENT DOCUMENTS

CN 1182887 A 5/1998
CN 1219722 A 6/1999
(Continued)

OTHER PUBLICATIONS

Mizukami, M. et al, "36.1: 6-Bit Digital VGA OLED," SID 00 Digest, vol. 31, 2000, pp. 912-915.
(Continued)

*Primary Examiner* — Karabi Guharay
(74) *Attorney, Agent, or Firm* — Husch Blackwell LLP

(57) ABSTRACT

An electro-optical device for performing time division gray scale display and which is capable of arbitrarily setting the amount of time during which light is emitted by EL elements is provided. From among n sustain periods Ts1, ..., Tsn, the brightness of light emitted by the EL elements during at least one sustain period is set to be always lower than the brightness of light emitted by the EL elements during the other sustain periods, and the sustain periods are extended by the amount that the brightness has dropped. In accordance with the above structure, the sustain periods can be extended by lowering the setting of the brightness of light emitted by the EL elements.

37 Claims, 22 Drawing Sheets

Related U.S. Application Data continuation of application No. 10/435,968, filed on May 12, 2003, now Pat. No. 7,239,083, which is a division of application No. 09/692,713, filed on Oct. 19, 2000, now Pat. No. 6,587,086.

(51) Int. Cl.
  *H01L 27/32* (2006.01)
  *G09G 3/32* (2006.01)
  *H01L 27/12* (2006.01)
  *H01L 51/50* (2006.01)

(52) U.S. Cl.
  CPC ...... *G09G2300/043* (2013.01); *H01L 27/3246* (2013.01); *G09G 3/3233* (2013.01); *G09G 2300/0426* (2013.01); *G09G 2320/0276* (2013.01); *H01L 27/1214* (2013.01); *G09G 3/3258* (2013.01); *G09G 3/3266* (2013.01); *Y10S 428/917* (2013.01); *G09G 2320/029* (2013.01); *G09G 2300/0408* (2013.01); *G09G 2300/0866* (2013.01); *G09G 3/2022* (2013.01); *G09G 2300/0847* (2013.01); *G09G 3/2081* (2013.01); *G09G 2300/0809* (2013.01); *G09G 2300/0417* (2013.01); *G09G 3/2018* (2013.01); *G09G 3/3291* (2013.01); *G09G 3/3275* (2013.01); *G09G 2320/0285* (2013.01)
  USPC ............................ 313/504; 313/512; 428/917

(56) References Cited

U.S. PATENT DOCUMENTS

| | | | |
|---|---|---|---|
| 4,539,507 A | 9/1985 | Van Slyke et al. |
| 4,720,432 A | 1/1988 | Van Slyke et al. |
| 4,769,292 A | 9/1988 | Tang et al. |
| 4,885,211 A | 12/1989 | Tang et al. |
| 4,950,950 A | 8/1990 | Perry et al. |
| 5,047,687 A | 9/1991 | Van Slyke |
| 5,059,861 A | 10/1991 | Littman et al. |
| 5,059,862 A | 10/1991 | Van Slyke et al. |
| 5,061,617 A | 10/1991 | Maskasky |
| 5,073,446 A | 12/1991 | Scozzafava et al. |
| 5,151,629 A | 9/1992 | Van Slyke |
| 5,294,869 A | 3/1994 | Tang et al. |
| 5,294,870 A | 3/1994 | Tang et al. |
| 5,515,187 A | 5/1996 | Nakamura et al. |
| 5,550,066 A | 8/1996 | Tang et al. |
| 5,555,000 A | 9/1996 | Sarrasin et al. |
| 5,587,329 A | 12/1996 | Hseuh et al. |
| 5,652,067 A | 7/1997 | Ito et al. |
| 5,652,600 A | 7/1997 | Khormaei et al. |
| 5,684,365 A | 11/1997 | Tang et al. |
| 5,717,417 A | 2/1998 | Takahashi |
| 5,748,160 A | 5/1998 | Shieh et al. |
| 5,767,828 A | 6/1998 | McKnight |
| 5,771,562 A | 6/1998 | Harvey, III et al. |
| 5,818,419 A | 10/1998 | Tajima et al. |
| 5,839,456 A | 11/1998 | Han |
| 5,851,861 A | 12/1998 | Suzawa et al. |
| 5,858,562 A | 1/1999 | Utsugi et al. |
| 5,882,761 A | 3/1999 | Kawami et al. |
| 5,932,892 A | 8/1999 | Hseuh et al. |
| 5,959,598 A | 9/1999 | McKnight |
| 5,962,962 A | 10/1999 | Fujita et al. |
| 5,966,193 A | 10/1999 | Zhang et al. |
| 5,990,629 A | 11/1999 | Yamada et al. |
| 6,020,865 A | 2/2000 | Okuda et al. |
| 6,046,490 A | 4/2000 | Arita et al. |
| 6,057,897 A | 5/2000 | Ichikawa et al. |
| 6,072,450 A | 6/2000 | Yamada et al. |
| 6,078,368 A | 6/2000 | Ichikawa et al. |
| 6,087,648 A | 7/2000 | Zhang et al. |
| 6,100,860 A | 8/2000 | Takayama et al. |
| 6,115,090 A | 9/2000 | Yamazaki |
| 6,124,604 A | 9/2000 | Koyama et al. |
| 6,127,998 A | 10/2000 | Ichikawa et al. |
| 6,163,352 A | 12/2000 | Ichikawa et al. |
| 6,172,733 B1 | 1/2001 | Hong et al. |
| 6,191,764 B1 | 2/2001 | Kono et al. |
| 6,194,837 B1 | 2/2001 | Ozawa |
| 6,215,466 B1 | 4/2001 | Yamazaki et al. |
| 6,218,219 B1 | 4/2001 | Yamazaki et al. |
| 6,222,315 B1 | 4/2001 | Yoshizawa et al. |
| 6,225,991 B1 | 5/2001 | McKnight |
| 6,229,505 B1 | 5/2001 | Fujii |
| 6,229,583 B1 | 5/2001 | Yasunishi |
| 6,243,072 B1 | 6/2001 | McKnight |
| 6,246,179 B1 | 6/2001 | Yamada |
| 6,274,861 B1 | 8/2001 | Zhang et al. |
| 6,274,887 B1 | 8/2001 | Yamazaki et al. |
| 6,278,423 B1 | 8/2001 | Wald et al. |
| 6,281,552 B1 | 8/2001 | Kawasaki et al. |
| 6,295,054 B1 | 9/2001 | McKnight |
| 6,326,941 B1 | 12/2001 | Yamazaki et al. |
| 6,335,716 B1 | 1/2002 | Yamazaki et al. |
| 6,351,077 B1 | 2/2002 | Koyama |
| 6,359,606 B1 | 3/2002 | Yudasaka |
| 6,362,798 B1 | 3/2002 | Kimura et al. |
| 6,366,025 B1 | 4/2002 | Yamada |
| 6,369,832 B1 | 4/2002 | McKnight |
| 6,380,672 B1 | 4/2002 | Yudasaka |
| 6,399,933 B2 | 6/2002 | Zhang et al. |
| 6,399,988 B1 | 6/2002 | Yamazaki |
| 6,407,431 B2 | 6/2002 | Yamazaki et al. |
| 6,452,589 B1 | 9/2002 | McKnight |
| 6,545,424 B2 | 4/2003 | Ozawa |
| 6,559,433 B1 | 5/2003 | Ozawa |
| 6,573,564 B2 | 6/2003 | Yamazaki et al. |
| 6,593,990 B1 | 7/2003 | Yamazaki |
| 6,618,029 B1 | 9/2003 | Ozawa |
| 6,630,686 B1 | 10/2003 | Kim |
| 6,630,687 B1 | 10/2003 | Koyama et al. |
| 6,734,839 B2 | 5/2004 | Yudasaka |
| 6,778,159 B1 | 8/2004 | Yamazaki et al. |
| 6,784,411 B2 | 8/2004 | Zhang et al. |
| 6,852,965 B2 | 2/2005 | Ozawa |
| 6,863,961 B2 | 3/2005 | Miyashita et al. |
| 6,888,304 B2 | 5/2005 | Sato |
| 6,927,826 B2 | 8/2005 | Yamazaki |
| 7,079,124 B2 | 7/2006 | Yamazaki et al. |
| 7,102,169 B2 | 9/2006 | Koyama et al. |
| 7,173,584 B2 | 2/2007 | Kimura et al. |
| 7,190,428 B2 | 3/2007 | Yamazaki |
| 7,235,814 B2 | 6/2007 | Zhang et al. |
| 7,239,083 B2 | 7/2007 | Koyama |
| 7,288,420 B1 | 10/2007 | Yamazaki et al. |
| 7,323,717 B2 | 1/2008 | Koyama et al. |
| 7,397,451 B2 | 7/2008 | Ozawa |
| 7,436,463 B2 | 10/2008 | Yamazaki |
| 7,460,094 B2 | 12/2008 | Ozawa |
| 7,510,917 B2 | 3/2009 | Zhang et al. |
| 7,550,325 B2 | 6/2009 | Koyama et al. |
| 7,986,094 B2 | 7/2011 | Koyama |
| 8,168,975 B2 | 5/2012 | Koyama et al. |
| 8,390,190 B2* | 3/2013 | Koyama ...................... 313/504 |
| 8,576,144 B2 | 11/2013 | Kimura et al. |
| 2002/0070913 A1 | 6/2002 | Kimura et al. |
| 2002/0079484 A1 | 6/2002 | Yamazaki et al. |
| 2002/0105033 A1 | 8/2002 | Zhang |
| 2003/0090478 A1 | 5/2003 | McKnight |
| 2003/0151568 A1 | 8/2003 | Ozawa |
| 2005/0041122 A1 | 2/2005 | Yamazaki et al. |
| 2008/0158209 A1 | 7/2008 | Ozawa |
| 2008/0165174 A1 | 7/2008 | Ozawa |
| 2008/0198152 A1 | 8/2008 | Ozawa |
| 2008/0316152 A1 | 12/2008 | Kimura et al. |
| 2011/0122124 A1 | 5/2011 | Kimura et al. |

FOREIGN PATENT DOCUMENTS

| | | |
|---|---|---|
| EP | 0 566 408 A1 | 10/1993 |
| EP | 0 702 347 A1 | 3/1996 |
| EP | 0 717 445 A2 | 6/1996 |

(56) References Cited

FOREIGN PATENT DOCUMENTS

| | | |
|---|---|---|
| EP | 0 762 374 A1 | 3/1997 |
| EP | 0 776 147 A1 | 5/1997 |
| EP | 0 781 075 A1 | 6/1997 |
| EP | 0 837 445 A1 | 4/1998 |
| EP | 0 837 447 A1 | 4/1998 |
| EP | 0 845 812 A2 | 6/1998 |
| EP | 0 878 789 A2 | 11/1998 |
| EP | 0 932 137 A1 | 7/1999 |
| EP | 0 935 229 A1 | 8/1999 |
| EP | 0 942 583 A1 | 9/1999 |
| EP | 0 961 525 A1 | 12/1999 |
| EP | 1 003 150 A1 | 5/2000 |
| EP | 1 351 484 A1 | 10/2003 |
| EP | 1 505 649 A2 | 2/2005 |
| EP | 1 505 650 A2 | 2/2005 |
| EP | 1 505 651 A1 | 2/2005 |
| EP | 1 505 652 A2 | 2/2005 |
| EP | 1 594 116 A2 | 11/2005 |
| EP | 1 624 432 A2 | 2/2006 |
| EP | 2 112 693 A2 | 10/2009 |
| EP | 2 237 256 A2 | 10/2010 |
| EP | 2 280 389 A1 | 2/2011 |
| GB | 2 336 459 A | 10/1999 |
| JP | 5-100629 | 4/1993 |
| JP | 5-100630 | 4/1993 |
| JP | 6-11734 | 1/1994 |
| JP | 06-267654 A | 9/1994 |
| JP | 7-181916 | 7/1995 |
| JP | 7-181917 | 7/1995 |
| JP | 7-272859 | 10/1995 |
| JP | 8-78159 | 3/1996 |
| JP | 8-109373 | 4/1996 |
| JP | 8-241048 | 9/1996 |
| JP | 9-101759 | 4/1997 |
| JP | 9-114414 | 5/1997 |
| JP | 9-134781 | 5/1997 |
| JP | 9-138659 | 5/1997 |
| JP | 9-148066 | 6/1997 |
| JP | 10-31235 | 2/1998 |
| JP | 10-189525 | 7/1998 |
| JP | 10-198292 | 7/1998 |
| JP | 10-214060 | 8/1998 |
| JP | 10-232649 | 9/1998 |
| JP | 10-241857 A | 9/1998 |
| JP | 10-247735 | 9/1998 |
| JP | 10-268360 | 10/1998 |
| JP | 10-301533 | 11/1998 |
| JP | 10-312173 | 11/1998 |
| JP | 10-319907 A | 12/1998 |
| JP | 11-15430 | 1/1999 |
| JP | 11-24606 | 1/1999 |
| JP | 11-40344 | 2/1999 |
| JP | 11-74073 | 3/1999 |
| JP | 11-75115 | 3/1999 |
| JP | 11-97169 | 4/1999 |
| JP | 11-97182 | 4/1999 |
| JP | 11-103066 | 4/1999 |
| JP | 11-143379 | 5/1999 |
| JP | 11-185957 | 7/1999 |
| JP | 11-231805 A | 8/1999 |
| JP | 11-509647 | 8/1999 |
| JP | 11-272233 A | 10/1999 |
| JP | 11-282012 | 10/1999 |
| JP | 2000-56727 | 2/2000 |
| KR | 1998-0012498 | 4/1998 |
| KR | 1998-0032964 | 7/1998 |
| KR | 1998-042717 | 8/1998 |
| KR | 1998-082289 | 12/1998 |
| KR | 10-0283717 | 3/2001 |
| KR | 10-0385378 | 7/2003 |
| WO | WO 96/06456 A1 | 2/1996 |
| WO | WO 97/04436 A1 | 2/1997 |
| WO | WO 98/24271 A1 | 6/1998 |
| WO | WO 99/53472 A1 | 10/1999 |

OTHER PUBLICATIONS

Inukai, K. et al, "36.4L: Late-News Paper: 4.0in. TFT-OLED Displays and a Novel Digital Driving Method," SID 00 Digest, vol. 31, 2000, pp. 924-927.
Nishi, T. et al, "High Efficiency TFT-OLED Display with Iridium-Complex as Triplet Emissive Center," Proceedings of the 10$^{th}$ International Workshop on Inorganic and Organic Electroluminescence, (EL'00), Dec. 4-7, 2000, pp. 353-356.
Wu, C. et al, "P-19: Design of a Novel a-Si PIN/OLED Image Sensor & Display Device," SID 99 Digest, vol. 30, 1999, pp. 528-531.
European Search Report re application No. EP 00123262.8, dated Mar. 2, 2006.
Office Action re Korean application No. KR 2000-0063099, dated Aug. 10, 2007 (with English translation).
Office Action re Chinese application No. CN 200610084734.8, dated Jul. 18, 2008 (with English translation).

* cited by examiner

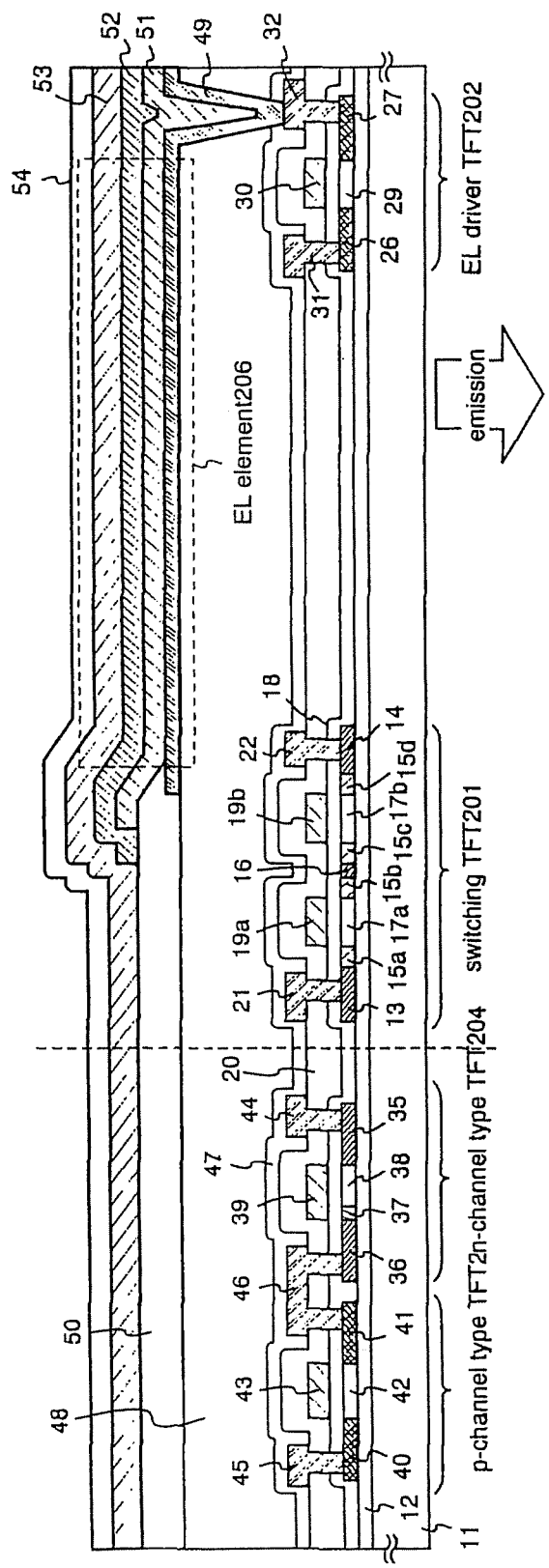

Fig.5

11:substrate 12:base film 13:source region 14:drain region 15a-15b:LDD regions
16:isolation region 17a,17b:channel formation regions 18:gate insulating film
19a,19b:gate electrode 20:first interlayer insulating film 21:source wiring line
22:drain wiring line 26:source region 27:drain region 28:LDD region 29:channel formation region
30:gate electrode 31:source wiring line 32:drain wiring line 35:source region
36:drain region 37:LDD region 38:channel formation region 39:gate electrode
40:source region 41:drain region 42:channel formation region 43:gate electrode
44,45:source wiring line 46:drain wiring line 47:first passivation film
48:second interlayer insulating film 49:pixel electrode(anode) 50:third interlayer insulating film
51:EL layer 52:opposite electrode(cathod) 53:protective electrode 54:second passivation film

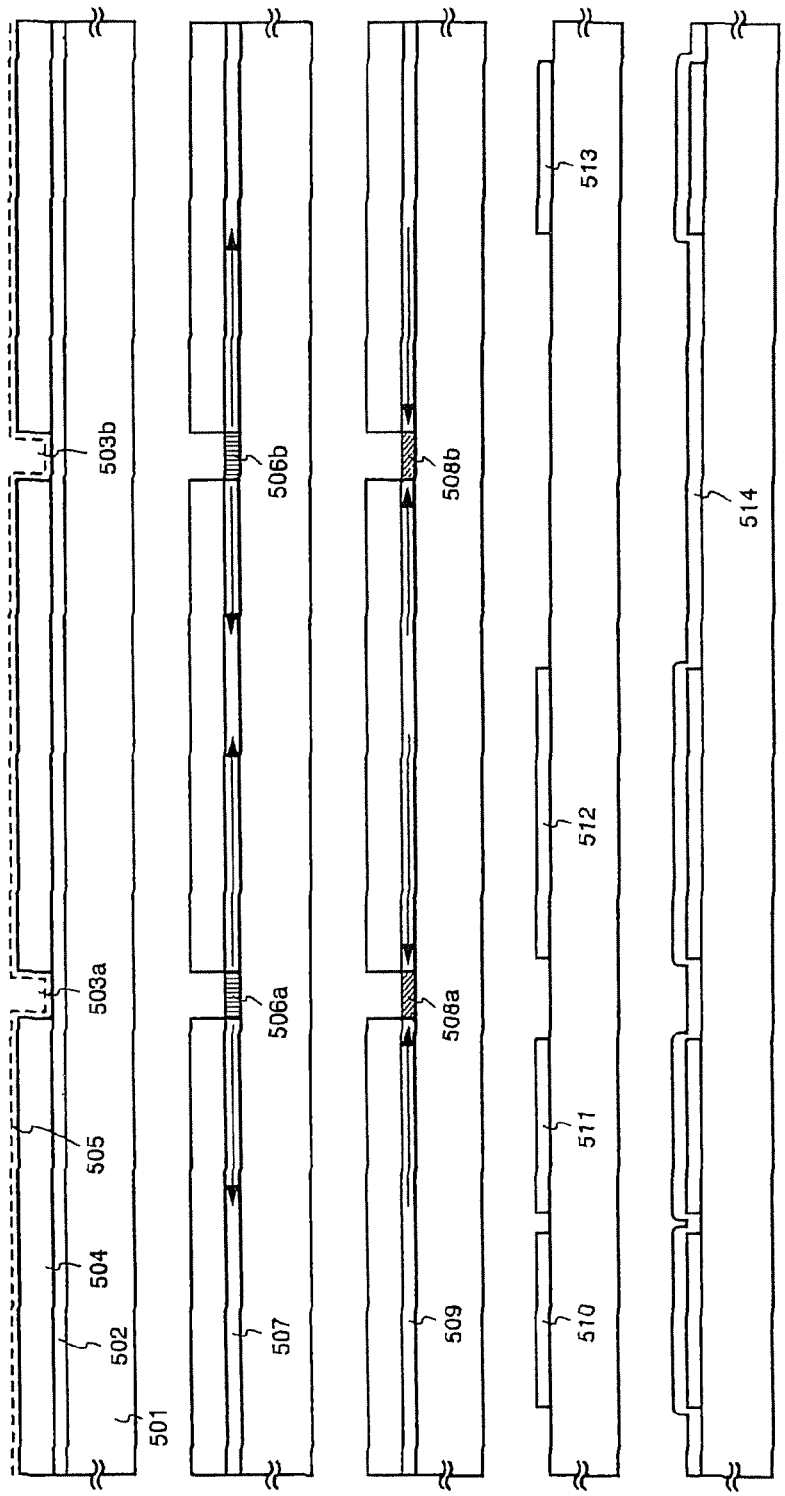

515,519a,519b:resist masks 516-518:p-type impurity regions
520,521:n-type impurity regions 522-525:gate electrodes

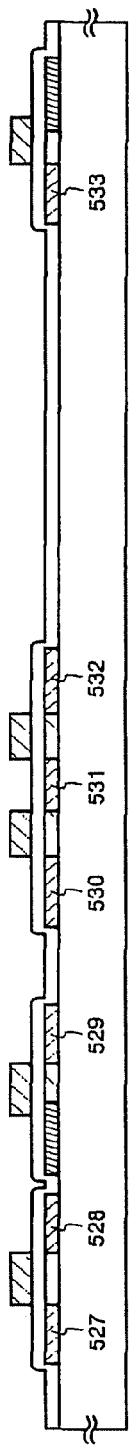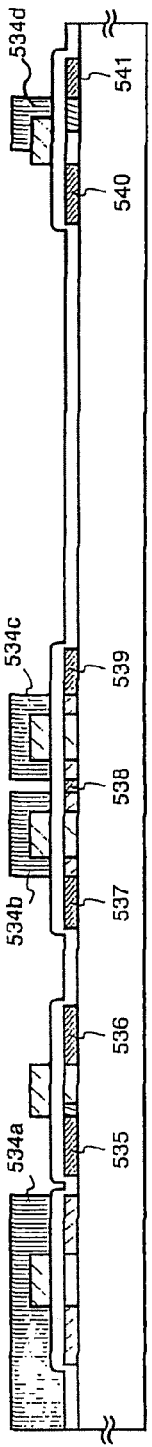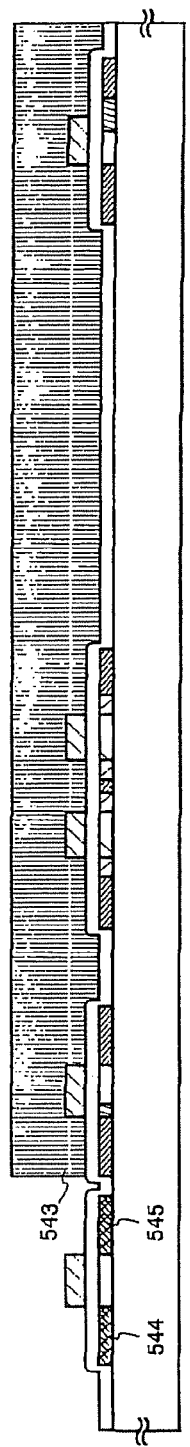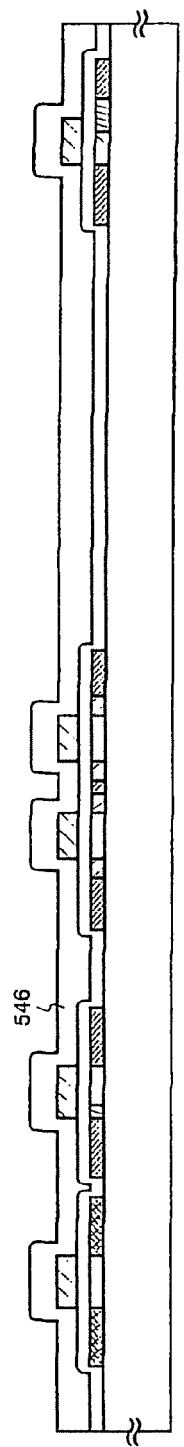
Fig.9A
Fig.9B
Fig.9C
Fig.9D
527-533:n-type impurity regions 534a-534c,543:resist masks 535-541:n-type impurity regions
544,545:p-type impurity regions 546:first interlayer insulating film

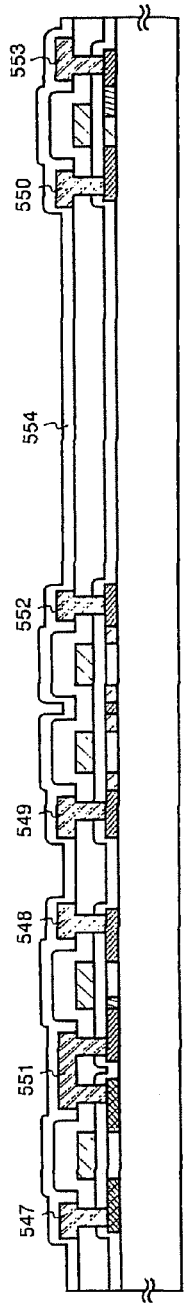
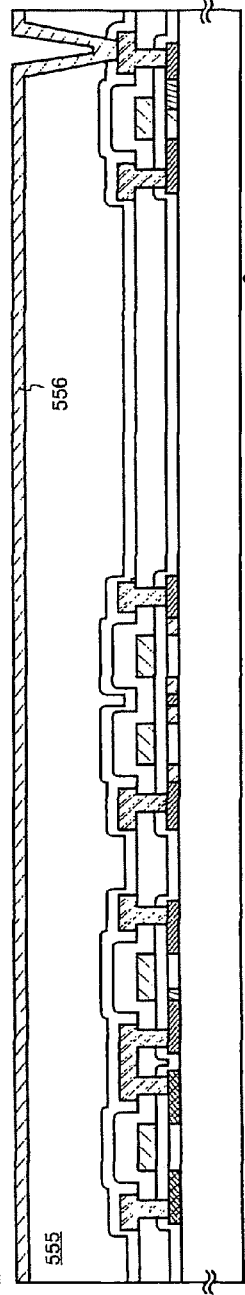
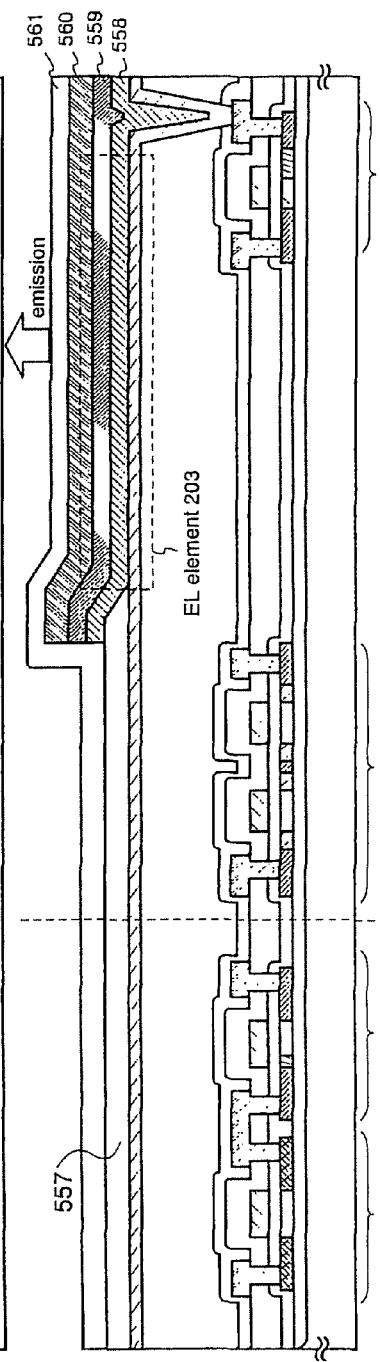
Fig.10A
Fig.10B
Fig.10C

2201:glass substrae 2202:pixel portion 2203:gate signal side driving circuit
2204:source signal side driving circuit 2205:switching TFT
2206:gate wiring line 2207:source wiring line 2208:EL driver TFT
2209:current-feed line 2211:EL element 2212:FPC
2213-2215:input-output wiring lines 2216:capacitor

| pre-compensation video signal | | | | | post-compensation video signal | | | |
|---|---|---|---|---|---|---|---|---|
| in1 | in2 | in3 | in4 | | out1 | out2 | out3 | out4 |
| 0 | 0 | 0 | 0 | → | 0 | 0 | 0 | 0 |
| 0 | 0 | 0 | 1 | → | 0 | 0 | 0 | 0 |
| ⋮ | ⋮ | ⋮ | ⋮ | | ⋮ | ⋮ | ⋮ | ⋮ |
| 1 | 0 | 0 | 0 | → | 0 | 1 | 0 | 0 |
| ⋮ | ⋮ | ⋮ | ⋮ | | ⋮ | ⋮ | ⋮ | ⋮ |
| 1 | 1 | 1 | 0 | → | 1 | 1 | 1 | 0 |
| 1 | 1 | 1 | 1 | → | 1 | 1 | 1 | 1 |

Fig.22

LIGHT EMITTING DEVICE

This application is a continuation of U.S. application Ser. No. 13/189,231, filed on Jul. 22, 2011 which is a continuation of U.S. application Ser. No. 11/820,394, filed on Jun. 19, 2007 (now U.S. Pat. No. 7,986,094 issued Jul. 26, 2011) which is a continuation of U.S. application Ser. No. 10/435,968, filed on May 12, 2003 (now U.S. Pat. No. 7,239,083 issued Jul. 3, 2007) which is a continuation of U.S. application Ser. No. 09/692,713, filed on Oct. 19, 2000 (now U.S. Pat. No. 6,587,086 issued Jul. 1, 2003).

BACKGROUND OF THE INVENTION

1. Field of the Invention

The present invention relates to an EL (electro-luminescence) display (an electro-optical device) formed by preparing an EL element on a substrate. More particularly, the invention relates to an EL display using a semiconductor element (an element using a semiconductor thin film). Furthermore, the present invention relates to an electronic equipment in which the EL display is used in a display portion thereof.

2. Description of the Related Art

In recent years, technology for forming a TFT on a substrate has been largely improved, and an application development of the TFT to an active matrix type display device has been carried out. In particular, the TFT using a polysilicon film has a higher electric field effect mobility than the TFT using a conventional amorphous silicon film, and therefore, the TFT may be operated at a high speed. Thus, the pixel control which has been conducted at a driver circuit outside of the substrate may be conducted at the driver circuit which is formed on the same substrate as the pixel.

Such an active matrix type display device can, by preparing various circuits and elements on the same substrate, obtain various advantages such as a decrease in the manufacturing cost, a decrease in the size of the display device, an increase in the yield, and a decrease in the throughput.

Further, research on the active matrix type EL display having an EL element as a self-light-emitting device is becoming more and more active. The EL display is referred to as an organic EL display (OELD) or an organic light-emitting diode (OLED).

The EL display is a self-light-emitting type unlike a liquid crystal display device. The EL element is constituted in such a manner that an EL layer is sandwiched between a pair of electrodes. However, the EL layer normally has a lamination structure. Typically, the lamination structure of a "positive hole transport layer/a luminous layer/an electron transport layer" proposed by Tang et al. of the Eastman Kodak Company can be cited. This structure has a very high light-emitting efficiency, and this structure is adopted in almost all the EL displays which are currently subjected to research and development.

In addition, the structure may be such that on the pixel electrode, a positive hole injection layer/a positive hole transport layer/a luminous layer/an electron transport layer, or a positive hole injection layer/a positive hole transport layer/a luminous layer/an electron transport layer/an electron injection layer may be laminated in order. Phosphorescent dye or the like may be doped into the luminous layer.

In this specification, all the layers provided between the pixel electrode and an opposite electrode are generally referred to as EL layers. Consequently, the positive hole injection layer, the positive hole transport layer, the luminous layer, the electron transport layer, the electron injection layer and the like are all included in the EL layers.

Then, a predetermined voltage is applied to the EL layer having the above structure from the pair of the electrodes, so that a recombination of carriers is generated in the luminous layer and light is emitted. Incidentally, in this specification, the fact that the EL element is emitted is described as the fact that the EL element is driven. Furthermore, in this specification, the light-emitting element formed of the anode, the EL layer and the cathode is referred to as an EL element.

An analog type driver method (analog drive) can be given as a method of driving an EL display. An analog drive EL display is explained using FIGS. 18 and 19.

The structure of a pixel portion of the analog drive EL display is shown in FIG. 18. Y gate signal lines (G1 to Gy) for inputting gate signals are connected to gate electrodes of switching TFTs 1801 of pixels. One of a source region and a drain region of the switching TFT 1801 of each pixel is connected to x source signal lines (also referred to as data signal lines) (S1 to Sx) for inputting analog video signals, and the other is connected to the gate electrode of an EL driver TFT 1804 of each pixel and to a capacitor 1808 of each pixel.

The source region and the drain region of the EL driver TFT 1804 incorporated in each of the pixels is connected to the power source supply lines (V1 to Vx) while the other is connected to the EL element 1806. The potential of the power source supply lines (V1 to Vx) is referred to as the potential of the power source. Note that, the power source supply lines (V1 to Vx) is connected to a capacitor 1808 incorporated in each of the pixels.

The EL element 1806 comprises an anode, a cathode and an EL layer provided between the anode and the cathode. In the case where the anode is connected to the source region or the drain region of the EL driver TFT 1804, namely, in the case where the anode is the pixel electrode, the cathode which is the opposite electrode is held at a constant potential. On the contrary, in the case where the cathode is connected to the source region or the drain region of the EL driver TFT 1804, that is, in the case the cathode is the pixel electrode, the anode, which is an opposite electrode is held at a constant potential.

The opposite electrodes are normally maintained at a constant electric potential, and in the present specification, the electric potential of the opposite electrodes is referred to as a steady-state electric potential. Note that an power source for imparting the steady-state electric potential to the opposite electrodes is referred to as a steady-state power source. The electric potential difference between the steady-state electric potential of the opposite electrodes and the power source electric potential of the pixel electrodes is an EL driver voltage, and the EL driver voltage is applied to the EL layers.

A timing chart for a case of driving the EL display by the analog method is shown in FIG. 19. A period during which one gate signal line is selected is referred to as one line period (L). Further, a period until selection of all the gate signal lines (G1 to Gy) is completed corresponds to one frame period (F). There are y gate signal lines for the case of the EL display of FIG. 18, and therefore y line periods (L1 to Ly) are formed during one frame period.

Note that 60 or more frame periods are formed during one second in the EL display drive. In other words, 60 or more images are displayed during one second. If the number of images displayed in one second becomes less than 60, then problems such as image flicker start to become visually conspicuous.

The number of line periods during one frame period increases as the number of gradations increases, and the driver circuit must operate at a high frequency.

First, electric power source supply lines (V1 to Vx) are maintained in an off-power source electric potential. Note that the off-power source electric potential in an analog driver method is in a range in which the EL elements do not emit light and is the same strength as the steady-state electric potential. Note also that the difference between the off-power source electric potential and the steady-state electric potential is referred to as an off EL driver voltage. Ideally, it is preferable that the off EL driver voltage be 0 V, but it is acceptable provided that it is such that EL elements 1806 do not emit light.

A gate signal is input to the gate signal line G1 in the first line period (L1). An analog video signal is then input to the source signal lines (S1 to Sx) in order. A switching TFT (1,1) is therefore in an On state (on), and consequently the analog video signal input to the source signal line S1 is input to the gate electrode of an EL driver TFT (1,1), through the switching TFT (1,1).

The electric potential of the power source supply line V1 then changes from the off-power source electric potential to a saturation power source electric potential. Note that, throughout this specification, saturation power source electric potential refers to an electric potential having an electric potential difference with the steady-state electric potential to the extent that the EL element emits light. Note also that this electric potential difference is referred to as a saturation power source voltage.

When the analog video signal is input to the gate electrode of the EL driver TFT and one of the source region and the drain region is maintained at the saturation power source electric potential, the other becomes the on-power source electric potential. Note that the difference between the on EL driver electric potential and the steady-state electric potential is referred to as an on EL driver voltage. Further, the on EL driver voltage and the off EL driver voltage are generically referred to as an EL driver voltage throughout this specification.

The on driver voltage is then applied to the EL element, and the pixel performs display. The amount of electric current flowing in channel forming regions of the EL driver TFTs is controlled by the voltage size of the analog video signal input to the gate electrodes of the EL driver TFTs. The size of the on EL driver electric potential is therefore controlled by the analog video signal applied to the gate electrode of the EL driver TFT (1,1). Consequently, the size of the on EL driver voltage applied to the EL element is also controlled by the analog video signal applied to the gate electrode of the EL driver TFT (1,1).

Next, the analog video signal is similarly applied to the source signal line S2, and a switching TFT (2,1) turns on. The analog video signal input to the source signal line S2 is therefore input to the gate electrode of the EL driver TFT (2,1) through the switching TFT (2,1).

The EL driver TFT (2,1) is therefore placed in the On state. The electric potential of the power source supply line V2 then changes from the off-power source electric potential to the saturation power source electric potential. The on driver voltage, whose size is controlled by the analog video signal input to the gate electrode of the EL driver TFT (2,1), is therefore applied to the EL element, and the pixel performs display.

By repeating the above operations and completing input of the analog video signal to the source signal lines (S1 to Sx), the first line period (L1) is completed. The second line period (L2) begins next, and the gate signal is input to the gate signal line G2. Then, similar to the first line period (L1), the analog video signal is input to the source signal lines (S1 to Sx) in order.

The analog video signal is input to the source signal line S1. A switching TFT (1,2) turns on, and therefore the analog video signal input to the source signal line S1 is input to the gate electrode of an EL driver TFT (1,2) through the switching TFT (1,2).

The EL driver TFT (1,2) therefore turns on. The electric potential of the power source supply line V1 then changes from the off-power source electric potential to the saturation power source electric potential. The on driver voltage, whose size is controlled by the analog video signal applied to the gate electrode of the EL driver TFT (1,2), is therefore applied to the EL element, and the pixel performs display.

By repeating the above operations and completing input of the analog video signal to the source signal lines (S1 to Sx), the second line period (L2) is completed. The third line period (L3) begins next, and the gate signal is input to the gate signal line G3.

The above operations are then repeated in order, the gate signal is completely input to the gate signal lines (G1 to Gy), and all of the line periods (L1 to Ly) are completed. When all of the line periods (L1 to Ly) are complete, one frame period is complete. All of the pixels perform display during one frame period, forming one image.

Thus the amount of light emitted by the EL elements is controlled in accordance with the analog video signal, and gray scale display is performed by controlling the amount of light emitted. This method is a driver method referred to as the analog driver method, and gray scale display is performed by changing the amplitude of the signal.

A detailed description of the state of controlling the amount of electric current supplied to the EL elements by the gate voltage of the EL driver TFTs is made using FIGS. 3A and 3B.

FIG. 3A is a graph showing the transistor characteristics of the EL driver TFTs, and reference numeral 401 is referred to as an Id-Vg characteristic (also referred to as an Id-Vg curve). Id is a drain current, and Vg is a gate voltage here. The amount of electric current flowing with respect to an arbitrary gate voltage can be found from this graph.

A region of the Id-Vg characteristic shown by a dotted line 402 is usually used in driving the EL elements. An enlarged diagram of the region enclosed by the dotted line 402 is shown in FIG. 3B.

The shaded region in FIG. 3B is referred to as a subthreshold region. In practice, this indicates a gate voltage in the vicinity of, or below, the threshold voltage (Vth), and in this region, the drain current changes exponentially with respect to the changes in the gate voltage. Electric current control is performed in accordance with the gate voltage by using this region.

The switching TFT turns on, and the analog video signal input within the pixel becomes the gate voltage of the EL driver TFT. At this point, the gate voltage and the drain current vary linearly in accordance with the Id-Vg characteristic shown in FIG. 3A. In other words, the drain region electric potential (the on EL driver electric potential) is determined in correspondence with the voltage of the analog video signal input to the gate electrode of the EL driver TFT, a predetermined drain current flows in the EL element, and the EL element emits light with an emission amount corresponding to the amount of electric current.

The amount of light emitted by the EL element is thus controlled in accordance with the video signal, and gray scale display is performed by the control of the amount of light emitted.

However, the above analog drive has a drawback in that it is extremely weak with respect to variations in the TFT characteristics. For example, suppose that the Id-Vg characteristic of a switching TFT differs from that of the switching TFT of an adjacent pixel displaying the same gradation (a case of an overall positive or negative shift).

In this case, the drain current of each switching TFTs becomes different on the degree of the variation, and a different gate voltage becomes applied to the EL driver TFT of each pixels. In other words, a different electric current flows in each of the EL elements, and as a result, the amount of light emitted differs, and display of the same gradation can not be performed.

Further, even supposing that equal gate voltages are applied to the EL driver TFT of each pixels, if there is dispersion in the Id-Vg characteristic of the EL driver TFTs, then the same drain current cannot be output. In addition, as is made clear from FIG. 3A, the region used is one in which the drain current changes exponentially with respect to changes in the gate voltage, and therefore even if the Id-Vg characteristic deviates by a slight amount, a situation can develop in which the amount of electric current output differs greatly even with equal gate voltages. If this occurs, then even if the same voltage signals are input, the amount of light emitted by EL elements in adjacent pixels differs greatly due to a slight deviation in the Id-Vg characteristic.

In practice, there is a multiplier effect between the variations in the switching TFTs and the EL driver TFTs, and therefore it becomes conditionally more difficult. The analog drive is thus extremely sensitive with respect to dispersion in TFT characteristics, and this disturbs the multi-colorization of conventional active matrix EL display devices.

SUMMARY OF THE INVENTION

The present invention has been made in view of the above problems, and an object of the present invention is to provide an active matrix type EL display device capable of performing clear multi-gray scale display. In addition, an object of the present invention is to provide a high performance electronic device in which this type of active matrix EL display device is loaded as a display.

The applicant of the present invention considers that the above analog driver problems arise from the fact that the amount of electric current flowing in the EL elements is controlled by using the sub-threshold region, in which the impact of dispersion in the Id-Vg characteristic is easily felt because the drain current changes exponentially with respect to changes in the gate voltage.

Namely, when there are variations in the Id-Vg characteristic, there is exponential change in the drain current with respect to changes in the gate voltage in the sub-threshold region, and therefore differing electric currents (drain currents) are output even if equal gate voltages are applied. As a result, a defect develops in which desired gradations are not obtained.

The applicant of the present invention therefore considers performing control of the amount of light emitted by the EL elements by not performing control of the electric current using the sub-threshold region, but mainly performing control of the amount of time that the EL elements emit light. In short, gray scale display is performed with the present invention by controlling the amount of light emitted by the EL elements with time. Performing gray scale display by controlling the amount of time which light is emitted by the EL elements is referred to as a time partitioning driver method (hereafter referred to as a digital drive). Note that gray scale display performed by the time partitioning driver method is referred to as time division gray scale display.

By employing the above structure, variations in the amount of electric current output when equal gate voltages are applied can be suppressed even if there are small variations in the Id-Vg characteristic of the TFTs. It therefore becomes possible to eliminate the situation of greatly differing amounts of light emitted by the EL elements of adjacent pixels due to variations in the Id-Vg characteristic, even if the same voltage signal is input.

The constitution of the present invention is shown below.

According to the present invention, there is provided an electro-optical device comprising a plurality of EL elements and a plurality of pixels having the plurality of EL elements, wherein gray scale display is performed by controlling the period during which the EL elements emit light, and the brightness of the light emitted by the EL elements, during one frame period.

According to the present invention, there is provided an electro-optical device comprising a plurality of EL elements and a plurality of pixels having the plurality of EL elements, wherein one frame period consists of n subframe periods SF1, SF2, . . . , Sfn, the n subframe periods SF1, SF2, . . . , SFn have address periods Ta1, Ta2, . . . , Tan and sustain periods Ts1, Ts2, . . . , Tsn, respectively, digital data signals in the address periods Ta1, Ta2, . . . , Tan are input to all of the plurality of pixels, the plurality of EL elements are selected to emit light or not to emit light during the sustain periods Ts1, Ts2, . . . , Tsn in accordance with the digital data signals, the brightness of the light emitted by the EL elements during at least one sustain period Tsp (where p is a natural number greater than or equal to 1, and less than or equal to n), among the sustain periods Ts1, Ts2, . . . , Tsn, is 1/m (where m is a positive number) of the brightness of the light emitted by the EL elements during an arbitrary sustain period Tsq, excepting the sustain period Tsp, and (where q is an arbitrary natural number greater than or equal to 1, and less than or equal to n, excepting p), the length of the sustain period Tsp is expressed as $2^{-(p-1)}T \times m$ (where T is a positive constant), and the length of the sustain period Tsq is expressed as $2^{-(q-1)}T$.

According to the present invention, it may be characterized in that the plurality of EL elements each have a first electrode, a second electrode, and an EL layer formed between the first electrode and the second electrode and the EL layers contain a low molecular weight organic material or an organic polymer material.

According to the present invention, there is provided an electro-optical device comprising a plurality of EL elements and a plurality of pixels having the plurality of EL elements, wherein one frame period consists of n subframe periods SF1, SF2, . . . , Sfn, the n subframe periods SF1, SF2, . . . , SFn have address periods Ta1, Ta2, . . . , Tan and sustain periods Ts1, Ts2, . . . , Tsn, respectively, digital data signals in the address periods Ta1, Ta2, . . . , Tan are input to all of the plurality of pixels, the plurality of EL elements are selected to emit light or not to emit light during the sustain periods Ts1, Ts2, . . . , Tsn in accordance with the digital data signals, the brightness of the light emitted by the EL elements during at least one sustain period Tsp (where p is a natural number greater than or equal to 1, and less than or equal to n), among the sustain periods Ts1, Ts2, . . . , Tsn, is 1/m (where m is a positive number) of the brightness of the light emitted by the EL elements during an arbitrary sustain period Tsq, excepting the sustain period Tsp, and (where q is an arbitrary natural number greater than or equal to 1, and less than or equal to n, excepting p), the length of the sustain period Tsp is expressed as $2^{-(p-1)}T \times m$ (where T is a positive constant), the length of the sustain period Tsq is expressed as $2^{-(q-1)}Tm$, each the plurality of EL elements has a first electrode, a second electrode, and an EL layer formed between the first electrode and the second electrode and the brightness of the light emitted by the EL elements is controlled by an on EL driver voltage applied between the first electrode and the second electrode.

According to the present invention, it may be characterized in that the EL layers contain a low molecular weight organic material or an organic polymer material.

According to the present invention, it may be characterized in that the low molecular weight organic material is made from Alq3 (tris-8-quinolinolate aluminum complex) or TPD (tri-phenylamine dielectric).

According to the present invention, it may be characterized in that the organic polymer material is made from PPV (poly-paraphenylene vinylene), PVK (poly-vinyl carbazole), or polycarbonate.

According to the present invention, one frame period may be equal to or less than 1/60 second.

According to the present invention, it may be characterized in that the electro-optical device has a memory circuit for storing correction data in order to apply a correction to a display and the digital video signal corrected by the memory circuit is input to a source signal side driver circuit.

The present invention may be a computer, a video camera or a DVD player using the electro-optical device.

BRIEF DESCRIPTION OF THE DRAWINGS

In the accompanying drawings:

FIG. 5 is a schematic diagram of a cross sectional structure of an EL display of the present invention;

FIGS. 7A to 7E are diagrams showing a process of manufacturing an EL display of the present invention;

FIGS. 9A to 9D are diagrams showing the process of manufacturing the EL display of the present invention;

FIGS. 10A to 10C are diagrams showing the process of manufacturing the EL display of the present invention;

FIG. 22 is a diagram showing the relationship between a pre-compensation video signal and a post-compensation video signal.

DETAILED DESCRIPTION OF THE PREFERRED EMBODIMENTS

The digital time division gray scale display of the present invention is explained below using FIG. 1 and FIG. 2. A case of performing $2^n$ gray scale display in accordance with an n-bit digital data signal is explained here.

Figure 1:
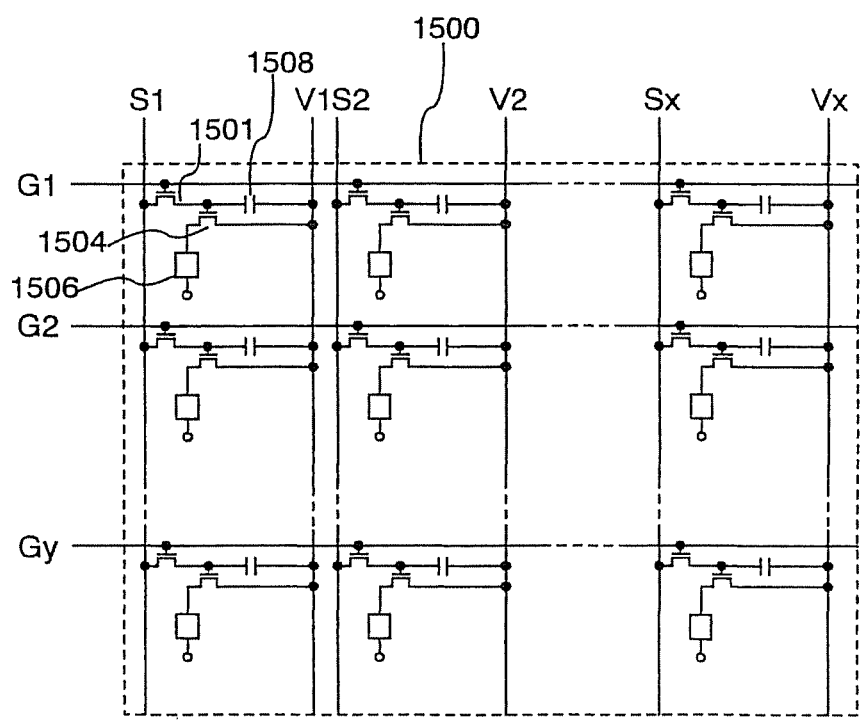
FIG. 1 is a circuit diagram of a pixel portion of an EL display of the present invention.

The structure of a pixel portion 1500 of an EL display of the present invention is shown in FIG. 1. Gate signal lines (G1 to Gy) for inputting gate signals are connected to gate electrodes of switching TFTs 1501 of each pixel. Further, one of a source region and a drain region of the switching TFT 1501 of each pixel is connected to source signal lines (also referred to as data signal lines) (S1 to Sx) for inputting digital signals, and the other is connected to the gate electrode of an EL driver TFT 1504 and to a capacitor 1508 of each pixel. Note that this structure in the embodiment mode has the capacitors 1508, but a structure not including the capacitors 1508 may also be used. There are no limitations upon the present invention by the presence of, or lack of, capacitors.

One of the source region and the drain region of the EL driver TFT 1504 is connected to electric power source supply lines (V1 to Vx), and the other is connected to EL elements 1506. The electric potential of the electric power source supply lines (V1 to Vx) is referred to as an electric power source electric potential. Further, the power source supply lines (V1 to Vx) are connected to the capacitors 1508 of each pixel. Note that the digital data signal is a signal in which an analog or a digital video signal is transformed into a digital signal for performing time division gray scale display, and that it contains image information.

The EL elements 1506 are each composed of an anode, a cathode, and an EL layer formed between the anode and the cathode. When the anodes are connected to the source regions or the drain regions of the EL driver TFTs 1504, namely when the anodes are the pixel electrodes, then the cathodes become opposite electrodes. Conversely, for a case in which the cathodes are connected to the source regions or the drain regions of the EL driver TFTs 1504, namely when the cathodes are the pixel electrodes, then the anodes become the opposite electrodes. Furthermore, the electric potential of the opposite electrodes is referred to as a steady-state electric potential within this specification. Note that an power source which imparts the steady-state electric potential to the opposite electrodes is referred to as a steady-state power source.

The electric potential difference between the steady-state electric potential of the opposite electrodes and the power source electric potential of the pixel electrode is an EL driver voltage, and the EL driver voltage is applied to the EL layers. The power source electric potential is normally constant.

Figure 2:
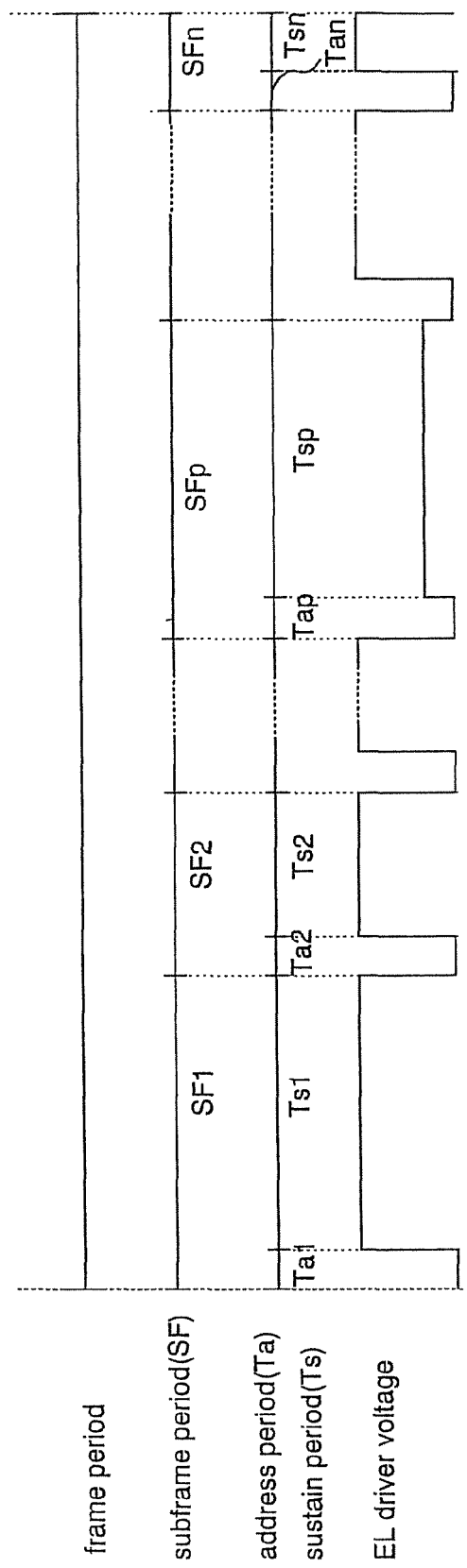
FIG. 2 is a timing chart of a digital time division gray scale display of the present invention.
Figure 3A:
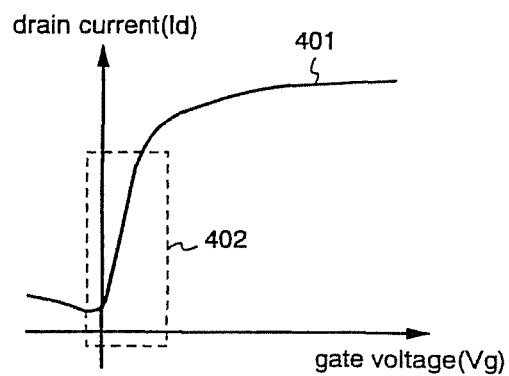
FIGS. 3A and 3B are graphs showing the transistor characteristics of an EL driver TFT.
Figure 3B:
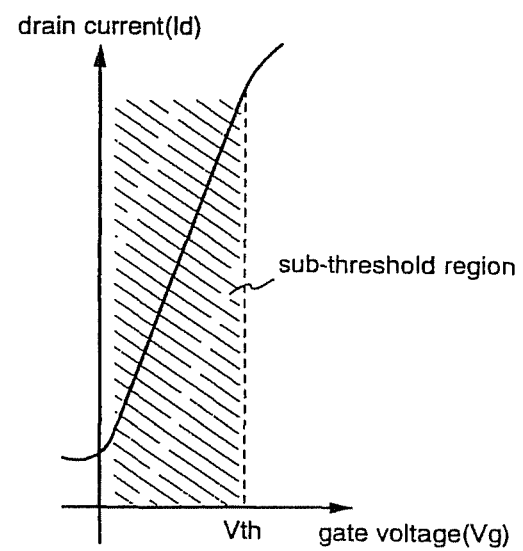

A timing chart during the digital drive of the EL display of the present invention is shown in FIG. 2. First, one frame period (F) is divided into n subframe periods (SF1 to SFn). Note that the period in which all of the pixels of the pixel portion display one image is referred to as one frame period (F).

In a normal EL display, 60 or more frame periods are formed during one second, and 60 or more images are displayed during one second. If the number of images displayed during one second becomes fewer than 60, then problems such as image flicker start to become visually conspicuous.

Note that a plurality of periods into which one frame period is additionally divided are referred to as subframe periods. As the number of gradations increases, the number of frame period partitions increases, and the driver circuit must be driven at a high frequency.

The subframe periods are divided into address periods (Ta) and sustain periods (Ts). The address period is the time required for inputting digital data signals into all of the pixels during one subframe period, and the sustain period (also referred to as a turn on period) denotes a period in which the EL element is made to emit light.

The address periods (Ta) of SF1 to SFn become Ta1 to Tan, respectively. The sustain periods (Ts) of SF1 to SFn become Ts1 to Tsn, respectively.

First, in the address period, the opposite electrode of the EL elements 1506 is held at the steady-state potential of the same height as the power source electric potential. In the embodiment mode of the present invention, the steady-state potential in the address period of the digital driver is referred to as an off steady-state potential. Note that, the height of the off steady-state potential may be the same as the height of the power source electric potential within the range in which the EL elements 1506 do not emit light. Note that, the EL driver voltage at this time is referred to as the off EL driver voltage. Ideally, it is desired that the off EL driver voltage is 0V, but the voltage may be on the level on which the EL elements 1506 do not emit light.

Then, the gate signal is input to the gate signal line G1, and all the switching TFTs 1501 connected to the gate signal line G1 are turned on.

When the switching TFTs 1501 connected to the gate signal line G1 are placed into an On state, a digital data signal is input into all of the source signal lines (S1 to Sx) at the same time. The digital data signal contains "0" or "1" information, and one of the digital data signals "0" and "1" has Hi electric voltage, while the other has Lo voltage.

The digital data signal input into the source signal lines (S1 to Sx) is then input to the gate electrodes of the EL driver TFTs 1504 through the switching TFTs 1501, which are in the On state. Further, the digital data signal is also input to the capacitors 1508 of all of the pixels connected to the gate signal line G1, and an electric charge is stored.

Next, the gate signal is input to the gate signal line G2, and all of the switching TFTs 1501 connected to the gate signal line G2 are placed in the On state. With the switching TFTs 1501 connected to the gate signal line G2 in the On state, the digital data signal is input to all of the source signal lines (S1 to Sx) at the same time. The digital data signal input to the source signal lines (S1 to Sx) is input to the gate electrodes of the EL driver TFTs 1504 through the switching TFTs 1501. Further, the digital data signal is also input to the capacitors 1508 of all of the pixels connected to the gate signal line G2, and stored.

By repeating the above operations through the gate signal line Gy, the digital data signal is input to all of the pixels. The period up until the digital data signal is input to all of the pixels is the address period.

The sustain period commences at the same time as the address period is complete. When the sustain period begins, the electric potential of the opposite electrodes changes from an off steady-state electric potential to an on steady-state electric potential. The steady-state electric potential in the sustain period of the digital drive is referred to as the on steady-state electric potential in the embodiment mode of the present invention. The on steady-state electric potential may have an electric potential difference with the power source electric potential to the extent that the EL elements emit light. Note that this electric potential difference is referred to as an on EL driver voltage. Note also that the off steady-state electric potential and the on steady-state electric potential are generically referred to as steady-state electric potentials. Further, the on EL driver voltage and an off EL driver voltage are generically referred to as EL driver voltages.

All of the switching TFTs 1501 are set into the Off state in the sustain period. The digital data signal stored in the capacitors 1508 is then input to the gate electrodes of the EL driver TFTs 1504.

When the digital data signal contains "0" information, then the EL driver TFTs 1504 are set into the Off state in the embodiment mode of the present invention. The pixel electrodes of the EL elements 1506 are therefore maintained at the off steady-state electric potential. As a result, the EL elements 1506 contained in pixels to which the digital data signal containing "0" information is applied do not emit light.

On the other hand, for cases having "1" information, the EL driver TFTs 1504 turn on in the embodiment mode of the present invention. The electric power source electric potential is therefore imparted to the pixel electrodes of the EL elements 1506. As a result, EL elements 1506 contained in pixels to which the digital data signal having "1" information emit light.

An address period again begins at the completion of the sustain period, and when the data signal is input to all of the pixels, a sustain period begins. Any of the periods Ts1 to Ts(n−1) become the sustain period at this point. The Ts(n−1) period turns on predetermined pixels here.

Similar operations are repeated subsequently for the remaining n−2 subframe periods, Ts(n−2), Ts(n−3), . . . , Ts1 are set, in order, as sustain periods, and predetermined pixels are turned on in the respective subframes.

One frame period is complete after the n subframe periods are completed.

Note that, in the present invention, among the n sustain periods Ts1, . . . , Tsn, the brightness of light emitted by the EL elements during at least one sustain period is set to be always lower than the brightness of light emitted by the EL elements in other sustain periods.

If a sustain period in which the brightness of light emitted is 1/m of that emitted in other sustain periods is taken as Tsp (where p is an arbitrary number greater than or equal to 1 and less than or equal to n), then among the n sustain periods Ts1, . . . , Tsn, the length of the sustain periods other than the sustain period Tsp is expressed as $2^{-(n-1)}T$, where T is a positive constant. Further, the length of the sustain period Tsp is expressed as $2^{-(p-1)}T \times m$. Note that m is a positive number greater than 1. Therefore, even if the brightness of light emitted by the EL elements during the sustain period Tsp is 1/m that emitted during the other sustain periods, the length of the sustain period Tsp is set to be $2^{-(p-1)}T \times m$, and the predetermined gray scale display can therefore be obtained.

Consequently, whichever of the n sustain periods Ts1, . . . , Tsn is taken as the sustain period Tsp, and however many sustain periods Tsp are formed, if the amount of light emitted by the EL elements during each of the sustain periods Ts1, . . . , Tsn is taken as Lm1, . . . , Lmn, then Lm1:Lm2: Lm4: . . . :Lm(n−1):Lmn=$2^0:2^{-1}:2^{-2}: \ldots :2^{-(n-2)}:2^{-(n-1)}$. Note that SF1 to Sfn may appear in any order, and therefore the order of appearance of the sustain periods Ts1, . . . , Tsn is also arbitrary. By combining the sustain periods, the desired gray scale display, among the $2^n$ gradations, can be performed.

The gradation of each pixel is determined by which subframe periods are selected for light emission during one frame period. For example, if n=8, and the brightness of pixels having light emitted during all of the sustain periods is taken as 100%, then for a case of the pixels emitting light in Ts1 and Ts2, the brightness is expressed as 75%, and when Ts3, Ts5, and Ts8 are selected, the brightness can be expressed as 16%.

With the present invention, even if the Id-Vg characteristics of the TFTs vary slightly, dispersion in the amount of current output when equal gate voltages are applied can be suppressed by the above structure. It therefore becomes possible to avoid the situation in which the amount of light emitted by EL elements of adjacent pixels differs greatly due to variations in the Id-Vg characteristics, even with the same voltage signal input.

Further, the amount of time in which light is emitted by the EL elements can be set to $2^{-(p-1)}T \times m$ (where T is a positive constant) in the sustain period Tsp, in which the brightness of light emitted by the EL elements is 1/m of the brightness emitted during other sustain periods. By using the above structure, and by increasing the number of image gradations, the number of bits n becomes larger, and even if the length of the sustain period expressed by $2^{-(n-1)}T$ becomes shorter, the brightness of light emitted by the EL elements is regulated to be 1/m that emitted in other sustain periods, the length of the sustain period is set to $2^{-(p-1)}T \times m$, and it becomes possible to extend it.

Note that with the above structure of the present invention, the electric power source electric potential is always maintained constant, the electric potential of the opposite electrodes is changed by the address period and the sustain period, and the off EL driver voltage or the on EL driver voltage is applied to the EL layers. However, the present invention is not limited to this structure. Alternatively, the electric potential of the opposite electrodes may be always maintained constant, and by changing the power source electric potential by the address period and the sustain period, the off EL driver voltage or the on EL driver voltage may be applied to the EL layers. In this case, regulation of the brightness of the EL elements is performed by controlling the power source electric potential.

Further, with the above structure of the present invention, the off EL driver voltage is taken as zero and the EL elements are not made to emit light, but the off EL driver voltage may also be set to the same voltage as the on EL driver voltage and light may also be emitted during the address period. In this case, the power source electric potential and the steady-state electric potential are always maintained at fixed values. However, in this case the subframe period becomes a period of emitting light, and therefore the length of the subframe periods is set to SF1, SF2, . . . , Sfn=$2^0 T$, $2^{-1}T$, . . . , $2^{-(n-1)}T$, and the length of the subframe period having a brightness of 1/m is set to $2^{-(n-1)}T \times m$. An image having a high brightness compared to that of a driver method in which light is not emitted during the address period can be obtained by the above structure.

Furthermore, in the embodiment mode of the present invention, there is explained a case where the device is driven with the non-interlace scanning, but the device of the invention can also be driven with the interlace scanning.

EMBODIMENTS

Embodiments of the present invention will be explained hereinbelow.

Embodiment 1

The embodiments of the present invention are explained in the following.

The structure of the present invention is explained using an example of an EL display which performs time partitioning gradation display of digital driving method. An example of a circuit structure of the present invention is shown in FIG. 4.

Figure 4A:
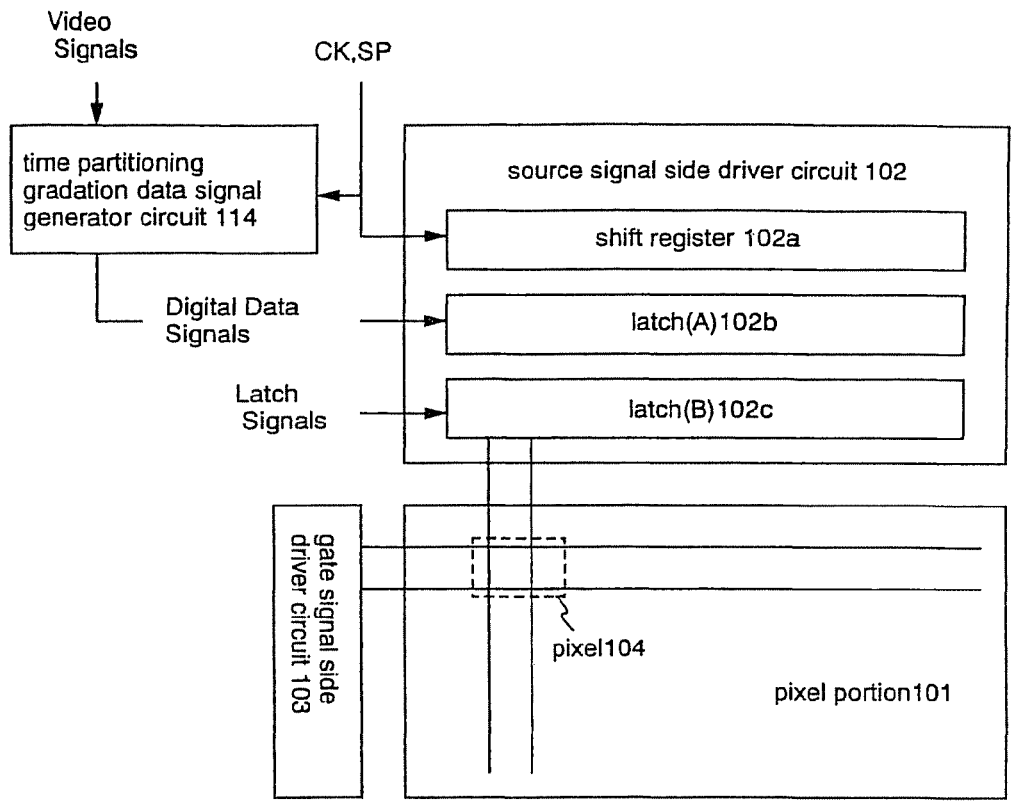
FIGS. 4A and 4B are diagrams showing a circuit structure of an EL display of the present invention.

The EL display device of FIG. 4A has a pixel portion 101, and a source signal side driver circuit 102 and a gate signal side driver circuit 103 arranged in the periphery of the pixel portion, which are all composed of TFTs formed on a substrate. Note that although the EL display device has one source signal side driver circuit and one gate signal side driver circuit in the embodiment 1 of the present invention, two source signal side driver circuits may also be used in the present invention. Furthermore, two gate signal side driver circuits may also be used.

The source signal side driver circuit 102 fundamentally contains a shift register 102a, a latch (A) 102b and a latch (B) 102c. Further, clock pulses (CK) and start pulses (SP) are input to the shift register 102a, digital data signals are input to the latch (A) 102b, and latch signals are input to the latch (B) 102c.

Further, not shown in a figure, gate signal side driver circuit 103 have shift register and buffer. A multiplexer can be provided in the output side of the buffer.

The digital data signals input to the pixel portion are formed by a time partitioning gradation data signal generator circuit 114. This circuit, along with converting a video signal which is an analog signal or a digital signal (a signal containing image information) into a digital data signal for performing time partitioning gradation, is a circuit which generates timing pulses or the like which are necessary for performing time partitioning gradation display.

Typically, a means of partitioning one frame period into a plurality of sub-frame periods corresponding to n-bit gradations (where n is a real number equal to or greater than 2), a means of selecting an address period and a sustain period in the plurality of sub-frame periods, and a means of setting the sustain periods.

The time partitioning gradation data signal generator circuit 114 may also be formed external to the EL display device of the present invention. In this case, it becomes a structure that the digital data signals formed there are input to the EL display device of the present invention. An electronic device (EL display device) with the EL display device of the present invention as a display thus contains the EL display device of the present invention and the time partitioning gradation data signal generator circuit as separate components.

Further, the EL display device of the present invention may also be implemented with a form such as using an IC chip for the time partitioning gradation data signal generator circuit 114. In this case, it becomes a structure that the digital data signals formed by the IC chip are input to the EL display device of the present invention. An electronic device with the EL display device of the present invention as a display thus contains the EL display device of the present invention in which the IC chip containing the time partitioning gradation data signal generator circuit is implemented.

Further, the time partitioning gradation data signal generator circuit 114 may also be formed of TFTs on the same substrate as the pixel portion 101, the source signal side driver circuit 102, and the gate signal side driver circuit 103. In this case, all processing can be performed on the substrate provided that the video signal containing image information is input to the EL display device. It can be of course to form the time partitioning gradation data signal generator circuit with TFTs having polysilicon films used in the present invention as active layers. Furthermore, in this case an electronic device having the EL display device of the present invention as a display has the time partitioning gradation data signal generator circuit incorporated within the EL display device itself, and it is possible to make the electronic device small.

Figure 4B:
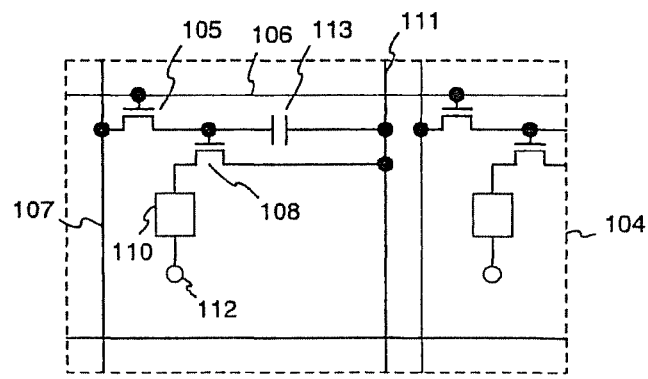

A plurality of pixels 104 are arranged in a matrix state in the pixel portion 101. An expanded diagram of the pixels 104 is shown in FIG. 4B. Reference numeral 105 denotes a switching TFT in FIG. 4B. A gate electrode of the switching TFT 105 is connected to a gate signal line 106 which inputs a gate signal. One of a drain region and a source region of the switching TFT 105 is connected to a source signal line 107 for inputting a digital data signal, and the other is each connected to a gate electrode of an EL driver TFT 108 and capacitor 113 which is possessed by each pixel.

Further, a source region of the EL driver TFT 108 is connected to an electric power supply line 111, and a drain region is connected to an EL element 110. An electric power supply line 111 is connected to the capacitor 113. The capacitor 113 is provided to keep the gate voltage of an EL driver TFT 108 when the switching TFT 105 is non-selected state (Off state).

The EL element 110 is composed of an anode and a cathode, and an EL layer which is provided between an anode and a cathode. An anode as an opposing electrode is maintained at a fixed electric potential when the cathode is connected to a source region or the drain region of the EL driver TFT 108, in other words, the cathode is a pixel electrode. On the contrary, an anode as an opposing electrode is maintained a fixed electric potential when the cathode is connected to a source region or the drain region of the EL driver TFT 108, in other words, the cathode is a pixel electrode.

The electric power supply line 111 is maintain the power supply potential.

Note that a resistive body may also be formed between the drain region or the source region of the EL driver TFT 108 and the EL element 110. It becomes possible to control the amount of current supplied to the EL element from the EL driver TFT, and to prevent any influence resulting in dispersion of the characteristics of the EL driver TFT with faulting the resistive body. The resistive body may be an element displaying a resistance sufficiently larger than the on resistance of the EL driver TFT 108, and therefore there are no limitations in its structure. Note that the on resistance is the value of the drain voltage of the TFT divided by the drain current flowing at that time. The resistance value of the resistive body may be selected in a range of 1 k$\Omega$ to 50 M$\Omega$ (preferably between 10 k$\Omega$ and 10 M$\Omega$, more preferably between 50 k$\Omega$ and 1 M$\Omega$). Use of a semiconductor layer having high resistance value as the resistive body is preferably because it is easy to form.

Next, reference is made to FIG. 5 schematically showing the sectional structure of the EL display device of the present invention.

In FIG. 5 reference numeral 11 is a substrate, and 12 is an insulating film that is a base (hereinafter, this film is designated as base film). For the substrate 11, use can be made of a light transmissible substrate, representatively, a glass substrate, a quartz substrate, a glass ceramic substrate, or a crystallization glass substrate. However, it must be resistible to the highest processing temperature in a manufacturing process.

The base film 12 is effective especially in using a substrate that has a movable ion or a substrate that has conductivity, but it is not necessarily disposed on the quartz substrate. An insulating film that contains silicon can be used as the base film 12. It should be noted that, in this specification, "insulating film that contains silicon" signifies an insulating film in which oxygen or nitrogen is added to silicon at a predetermined ratio (SiOxNy: x and y are arbitrary integers), such as a silicon oxide film, a silicon nitride film or a silicon nitride oxide film.

Reference numeral 201 is a switching TFT, and 202 is a EL driver TFT. A switching TFT is formed by an n-channel type TFT. An EL driver is formed by a p-channel TFT. When the EL light luminescence directed to the under surface (the surface which is not provided a TFT or an EL layer) of the substrate, the above structure is preferable. However, in the present invention, there is no need to limit the above structure. It is also possible to use both the n-channel type TFT and p-channel type TFT for a switching TFT or an EL driver TFT.

The switching 201 is made up of an active layer that includes a source region 13, a drain region 14, LDD regions 15a-15d, an isolation region 16, and channel formation regions 17a, 17b, a gate insulating film 18, gate electrodes 19a, 19b, a 1st interlayer insulating film 20, a source wiring line (a part of a source signal line) 21, and a drain wiring line 22. The gate insulating film 18 or the 1st interlayer insulating film 20 can be common to all TFTs on the substrate, or can be varied according to circuits or elements.

In the switching TFT 201 shown in FIG. 5, the gate electrodes 19a, 19b are connected electrically, in other words, a so-called double gate structure is established. Not only the double gate structure but also a so-called multi gate structure, such as a triple gate structure, can be established, of course. The multi gate structure signifies a structure including an active layer that has two channel formation regions or more connected in series.

The multi gate structure is very effective to decrease an OFF-state current, and if the OFF-state current of the switching TFT is decreased sufficiently, the capacity necessary for the capacitor which is connected to a gate electrode of an EL driver TFT 202 can be reduced. That is, since the possession area of the capacitor can be reduced, the multi gate structure is also effective to widen the effective luminescence area of the EL element.

In the switching TFT 201, the LDD regions 15a-15d are disposed not to overlap with the gate electrodes 19a and 19b, with the gate insulating film 18 therebetween. The thus built structure is very effective to decrease the OFF-state current. The length (width) of the LDD regions 15a-15d is 0.5-3.5 mm, representatively, 2.0-2.5 mm.

It is more desirable to form an offset region (i.e., region formed with a semiconductor layer whose composition is the same as the channel formation region, and in which a gate voltage is not applied) between the channel formation region and the LDD region, in order to decrease the OFF-state current. In the multi gate structure that has two gate electrodes or more, the isolation region 16 (i.e., region whose concentration is the same and to which the same impurity element is added as the source region or the drain region) formed between the channel formation regions is effective to decrease the OFF-state current.

The EL driver TFT 202 is made up of an active layer that includes a source region 26, a drain region 27, and a channel formation region 29, a gate insulating film 18, a gate electrode 30, the 1st interlayer insulating film 20, a source wiring line 31, and a drain wiring line 32. The EL driver TFT 202 is a p-channel type TFT.

The drain region 14 of the switching TFT is connected to the gate electrode 30 of the EL driver TFT 202. In more detail, but not shown in figures, the gate electrode 30 of the EL driver TFT 202 is connected electrically to the drain region 14 of the switching TFT 201 through the drain wiring line 22(also called connection wiring line). While the gate electrode 30 is a single gate structure here, the multi gate structure is also applied. The source wiring line 31 of the EL driving TFT 202 is connected to the current-feed line (not shown).

The EL driver TFT 202 is an element to control the amount of current supplied to the EL element, and a comparatively large amount of current can flow therethrough. Therefore, preferably, the channel-width (W) is designed to be greater than the channel-width of the switching TFT. Additionally, preferably, the channel-length (L) is designed to be long so that an excessive current does not flow through the current controlling TFT 202. A desirable value is 0.5-2 mA (1-1.5 mA preferably) per pixel.

From the viewpoint of restraining the deterioration of the EL driver TFT, it is also effective to thicken the film thickness of the active layer (specifically, the channel formation region) of the EL driver TFT 202 (50-100 nm preferably, and 60-80 nm further preferably). On the other hand, from the viewpoint of decreasing the OFF-state current in the switching TFT 201, it is also effective to thin the film thickness of the active layer (specifically, the channel formation region)(20-50 nm preferably, and 25-40 nm further preferably).

The structure of the ITT formed in the pixel was described above. In this formation, a driving circuit is also formed at the same time. A CMOS circuit that is a base unit to form the driving circuit is shown in FIG. 5.

In FIG. 5, a TFT that has a structure to decrease the hot carrier injection without reducing the operation speed to the utmost is used as the n-channel type TFT 204 of the CMOS circuit. The driving circuit described herein is the source signal side driving circuit and the gate signal side driving circuit. It is also possible to form other logic circuits (level shifter, A/D converter, signal division circuit, etc.), of course.

The active layer of the n-channel type TFT 204 of the CMOS circuit includes a source region 35, a drain region 36, an LDD region 37, and a channel formation region 38. The LDD region 37 overlaps with the gate electrode 39, with the gate insulating film 18 therebetween.

The reason for forming the LDD region 37 only on the drain region 36 side is not to reduce the operation speed. There is no need to worry about the OFF-state current value in the n-channel type TFT 204. Instead, the operation speed should be rated above it. Therefore, preferably, the LDD region 37 is completely laid on the gate electrode, thus reducing a resistance component as much as possible. That is, a so-called offset should be omitted.

In the p-channel type TFT 205 of the CMOS circuit, there is no need to provide the LDD region especially because the deterioration caused by the hot carrier injection is quite negligible. Therefore, the active layer includes a source region 40, a drain region 41, and a channel formation region 42. The gate insulating film 18 and the gate electrode 43 are disposed thereon. It is also possible to dispose the LDD region as well as the n-channel type TFT 204 in order to take countermeasures against the hot carrier, of course.

The n-channel type TFT 204 and the p-channel type TFT 205 are covered with the first interlayer insulating film 20, and the source wiring lines (a part of the source signal lines) 44, 45 are formed. The n-channel type TFT 204 and the drain region of the p-channel type TFT 205 are connected electrically by the drain wiring line 46.

Reference numeral 47 is a first passivation film. The film thickness thereof is 10 nm-1 mm (200-500 nm preferably). An insulating film including silicon (especially, a silicon nitride oxide film or a silicon nitride film is desirable) can be used as its material. The passivation film 47 serves to protect a formed TFT from alkali metal and water. The EL layer finally disposed above the TFT (especially the EL driver TFT) includes alkali metal such as sodium. In other words, the first passivation film 47 serves also as a protective layer by which the alkali metal (movable ions) is not allowed to enter the TFT side.

Reference numeral 48 is a second interlayer insulating film, and serves as a flattening film to flatten level differences formed by the TFT. Preferably, an organic resin film, such as polyimide, polyamide, acrylic resin, or BCB (benzocyclobutene) is used as the second interlayer insulating film 48. These films have an advantage in that a good smooth plane can be easily formed, and the dielectric constant is low. It is preferable to entirely absorb the level difference caused by the TFT by means of the second interlayer insulating film 48 because the EL layer is very sensitive to ruggedness. Additionally, it is preferable to form a low-dielectric constant material thick, in order to decrease the parasitic capacitance formed between the gate signal line or the data signal line and the cathode of the EL element. Therefore, preferably, the film thickness thereof is 0.5-5 mm (1.5-2.5 mm preferably).

Reference numeral 49 is a pixel electrode (anode of the EL element) that is made of a transparent conductive film. After a contact hole (opening) is made in the second interlayer insulating film 48 and the first passivation film 47, the electrode is connected to the drain wiring line 32 of the EL driver TFT 202 through the opening. When the pixel electrode 49 and the drain region 27 are arranged not to be connected directly, as in FIG. 5, the alkali metal of the EL layer can be prevented from entering the active layer via the pixel electrode.

A third interlayer insulating film 50 whose thickness is 0.3-1 mm is disposed on the pixel electrode 49. The film 50 is made of a silicon oxide film, a silicon nitride oxide film, or an organic resin film. The third interlayer insulating film 50 is provided with an opening on the pixel electrode 49 by etching, and the edge of the opening is etched to have a taper shape. Preferably, the angle of the taper is 10-60° (30-50° preferably).

An EL layer 51 is formed on the third interlayer insulating film 50. The EL layer 51 is used in the form of a single-layer structure or a layered structure. The layered structure is superior in luminous efficiency. Generally, a positive hole injection layer/a positive hole transporting layer/a luminescent layer/an electronic transporting layer are formed on the pixel electrode in this order. Instead, a structure may be used which has the order of positive hole transporting layer/luminescent layer/electronic transporting layer or the order of positive hole injection layer/positive hole transporting layer/luminescent layer/electronic transporting layer/electronic injection layer. In the present invention, any one of the known structures can be used, and fluorescent coloring matter, etc., can be doped to the EL layer.

For example, materials indicated in the following U.S. patents or publications can be used as the organic EL material; U.S. Pat. Nos. 4,356,429: 4,539,507: 4,720,432: 4,769, 292: 4,885,211: 4,950,950: 5,059,861: 5,047,687: 5,073,446: 5,059,862: 5,061,617: 5,151,629: 5,294,869: 5,294,870, and Japanese Laid-Open Patent Publication Nos. 189525 of 1998: 241048 of 1996: 78159 of 1996.

The EL display device mainly has four color display methods; method of faulting three kinds of EL elements that correspond to R (red), G (green), and B (blue), respectively; method of combining an EL element of white luminescence and a color filter; method of combining an EL element of blue or blue-green luminescence and a fluorescent body (fluorescent color conversion layer: CCM); and method of stacking the EL elements that correspond to RGB while using a transparent electrode for a cathode (opposite electrode).

The structure of FIG. 5 is an example in which the method of forming three kinds of EL elements that correspond to RGB is used. Only one pixel is shown in FIG. 5. In fact, pixels, each having the same structure, are formed to correspond to each color of red, green, and blue, and thereby color display can be performed.

The present invention can be performed regardless of the luminescence method, and can use all the four methods. However, since the speed of response of the fluorescent body is slower than that of the EL, and the problem of afterglow occurs, the method in which the fluorescent body is not used is preferable. Additionally, it can be said that a color filter that causes the fall of luminescence brightness should not be used if possible.

A cathode 52 of the EL element is disposed on the EL layer 51. A material that includes magnesium (Mg), lithium (Li) or calcium (Ca) that is small in work function is used as the cathode 52. Preferably, use is made of an electrode made of MgAg (material in which Mg and Ag are mixed in the ratio of Mg:Ag=10:1). Instead, a MgAgAl electrode, a LiAl electrode, or LiFAl electrode can be used.

In this specification, the luminescence element formed by the pixel electrode (anode), the EL layer, and the cathode is called an EL element 206.

It is necessary to form a layered body comprised of the EL layer 51 and the cathode 52 by each pixel individually. However, the EL layer 51 is quite weak to water, and a normal photolithography technique cannot be used. Therefore, it is preferable to use a physical mask material, such as metal mask, and selectively form it according to a vapor phase method, such as a vacuum deposition method, a sputtering method, or a plasma CVD method.

It is also possible to use an ink jet method, a screen printing method, spin court method, and the like, as the method of selectively forming the EL layer. However, these methods cannot continuously form the cathode in the current state of the art, and it can be said that the method described above, not the ink jet method, etc., is desirable.

Reference numeral 53 is a protective electrode. This is to protect the cathode 52 from outside water, etc., and, at the same time, connect the cathode 52 of each pixel. For the protective electrode 53, it is preferable to use a low-resistance material including aluminum (Al), copper (Cu), or silver (Ag). A cooling effect to lower the heat of the EL layer can be expected from the protective electrode 53. It is also effective to continue to the protective electrode 53 without air exposure after the above mentioned cathode 52 are formed.

Reference numeral 54 is a second passivation film, and, preferably, the film thickness thereof is 10 nm-1 mm (200-500 nm preferably). A main purpose to dispose the second passivation film 54 is to protect the EL layer 51 from water. It is also effective to give it a cooling effect. However, the EL layer is weak to heat as mentioned above, and film formation should be performed at a low temperature (ranging from a room temperature to 120° C. preferably). Therefore, it can be said that a desirable film formation method is the plasma CVD method, sputtering method, vacuum deposition method, ion plating method, or solution application method (spin court method).

Needless to say, all the TFTs shown in FIG. 5 have the polysilicon films used in the present invention as active layers.

Therefore, the present invention is not limited to the structure of the EL display device of FIG. 5, which is just one of the preferred embodiments.

Embodiment 2

The digital time division gray scale display method of the present invention is explained below using FIG. 6. A case of performing $2^4$ gray scale display in accordance with a 4 bit digital data signal is explained here.

The structure of the pixel portion of the EL display of the present invention is the same as that shown in FIG. 1. Gate signal lines (G1 to Gy) for inputting a gate signal are connected to gate electrodes of switching TFTs in each pixel. Further, one of a source region and a drain region of the switching TFT of each pixel is connected to source signal lines (also referred to as data signal lines) (S1 to Sx) for inputting digital signals, and the other is connected to the gate electrode of an EL driver TFT and to a capacitor, of each pixel. Note that this structure in Embodiment 2 has capacitors, but a structure not including capacitors may also be used. There are no limitations upon the present invention by the presence of, or lack of, capacitors.

One of the source region and the drain region of the EL driver TFT is connected to electric power source supply lines (V1 to Vx), and the other is connected to EL elements. The electric potential of the power source supply lines (V1 to Vx) is referred to as an electric power source electric potential. Further, the electric power source supply lines (V1 to Vx) are connected to the capacitors of each pixel.

The EL elements are each composed of an anode, a cathode, and an EL layer formed between the anode and the cathode. When the anodes are connected to the source regions or the drain regions of the EL driver TFTs, namely when the anodes are the pixel electrodes, then the cathodes become opposite electrodes. Conversely, for a case in which the cathodes are connected to the source regions or the drain regions of the EL driver TFTs, namely when the cathodes are the pixel electrodes, then the anodes become the opposite electrodes. Furthermore, the electric potential of the opposite electrodes is referred to as a steady-state electric potential within this specification.

The electric potential difference between the steady-state electric potential of the opposite electrodes and the power source electric potential of the pixel electrodes is an EL driver voltage, and the EL driver voltage is applied to the EL layers.

Figure 6:
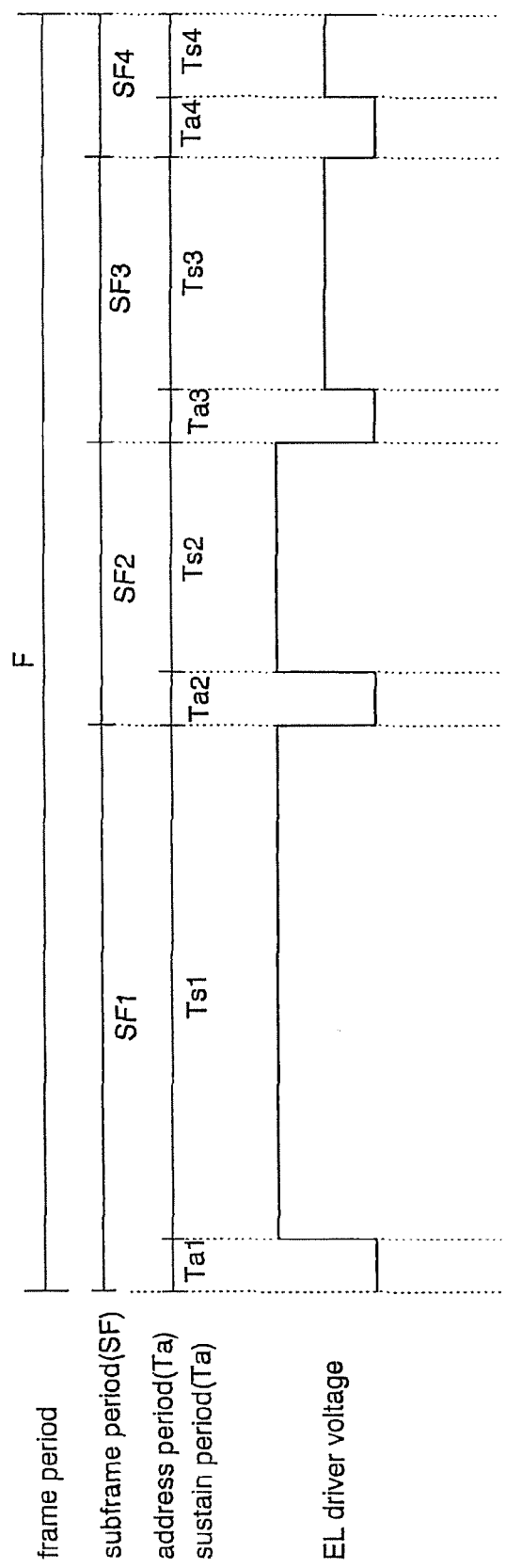
FIG. 6 is a timing chart of a digital time division gray scale display of the present invention.

A timing chart for the EL display digital drive of the present invention is shown in FIG. 6. First, one frame period (F) is divided into four subframe periods (SF1 to SF4). Note that a period in which all of the pixels of the pixel portion display one image is referred to as one frame period (F).

The subframe periods are divided into address periods (Ta) and sustain periods (Ts). The address period is the time required for inputting digital data signals into all of the pixels during one subframe period, and the sustain period (also referred to as a turn on period) denotes a period in which the EL element is made to emit light.

The address periods (Ta) of SF1 to SF4 become Ta1 to Ta4, respectively. The sustain periods (Ts) of SF1 to SF4 become Ts1 to Ts4, respectively.

First, in the address period, the opposite electrode is held at the steady-state potential of the same height as the power source electric potential. In the present embodiment of the present invention, the steady-state potential in the address period of the digital driver is referred to as an off steady-state potential. Note that, the height of the off steady-state potential may be the same as the height of the power source electric potential within the range in which the EL elements do not emit light. Note that, the EL driver voltage at this time is referred to as the off EL driver voltage. Ideally, it is desired that the off EL driver voltage is 0V, but the voltage may be on the level on which the EL elements do not emit light.

Then, the gate signal is input to the gate signal line G1, and all the switching TFTs connected to the gate signal line G1 are turned on.

When the switching TFTs connected to the gate signal line G1 are placed into an On state, a digital data signal is input into all of the source signal lines (S1 to Sx) at the same time. The digital data signal contains "0" or "1" information, and one of the digital data signals "0" and "1" has Hi electric voltage, while the other has Lo voltage.

The digital data signal input into the source signal lines (S1 to Sx) is then input to the gate electrodes of the EL driver TFTs through the switching TFTs, which are in the On state. Further, the digital data signal is also input to the capacitors of all of the pixels connected to the gate signal line G1, and an electric charge is stored.

Next, the gate signal is input to the gate signal line G2, and all of the switching TFTs connected to the gate signal line G2 are placed in the On state. With the switching TFTs connected to the gate signal line G2 in the On state, the digital data signal is input to all of the source signal lines (S1 to Sx) at the same time. The digital data signal input to the source signal lines (S1 to Sx) is input to the gate electrodes of the EL driver TFTs through the switching TFTs. Further, the digital data signal is also input to the capacitors of all of the pixels connected to the gate signal line G2, and stored.

By repeating the above operations through the gate signal line Gy, the digital data signal is input to all of the pixels. The period up until the digital data signal is input to all of the pixels is the address period.

The sustain period commences at the same time as the address period is complete. When the sustain period begins, the electric potential of the opposite electrodes changes from an off steady-state electric potential to an on steady-state electric potential. The steady-state electric potential in the sustain period of the digital drive is referred to as the on steady-state electric potential in the embodiments of the present invention. The on steady-state electric potential may have an electric potential difference with the power source electric potential to the extent that the EL elements emit light. Note that this electric potential difference is referred to as an on EL driver voltage. Note also that the off steady-state electric potential and the on steady-state electric potential are generically referred to as steady-state electric potentials. Further, the on EL driver voltage and an off EL driver voltage are generically referred to as EL driver voltages.

All of the switching TFTs are set into the Off state in the sustain period. The digital data signal stored in the capacitors is then input to the gate electrodes of the EL driver TFTs.

When the digital data signal contains "0" information, then the EL driver TFTs are set into the Off state in the embodiments of the present invention. The pixel electrodes of the EL elements are therefore maintained at the off steady-state electric potential. As a result, the EL elements contained in pixels to which the digital data signal containing "0" information is applied do not emit light.

On the other hand, for cases having "1" information, the EL driver TFTs turn on in the embodiments of the present invention. The electric power source electric potential is therefore imparted to the pixel electrodes of the EL elements. As a result, EL elements contained in pixels to which the digital data signal having "1" information emit light.

An address period again begins at the completion of the sustain period, and when the data signal is input to all of the pixels, a sustain period begins. Any of the periods Ts1 to T3 become the sustain period at this point. The Ts3 period turns on predetermined pixels here.

Similar operations are repeated subsequently for the remaining 2 subframe periods, Ts2 and Ts1 are set, in order, as sustain periods, and predetermined pixels are turned on in the respective subframes.

One frame period is complete after the 4 subframe periods are completed.

Note that, in the present invention, among the four sustain periods Ts1, ..., Ts4, the brightness of light emitted by the EL elements during at least one sustain period is set to be always lower than the brightness of light emitted by the EL elements in other sustain periods. In Embodiment 2, the brightness of light emitted by the EL elements during the sustain periods Ts3 and Ts4 is one-half the brightness of light emitted by the EL elements during the sustain periods Ts1 and Ts2. In other words, the on EL driver voltage during the sustain periods Ts3 and Ts4 is one-half the EL driver voltage during the other sustain periods Ts1 and Ts2.

The length of the sustain periods Ts1 and Ts2, the sustain periods other than the sustain periods Ts3 and Ts4 having an emitted light brightness of one-half that of Ts1 and Ts2, is expressed as T and $2^{-1}$ T, respectively, where T is a positive constant. Further, the length of the sustain periods Ts3 and T4 is expressed as $2^{-2}$ T×2 and $2^{-3}$ T×2, respectively. Namely, the ratio of lengths of the sustain periods Ts1 to Ts4 is $1:2^{-1}:2^{-1}:2^{-2}$. Therefore, even if the brightness of light emitted by the EL elements during the sustain periods Ts3 and Ts4 is one-half that of the light emitted during the other sustain periods Ts1 and Ts2, the ratio of lengths of the sustain periods Ts3 and Ts4 to all of the sustain periods is twice that of a case in which the brightness of light emitted is not set to one-half. Therefore, even though the brightness of light emitted by the EL elements in the sustain periods Ts3 and Ts4 is one half that of the other sustain periods, the length ratio of the sustain periods Ts3 and Ts4 is set to twice as long, and the desired gray scale display can be obtained.

Consequently, even though the brightness of light emitted by the EL elements in the sustain periods Ts3 and Ts4 is one half that of the other sustain periods, whichever of the sustain periods Ts1, Ts4 is given a reduced brightness, and however much the brightness is reduced, and however many low brightness sustain periods are formed, if the amount of light emitted by the EL elements during each of the sustain periods Ts1, Ts4 is taken as Lm1, Lm4, then Lm1: ... :Lm4=$2^0:2^{-1}:2^{-2}:2^{-3}$. Note that SF1 to Sf4 may appear in any order, and therefore the order of appearance of the sustain periods Ts1, ..., Ts4 is also arbitrary. By combining the sustain periods, the desired gray scale display, from among the $2^4$ gradations, can be performed.

The gradation of each pixel is determined by which subframe periods are selected for light emission during one frame period. For example, if n=4, and the brightness of pixels having light emitted during all of the sustain periods is taken as 100%, then for a case of the pixels emitting light in Ts1 and Ts2, the brightness is expressed as 80%, and when Ts2, Ts3, and Ts4 are selected, the brightness can be expressed as 47%.

With the present invention, even if the Id-Vg characteristics of the TFTs vary slightly, dispersion in the amount of current output when equal gate voltages are applied can be suppressed by the above structure. It therefore becomes possible to avoid the situation in which the amount of light emitted by EL elements of adjacent pixels differs greatly due to variations in the Id-Vg characteristics, even with the same video signal input.

Further, in a sustain period Tsp in which the brightness of light emitted is 1/m of that emitted in other sustain periods Ts1 to Tsn, if the length of the other sustain periods Ts1 to Tsn is taken as $2^{-(n-1)}T$, where T is a positive constant, then the amount of time in which light is emitted by the EL elements can be taken as $2^{-(p-1)}T \times m$. In accordance with the above structure, by regulating the brightness of light emitted by the EL elements during the sustain period Tsp to be 1/m that emitted during the other sustain periods, the length ratio of the sustain period Tsp to all of the sustain periods can be extended by a multiple of m compared to a case in which the brightness of light emitted during the sustain period Tsp is not set to 1/m. Therefore, in accordance with increasing the number of image gradations, even if the number of bits n becomes larger and the length of the sustain periods becomes shorter, the length of the sustain periods can be extended by lowering the brightness of the light emitted by the EL elements.

Further, an example of driving by non-interlaced scanning is explained in Embodiment 2, but it is also possible to drive by interlacing.

Note that it is possible to freely combine Embodiment 2 with Embodiment 1.

Embodiment 3

In this embodiment, a description is here given of a method of simultaneously manufacturing TFTs of a pixel portion and a driving circuit portion around the pixel portion. Concerning the driving circuit, a CMOS circuit that is a base unit is shown in the figure, for a brief description.

First, a substrate 501 in which a base film (not shown) is disposed on the surface thereof is prepared as shown in FIG. 7(A). In this embodiment, a silicon nitride oxide film whose thickness is 200 nm and another silicon nitride oxide film whose thickness is 100 nm are laminated and are used as a base film on a crystallization glass. At this time, preferably, the concentration of nitrogen of the film contacting the crystallization glass substrate is kept to 10-25 wt %. It is possible to form an element directly on the quartz substrate without any base film, of course.

Thereafter, an amorphous silicon film 502 whose thickness is 45 nm is formed on the substrate 501 by a well-known film formation method. There is no need to limit it to the amorphous silicon film. Instead, a semiconductor film (including a microcrystal semiconductor film) that has an amorphous structure can be used in this embodiment. A compound semiconductor film that has an amorphous structure, such as an amorphous silicon germanium film, also can be used herein.

Concerning the steps from here to FIG. 7(C), it is possible to completely cite Japanese Laid-open Patent Publication No. 247735 of 1998 filed by the present applicant. This publication discloses a technique concerning a method of crystallizing a semiconductor film, which uses an element, such as Ni, as a catalyst.

First, a protective film 504 that has openings 503a and 503b is formed. A silicon oxide film 150 nm thick is used in this embodiment. A layer 505 (Ni containing layer) that contains nickel (Ni) is formed on the protective film 504 by a spin court method. Concerning the formation of the Ni containing layer, reference can be made to the above publication.

Thereafter, as shown in FIG. 7(B), heating processing at 570° C. for 14 hours is performed in an inert atmosphere, and the amorphous silicon film 502 is crystallized. At this time, crystallization progresses substantially in parallel with the substrate, starting from regions 506a and 506b (hereinafter, designated as Ni addition region) with which Ni is in contact. As a result, a polysilicon film 507 is formed that has a crystal structure in which bar crystals gather and form lines.

Thereafter, as shown in FIG. 7(C), an element (phosphorus preferably) that belongs to 15-family is added to the Ni addition regions 506a and 506b, while leaving the protective film 504 as a mask. Regions 508a and 508b (hereinafter, designated as phosphorus addition region) to which phosphorus was added at high concentration are thus formed.

Thereafter, heat processing at 600° C. for 12 hours is performed in an inert atmosphere as shown in FIG. 7(C). Ni existing in the polysilicon film 507 is moved by this heat processing, and almost all of them are finally captured by the phosphorus addition regions 508a and 508b as shown by the arrow. It is thought that this is a phenomenon caused by the gettering effect of a metallic element (Ni in this embodiment) by phosphorus.

By this process, the concentration of Ni remaining in the polysilicon film 509 is reduced to at least $2 \times 10^{17}$ atoms/cm$^3$ according to the measurement value by SIMS (mass secondary ion analysis). Although Ni is a lifetime killer for a semiconductor, no adverse influence is given to the TFT characteristic when it is decreased to this extent. Additionally, since this concentration is the measurement limit of the SIMS analysis in the current state of the art, it will show an even lower concentration (less than $2 \times 10^{17}$ atoms/cm$^3$) in practice.

The polysilicon film 509 can be thus obtained that is crystallized by a catalyst and is decreased to the level in which the catalyst does not obstruct the operation of a TFT. Thereafter, active layers 510-513 that use the polysilicon film 509 only are formed by a patterning process. At this time, a marker to conduct mask alignment in the following patterning should be formed by using the above polysilicon film. (FIG. 7(D))

Thereafter, a silicon nitride oxide film 50 nm thick is formed by the plasma CVD method as shown in FIG. 7(E), heating processing at 950° C. for 1 hour is then performed in an oxidation atmosphere, and a thermal oxidation process is performed. The oxidation atmosphere can be an oxygen atmosphere or another oxygen atmosphere in which halogen is added.

In this thermal oxidation process, the oxidation progresses in the interface between the active layer and the silicon nitride oxide film, and a polysilicon film whose thickness is about 15 nm is oxidized, so that a silicon oxide film whose thickness is about 30 nm is formed. That is, a gate insulating film 514 of a thickness of 80 nm is formed in which the silicon oxide film 30 nm thick and the silicon nitride oxide film 50 nm thick are laminated. The film thickness of the active layers 510-513 is made 30 nm by the thermal oxidation process.

Figure 8A:
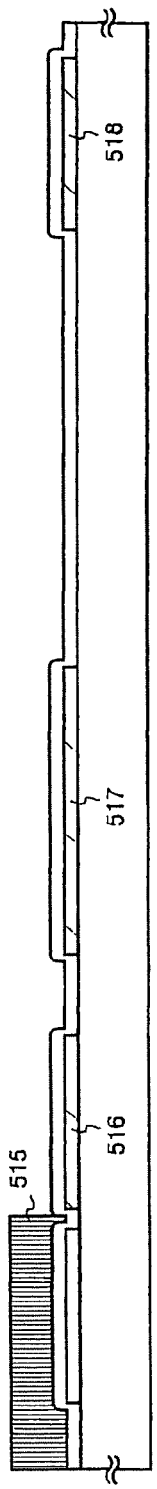
FIGS. 8A to 8D are diagrams showing the process of manufacturing the EL display of the present invention.

Thereafter, as shown in FIG. 8(A), a resist mask 515 is formed, and an impurity element (hereinafter, designated as p-type impurity element) that gives the p-type through the medium of the gate insulating film 514 is added. As the p-type impurity element, an element that belongs to 13-family representatively, boron or gallium typically, can be used. This (called a channel dope process) is a process for controlling the threshold voltage of a TFT.

In this embodiment, boron is added by the ion dope method in which plasma excitation is performed without the mass separation of diborane ($B_2H_6$). The ion implantation method that performs the mass separation can be used, of course. According to this process, impurity regions 516-518 are formed that include boron at the concentration of $1 \times 10^{15}$-$1 \times 10^{18}$ atoms/cm$^3$ ($5 \times 10^{16}$-$5 \times 10^{17}$ atoms/cm$^3$ representatively).

Figure 8B:
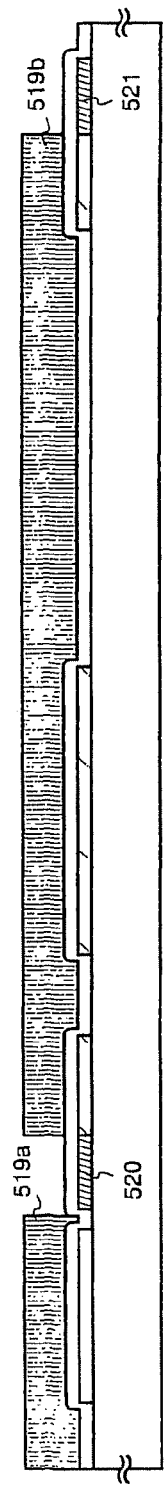

Thereafter, resist masks 519a and 519b are formed as shown in FIG. 8(B), and an impurity element (hereinafter, designated as n-type impurity element) that gives the n-type through the medium of the gate insulating film 514 is added. As the n-type impurity element, an element that belongs to 15-family representatively, phosphorus or arsenic typically, can be used. In this embodiment, a plasma doping method in which plasma excitation is performed without the mass separation of phosphine (PH$_3$) is used. Phosphorus is added in the concentration of $1 \times 10^{18}$ atoms/cm$^3$. The ion implantation method that performs mass separation can be used, of course.

A dose amount is adjusted so that the n-type impurity element is included in the n-type impurity regions 520, 521 formed by this process at the concentration of $2 \times 10^{16}$-$5 \times 10^{19}$ atoms/cm$^3$ ($5 \times 10^{17}$-$5 \times 10^{18}$ atoms/cm$^3$ representatively).

Figure 8C:
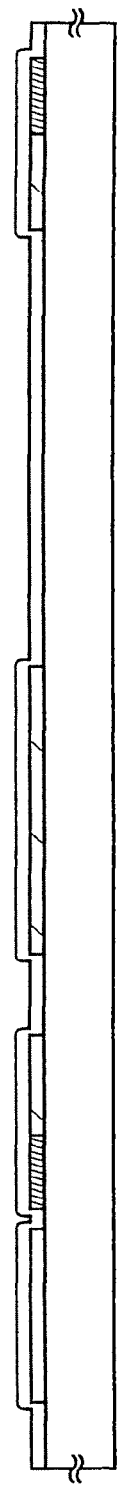
Figure 8D:
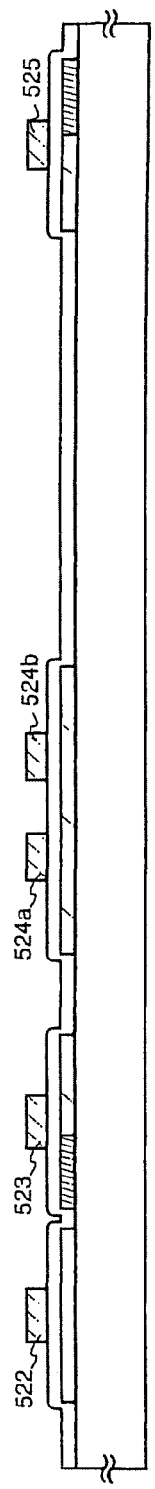

Thereafter, a process is performed for activating the added n-type impurity element and the added p-type impurity element as shown in FIG. 8(C). There is no need to limit the activation means, but, since the gate insulating film 514 is disposed, the furnace annealing process that uses an electro-thermal furnace is desirable. Additionally, it is preferable to perform heat processing at a temperature as high as possible because there is a possibility of having damaged the interface between the active layer and the gate insulating film of a part that is a channel formation region in the process of FIG. 8(A).

Since the crystallization glass with high heat resistance is used in this embodiment, the activating process is performed by the furnace annealing processing at 800° C. for 1 hour. The thermal oxidation can be performed keeping a processing atmosphere in an oxidizing atmosphere, or the heat processing can be performed in an inert atmosphere.

This process clarifies the edge of the n-type impurity regions 520, 521, namely, the boundary (junction) between the n-type impurity regions 520, 521 and the region (p-type impurity region formed by the process of FIG. 8(A)) around the n-type impurity regions 520, 521, where the n-type impurity element is not added. This means that the LDD region and the channel formation region can form an excellent junction when a TFT is later completed.

Thereafter, a conductive film 200-400 nm thick is formed, and patterning is performed, so that gate electrodes 522-525 are formed. The length of each TFT channel is decided by the line width of those gate electrodes 522-525.

The gate electrode can be made of a conductive film of a single-layer, however, preferably, a lamination film, such as two-layer or three-layer film, is used when necessary. A known conductive film can be used as the material of the gate electrode. Specifically, use can be made of a film of an element selected from the group consisting of aluminum (Al), tantalum (Ta), titanium (Ti), molybdenum (Mo), tungsten (W), chrome (Cr), and silicon (Si) having conductivity; a film of a nitride of the aforementioned elements (tantalum nitride film, tungsten nitride film, or titanium nitride film representatively); an alloy film of a combination of the aforementioned elements (Mo—W alloy or Mo—Ta alloy representatively); or, a silicide film of the aforementioned elements (tungsten silicide film or titanium silicide film representatively). They can have a single-layer structure or a lamination-layer structure, of course.

In this embodiment, a lamination film is used that is made of a tungsten nitride (WN) film 50 nm thick and a tungsten (W) film 350 nm thick. This can be formed by the sputtering method. By adding an inert gas, such as Xe or Ne, as a spattering gas, the film can be prevented from peeling off because of stress.

At this time, the gate electrodes 523, 525 are formed to overlap with part of the n-type impurity regions 520, 521, respectively, with the gate insulating film 514 therebetween. The overlapping part is later made an LDD region overlapping with the gate electrode. According to the sectional view of the figure, the gate electrodes 524a and 524b are seen as separate, in fact, they are connected electrically to each other.

Thereafter, with the gate electrodes 522-525 as masks, an n-type impurity element (phosphorus in this embodiment) is added self-adjustably, as shown in FIG. 9(A). At this time, an adjustment is performed so that phosphorus is added to the thus formed impurity regions 527-533 at the concentration of 2/1-1/10 (1/3-1/4 representatively) of that of the n-type impurity regions 520, 521. Preferably, the concentration is $1 \times 10^{16}$-$5 \times 10^{18}$ atoms/cm$^3$ ($3 \times 10^{17}$-$3 \times 10^{18}$ atoms/cm$^3$ typically).

Thereafter, as shown in FIG. 9(B), resist masks 534a-534d are formed to cover the gate electrode, an n-type impurity element (phosphorus in this embodiment) is then added, and impurity regions 535-541 including a high concentration of phosphorus are formed. The ion dope method using phosphine (PH$_3$) is applied also herein, and an adjustment is performed so that the concentration of phosphorus in these regions is $1 \times 10^{20}$-$1 \times 10^{21}$ atoms/cm$^3$ ($2 \times 10^{20}$-$5 \times 10^{21}$ atoms/cm$^3$ representatively).

A source region or a drain region of the n-channel type TFT is formed through this process, and the switching TFT leaves a part of the n-type impurity regions 530-532 formed in the process of FIG. 9(A).

Thereafter, as shown in FIG. 9(C), the resist masks 534a-534d are removed, and a resist mask 543 is newly formed. A p-type impurity element (boron in this embodiment) is then added, and impurity regions 544, 545 including a high concentration of boron are formed. Herein, according to the ion dope method using diborane (B$_2$H$_6$), boron is added to obtain a concentration of $3 \times 10^{20}$-$3 \times 10^{21}$ atoms/cm$^3$ ($5 \times 10^{20}$-$1 \times 10^{21}$ atoms/cm$^3$ representatively).

Phosphorus has been already added to the impurity regions 544, 545 at a concentration of $1 \times 10^{20}$-$1 \times 10^{21}$ atoms/cm$^3$. Boron added herein has at least three times as high concentration as the added phosphorus. Therefore, the impurity region of the n-type formed beforehand is completely changed into that of the p-type, and functions as an impurity region of the p-type.

Thereafter, as shown in FIG. 9(D), the resist mask 543 is removed, and then a first interlayer insulating film 546 is formed. As the first interlayer insulating film 546, an insulating film that includes silicon is used in the form of a single-layer structure or a stacked-layer structure as a combination thereof. Preferably, the film thickness thereof is 400 nm-1.5 μm. In this embodiment, a structure is created in which an 800 nm-thick silicon oxide film is stacked on a 200 nm-thick silicon nitride oxide film.

Thereafter, the n-type or p-type impurity element added at each concentration is activated. The furnace annealing method is desirable as an activation means. In this embodiment, heat treatment is performed at 550° C. for 4 hours in a nitrogen atmosphere in an electro-they mal furnace.

Heat treatment is further performed at 300-450° C. for 1-12 hours in an atmosphere that includes hydrogen of 3-100% for hydrogenation. This is a process to hydrogen-terminate an unpaired connector of a semiconductor film by thermally excited hydrogen. As another means for hydrogenation, plasma hydrogenation (hydrogen excited by plasma is used) can be performed.

Hydrogenation can be performed during the formation of the first interlayer insulating film 546. In more detail, the 200 nm-thick silicon nitride oxide film is formed, and hydrogenation is performed as mentioned above, and thereafter the remaining 800 nm-thick silicon oxide film can be formed.

Thereafter, as shown in FIG. 10(A), contact holes are made in the first interlayer insulating film 546 and the gate insulating film 514, and source wiring lines 547-550 and drain wiring lines 551-553 are formed. In this embodiment, this electrode is formed with a lamination film of a three-layer structure in which a 100 nm-thick Ti film, a 300 nm-thick aluminum film that includes Ti, and a 150 nm-thick Ti film are continuously formed according to the sputtering method. Other conductive films can be used, of course.

Thereafter, a first passivation film 554 is formed to be 50-500 nm thick (200-300 nm thick representatively). In this embodiment, a 300 nm-thick silicon nitride oxide film is used as the first passivation film 554. A silicon nitride film can be substituted for this.

At this time, it is effective to perform plasma treatment by the use of gas that includes hydrogen, such as $H_2$ or $NH_3$, prior to the formation of the silicon nitride oxide film. Hydrogen excited by this preprocess is supplied to the first interlayer insulating film 546, and, through heat treatment, the film quality of the first passivation film 554 is improved. At the same time, since hydrogen that is added to the first interlayer insulating film 546 diffuses onto the lower side, the active layer can be effectively hydrogenated.

Thereafter, as shown in FIG. 10(B), a second interlayer insulating film 555 made of organic resin is formed. Polyimide, acrylic fiber, or BCB (benzocyclobutene) can be used as the organic resin. Especially, since the second interlayer insulating film 555 is required to flatten the level differences formed by TFTs, an acrylic film excellent in smoothness is desirable. An acrylic film is formed to be 2.5 μm thick in this embodiment.

Thereafter, contact holes that reach the drain wiring line 553 are made in the second interlayer insulating film 555 and the first passivation film 554, and then a protective electrode 556 is formed. As the protective electrode 556, a conductive film largely composed of aluminum can be used. The protective electrode 556 can be formed according to the vacuum deposition method.

Thereafter, an insulating film (a silicon oxide film in this embodiment) that includes silicon is formed to be 500 nm thick, an opening is then formed at the position corresponding to the pixel electrode, and a third interlayer insulating film 557 is formed. It is possible to easily form a tapered sidewall by using the wet etching method when the opening is formed. If the sidewall of the opening does not have a sufficiently gentle slope, deterioration of the EL layer caused by level differences will lead to an important problem.

Thereafter, a opposite electrode (MgAg electrode) 558 which is a cathode of an EL element is formed. The MgAg electrode 558 is formed using the vacuum deposition method to make the film thickness 180-300 nm (200-250 nm typically).

Next, an EL layer 559 is formed without air exposure by the vacuum deposition method. The film thickness of the EL layer 559 is 800-200 nm (100-120 nm typically) and the pixel electrode (anode) 560 thereof is 110 nm.

In this process, an EL layer and a pixel electrode (anode) are sequentially formed for a pixel corresponding to red, a pixel corresponding to green, and a pixel corresponding to blue. However, since the EL layer is poor in tolerance to solutions, they must be independently formed for each color without using the photolithography technique. Thus, it is preferable to conceal pixels except a desired one by the use of the metal mask, and selectively form an EL layer and the pixel electrode (anode) for the desired pixel.

In detail, a mask is first set for concealing all pixels except a pixel corresponding to red, and an EL layer and a pixel electrode (anode) of red luminescence are selectively formed by the mask. Thereafter, a mask is set for concealing all pixels except a pixel corresponding to green, and an EL layer and a pixel electrode (anode) of green luminescence are selectively formed by the mask. Thereafter, as above, a mask is set for concealing all pixels except a pixel corresponding to blue, and an EL layer and a pixel electrode (anode) of blue luminescence are selectively formed by the mask. In this case, the different masks are used for the respective colors. Instead, the same mask may be used for them. Preferably, processing is performed without breaking the vacuum until the EL layer are formed for all the pixels.

A known material can be used for the EL layer 559. Preferably, that is an organic material in consideration of driving voltage. For example, the EL layer can be formed with a four-layer structure consisting of a positive hole injection layer, a positive hole transporting layer, a luminescent layer, and an electronic injection layer. In this embodiment, indium tin oxide film is formed as a pixel electrode (anode) of an EL layer. A transparent conductive film can be used in which zinc oxide (ZnO) of 2-20% is mixed with indium oxide or other well-known materials also can be used.

At the final stage, a second passivation film 561 made of a silicon nitride film is formed to be 300 nm thick.

An EL display device constructed as shown in FIG. 10(C) is completed. In practice, preferably, the device is packaged (sealed) by a highly airtight protective film (laminate film, ultraviolet cured resin film, etc.) or a housing material such as a ceramic sealing can, in order not to be exposed to the air when completed as shown in FIG. 10(C). In that situation, the reliability (life) of the EL layer is improved by making the inside of the housing material an inert atmosphere or by placing a hygroscopic material (for example, barium oxide) therein.

The present embodiment can be freely combined with an embodiment 2.

Embodiment 4

Figure 11:
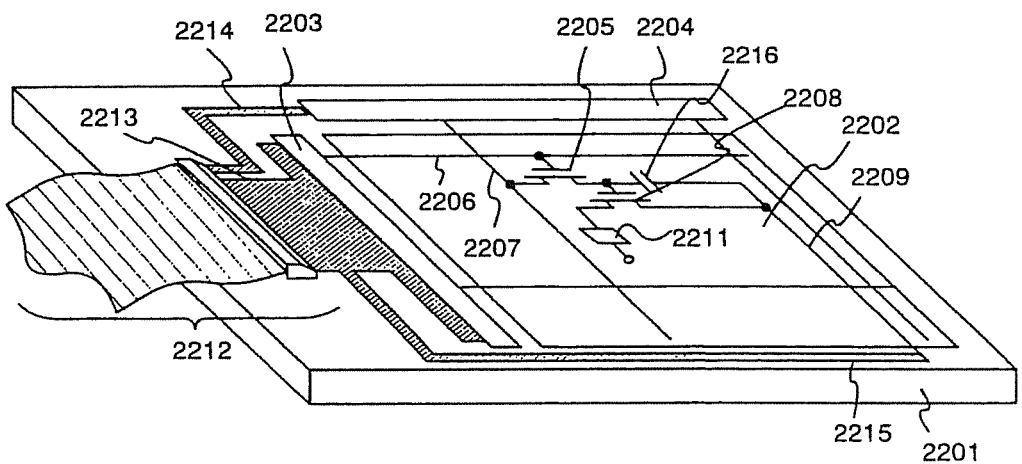
FIG. 11 is a perspective view of an EL display of the present invention.

Now, the structure of the EL display device of this embodiment will be described with reference to the perspective view of FIG. 11.

The EL display device of this embodiment is made up of a pixel portion 2202, a gate signal side driving circuit 2203, and a source side driving circuit 2204, each formed on a glass substrate 2201. A switching TFT 2205 of the pixel portion 2202 is an n-channel type TFT, and is disposed at the intersection of a gate wiring line 2206 connected to the gate side driving circuit 2203 and a source wiring line 2207 connected to the source side driving circuit 2204. The drain region of the switching TFT 2205 is connected to the gate electrode of the EL driver TFT 2208.

The source region of the EL driver TFT 2208 is connected to a current-feed line 2209. A capacitor 2216 is provided, which is connected to the gate electrode and the current-feed line 2209 of the EL driver TFT 2208. In this embodiment, electric supply potential is added to the current-feed line 2209. Further, a common potential is added to the opposite electrode (cathode in this embodiment) of the EL element 2211.

A FPC 2212 which is an external input-output terminal is provided with input wiring lines (connection wiring lines)

2213, 2214 for transmitting a signal to the driving circuit, and an input-output wiring line 2214 connected to the current-feed line 2209.

Figure 12A:
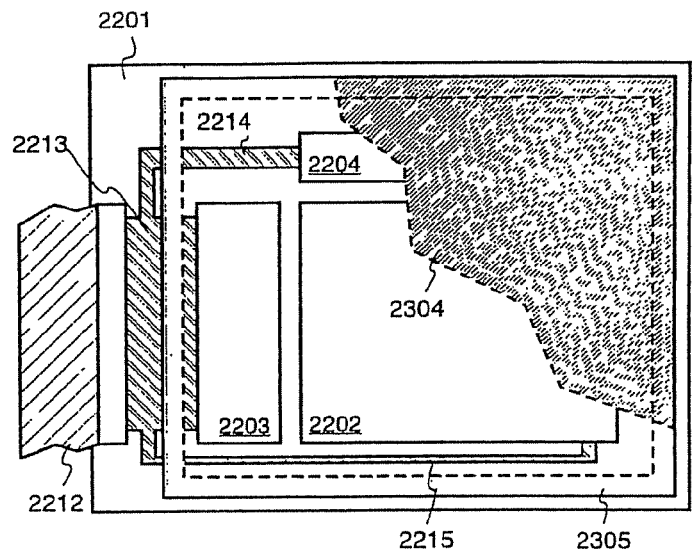
FIGS. 12A and 12B are a top view and a cross sectional diagram, respectively, of an EL display of the present invention.

The EL module of this embodiment including housing materials will now be described with reference to FIGS. 12(A) and 12(B). Reference characters used in FIG. 11 are again used when necessary.

A pixel portion 2202, a gate signal side driving circuit 2203, and a source signal side driving circuit 2204 are formed on a glass substrate 2201. Various wiring lines from each driving circuit are connected to external equipment via the input-output wiring lines 2213 to 2215 and the FPC 2212.

At this time, a substrate 2304 is disposed so as to overlap at least the pixel portion 2202, preferably the pixel portion 2202 and the driving circuit 2203, 2204. The protective substrate 2304 is fixed to the glass substrate 2201 by a seal material 2305 so as to form closed space in cooperation with the glass substrate 2201. At this time, the EL element is in a state of being completely enclosed in the closed space, and is completely intercepted from the outside air. The closed space which is formed by a glass substrate 2201, a protective substrate 2304 and a seal material 2305 is called a cell 2306. The plurality of cell 2306 can be formed by disposing a plurality of protective substrate 2304.

Preferably, the quality of the protective substrate 2304 is an insulating substance such as glass or polymer. For example, there is amorphous glass (borosilicate glass, quartz, etc.), crystallization glass, ceramics glass, organic resin (acrylic resin, styrene resin, polycarbonate resin, epoxy resin, etc.) or silicone resin. In addition, ceramics can be used. It is also possible to use metallic materials, such as stainless alloy, if the seal material 2305 is an insulating material.

As the quality of the seal material 2305, epoxy resin, acrylate resin, etc., can be used. In addition, thermosetting resin or light curing resin can be used as the adhesive. However, it is required to be a material that does not transmit oxygen and water to the utmost.

It is preferable to inject a packed material to the cell 2306. As a packed material, PVC (poly vinyl chloride), epoxy resin, silicon resin, PVB (poly vinyl butyral), EVA (ethylene vinyl acetate), acrylic and polyimide etc. can be used.

It is also effective to dispose a drying agent in the cell 2306. A dryer described in Japanese Laid-open Patent Publication Hei 9-148066 can be used as the drying agent. Generally, barium oxide can be used.

Figure 12B:
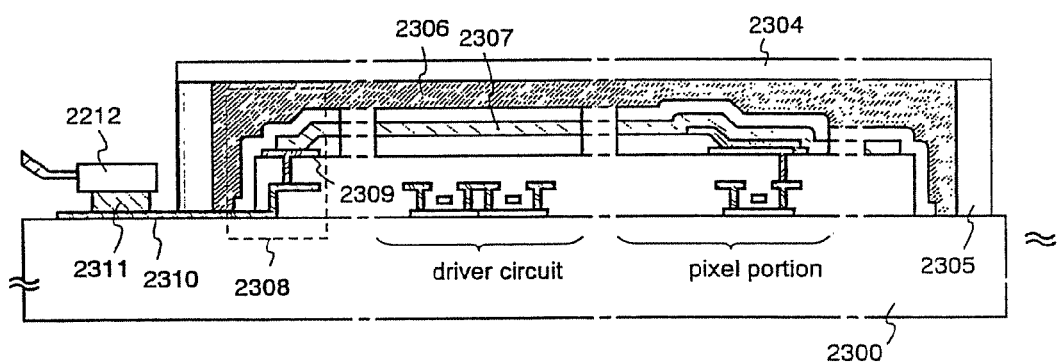

As shown in FIG. 12(B), the pixel portion is provided with a plurality of pixels, each having individually isolated EL elements. All of them have a protective electrode 2307 as a common electrode. In this embodiment, a description was given as follows: it is preferable to continuously form the EL layer, the cathode (MgAg electrode), and the protective electrode without air exposure. Instead, if the EL layer and the cathode are formed by using the same mask material, and only the protective electrode is formed by another mask, a structure of FIG. 12(B) will be realized.

At this time, the EL layer and the cathode can be disposed on the pixel portion only, and are not required to be disposed on the driving circuit. No problem will occur even if they are disposed on the driving circuit, of course. However, they should not be disposed thereon in consideration of the fact that an alkali metal is included in the EL layer.

The protective electrode 2307 is connected to an input-output wiring line 2310 in the region shown by reference numeral 2308 through the medium of a connection wiring line 2309 that is made of the same material as the pixel electrode. The input-output wiring line 2310 is a current-feed line to give a EL driving potential to the protective electrode 2307, and is connected to the FPC 2212 through the medium of a conductive paste material 2311.

Note that it is possible to freely combine the constitution of this embodiment with the constitution of embodiment 1 and embodiment 2.

Embodiment 5

In Embodiment 5, there will be explained a structure of a pixel of an EL display according to the present invention.

Figure 13A:
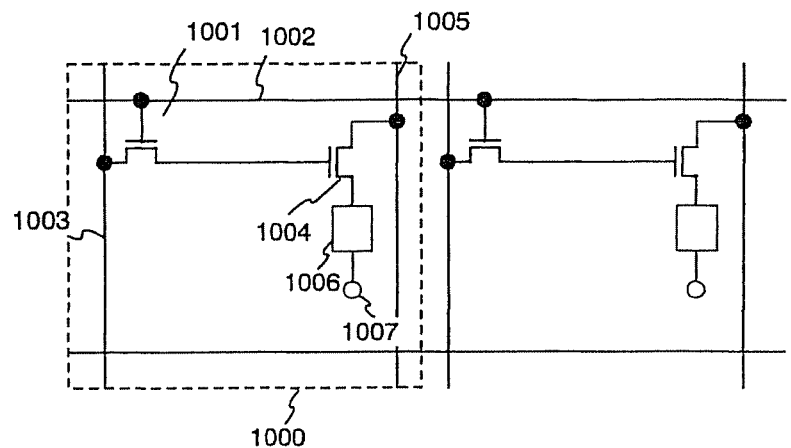
FIGS. 13A and 13B are circuit diagrams of pixel portions of EL displays of the present invention.

On the pixel portion of the EL display according to the present invention, a plurality of pixels are arranged in matrix. FIG. 13A shows an example of a circuit diagram of the pixel. In the pixel 1000, a switching TFT 1001 is provided in FIG. 13A. Note that, in the present invention, as a switching TFT 1001, either an n-channel TFT or a p-channel TFT may be used. In FIG. 13A, the n-channel TFT is used as the switching TFT 1001.

The gate electrode of the switching TFT 1001 is connected to the gate signal line 1002 for inputting a gate signal. One of the source region and the drain region of the switching TFT 1001 is connected to the data signal line (also referred to as source signal line) 1003 for inputting a digital data signal while the other is connected to the gate electrode of the EL driver TFT 1004.

One of the source region and the drain region of the EL driver TFT 1004 is connected to the power source supply line 1005 while the other is connected to the EL element 1006.

The EL element 1006 comprises an anode, a cathode and an EL layer provided between the anode and the cathode. Note that, according to the present invention, in the case where the anode is a pixel electrode and the cathode is an opposite electrode, either the source region or the drain region of the EL driver TFT 1004 is connected to the anode of the EL element 1006. On the contrary, in the case where the anode is the opposite electrode and the cathode is the pixel electrode, either the source region or the drain region of the EL driver TFT is connected to the cathode of the EL element 1006.

Note that, as the EL driver TFT 1004, either n-channel TFT or p-channel TFT may be used. However, in the case where the anode of the EL element 1006 is the pixel electrode and the cathode is the opposite electrode, it is preferable that the EL driver TFT 1004 is the p-channel TFT. Furthermore, on the contrary, in the case where the anode of the EL element 1006 is the opposite electrode, and the cathode is the pixel electrode, it is preferable that the EL driver TFT 1004 is an n-channel TFT. In FIG. 13A, the p-channel TFT is used as the EL driver TFT 1004. The cathode of the EL element 1006 is connected to the steady-state power source 1007.

Furthermore, in the case where the switching TFT 1001 is set in the non-selection state (Off state), a capacitor may be provided to hold the gate voltage of the EL driver TFT 1004. In the case where the capacitor is provided, the capacitor is connected between the one of the source region and the drain region of the switching TFT 1001 which is not connected to the source signal line, and the power source supply line 1005. In a circuit diagram shown in FIG. 13A, the power source supply line 1005 is arranged in parallel with the source signal line 1003.

Furthermore, an LDD region may be formed within the active layer of the EL driver TFT 1004, and a region may be formed (Lov region) in which the LDD region and the gate electrode overlap through the gate insulating film. By forming the Lov region in the drain region side of the active layer, a capacitance can be formed between the gate electrode of the EL driver TFT 1004 and the Lov region, and the gate voltage of the EL driver TFT 1004 can be stored, whether the EL driver TFT 1004 is an n-channel TFT or a p-channel TFT. In particular, when the EL driver TFT 1004 is an n-channel TFT, the on current can be increased by forming the Lov region in the drain region side of the active layer.

In order to use the Lov region of the EL driver TFT as a capacitor for storing the gate voltage of the EL driver TFT 1004, a capacity value of about 19.8 fF is required in the case where the pixel size is 22 μm×22 μm, the thickness of the gate insulating film is 800 Å and the relative dielectric constant of the gate insulating film is 4.1. Consequently, as the area of the Lov region (an area in which the LDD region and the gate electrode are overlapped via the gate insulating film), an area of about 66 μm$^2$ is required.

Figure 14A:
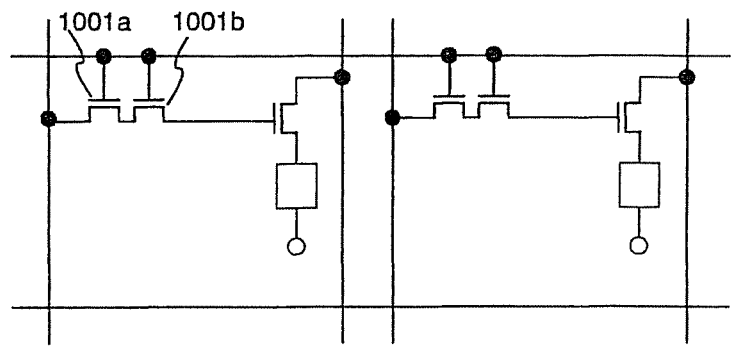
FIGS. 14A and 14B are circuit diagrams of pixel portions of EL displays of the present invention.

Note that, in the circuit diagram shown in FIG. 13A, either the switching TFT 001 or the EL driver TFT 1004 may be formed into a multi-gate structure (a structure including an active layer having two or more channel forming regions connected in series). FIG. 14A shows a circuit diagram of a pixel in which the switching TFT 1001 of the pixel shown in FIG. 13A is formed into a multi-gate structure.

The switching TFT 1001*a* and the switching TFT 1001*b* are formed connected in series. Except for the switching TFTs 1001*a* and 1001*b*, the structure is the same as the circuit diagram shown in FIG. 13A. By making the switching TFTs multi-gate structures, the off current can be lowered, and the gate voltage of the EL driver TFT 1004 can be stored without forming a capacitor, in particular. Therefore, a capacitor for storing the gate voltage of the EL driver TFT 1004 need not be formed. Note that a double gate structure is used in FIG. 14A, but the present invention is not limited to a double gate structure, and any multi-gate structure may be used.

Besides, though not shown, in the case where the EL driver TFT is formed into a multi-gate structure, the deterioration of the EL driver TFT by heat can be suppressed.

Figure 13B:
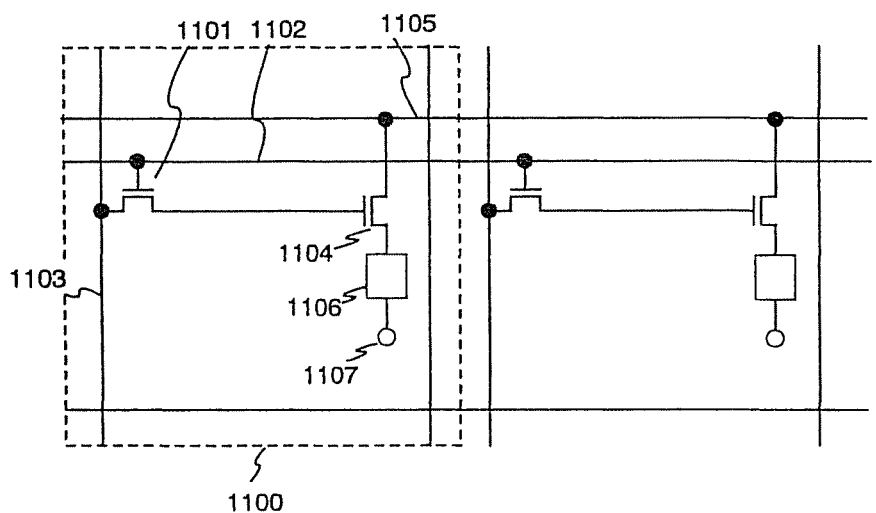

Next, FIG. 13B shows another example of the circuit diagram of the pixel according to the present invention. In FIG. 13B, the switching TFT 1101 is provided in the pixel 1100. Note that, in the present invention, either the n-channel TFT or the p-channel TFT may be used as the switching TFT 1101. In FIG. 13B, the n-channel TFT is used as the switching TFT 1101. The gate electrode of the switching TFT 1101 is connected to the gate signal line 1102 for inputting the gate signal. One of the source region and the drain region of the switching TFT 1101 is connected to the data signal line (also referred to as a source signal line) 1103 for inputting a digital data signal while the other is connected to the gate electrode of the EL driver TFT 1104.

Then, one of the source region and the drain region of the EL driver 11104 is connected to the power source supply line 1105 while the other is connected to the EL element 1106.

The EL element 1106 comprises an anode, a cathode and an EL layer provided between the anode and the cathode. Note that, in the present invention, in the case where the anode is the pixel electrode and the cathode is the opposite electrode, either the source region or the drain region of the EL driver TFT 1104 is connected to the anode of the EL element 1106. On the contrary, in the case where the anode is the opposite electrode and the cathode is the pixel electrode, either the source region or the drain region of the EL driver TFT 1104 is connected to the cathode of the EL element 1106. Note that, as the EL driver TFT 1104, either the n-channel TFT or the p-channel TFT may be used. However, in the case where the anode of the EL element 1106 is the pixel electrode and the cathode thereof is the opposite electrode, it is preferable that the EL driver TFT 1104 is the p-channel TFT. Furthermore, on the contrary, in the case where the anode of the EL element 1106 is the opposite electrode and the cathode thereof is the pixel electrode, it is preferable that the EL driver TFT 1104 is the n-channel TFT. In FIG. 13B, the p-channel TFT is used in the EL driver TFT 1104. The cathode of the EL element 1106 is connected to the steady-state power source 1107.

Furthermore, when the switching TFT 1101 is set in the non-selection state (Off state), a capacitor may be provided to hold the gate voltage of the EL driver TFT 1104. In the case where the capacitor is provided, the capacitor is connected between the one of the source region and the drain region of the switching TFT 1101 which is not connected to the source signal line, and the power source supply line 1105. In the circuit diagram shown in FIG. 13B, the power source supply line 1105 and the gate signal line 1102 are arranged in parallel.

Furthermore, an LDD region may be formed within the active layer of the EL driver TFT 1104, and a region may be formed (Lov region) in which the LDD region and the gate electrode overlap through the gate insulating film. By forming the Lov region in the drain region side of the active layer, a capacitance can be formed between the gate electrode of the EL driver TFT 1004 and the Lov region, and the gate voltage of the EL driver TFT 1104 can be stored, whether the EL driver TFT 1104 is an n-channel LET or a p-channel TFT. In particular, when the EL driver TFT 1104 is an n-channel TFT, the on current can be increased by forming the Lov region in the drain region side of the active layer.

Figure 14B:
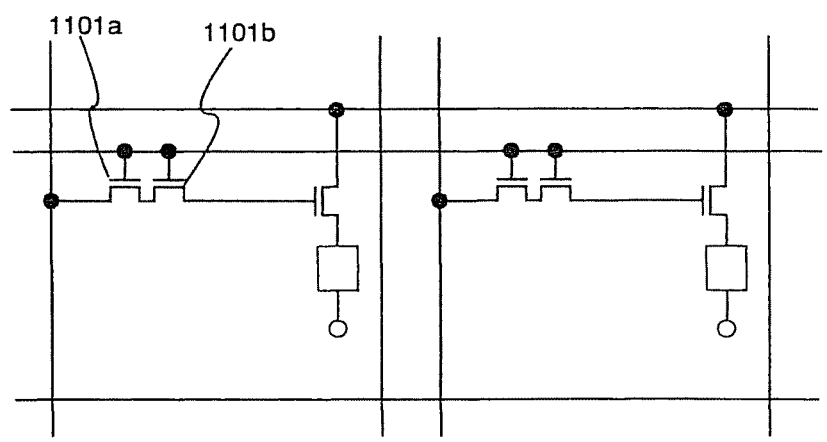

Note that, in the circuit diagram shown in FIG. 13B, either the switching TFT 1101 or the EL driver TFT 1104 may be formed into a multi-gate structure. FIG. 14B shows a circuit diagram of a pixel in which the switching TFT 1101 of the pixel shown in FIG. 13B is formed into a multi-gate structure.

The switching TFT 1101*a* and the switching TFT 1101*b* are formed connected in series. Except for the switching TFTs 1101*a* and 1101*b*, the structure is the same as the circuit diagram shown in FIG. 13B. By making the switching TFTs multi-gate structures, the off current can be lowered, and the gate voltage of the EL driver TFT 1104 can be stored without forming a capacitor, in particular. Therefore, a capacitor for storing the gate voltage of the EL driver TFT 1104 need not be formed. Note that a double gate structure is used in FIG. 14B, but the present invention is not limited to a double gate structure, and any multi-gate structure may be used.

Besides, though not shown, in the case where the EL driver TFT is formed in a multi-gate structure, the deterioration of the EL driver TFT by heat can be suppressed.

Figure 15A:
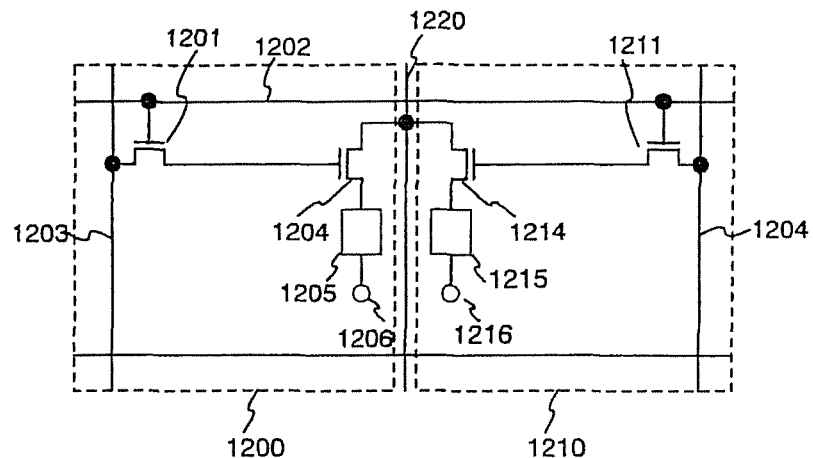
FIGS. 15A and 15B are circuit diagrams of pixel portions of EL displays of the present invention.

Next, FIG. 15A shows another example of a circuit diagram of a pixel according to the present invention. In FIG. 15A, the pixel 1200 and the pixel 1210 are provided adjacent to each other. In FIG. 15A, reference numerals 1201 and 1211 denote switching TFTs. Note that, in the present invention, as switching TFTs 1201 and 1211, either the n-channel TFT or the p-channel TFT may be used. In FIG. 15A, the n-channel TFT is used in the switching TFT 1201 and the switching TFT 1211. The gate electrodes of the switching TFTs 1201 and 1211 are connected to the gate signal line 1202 for inputting the gate signal. One of the source region and the drain region of the switching EFTs 1201 and 1211 is connected to the data signal lines 1203 and 1204 (hereinafter referred to as a source signal line) for inputting a digital data signal while the other is connected to the gate electrodes of the EL driver TFTs 1204 and 1214, respectively.

Then, one of the source region and the drain region of the EL driver TFTs 1204 and 1214 is connected to the power source supply line 1220 while the other is connected to the EL elements 1205 and 1215, respectively. In this manner, in Embodiment 5, two adjacent pixels share one power source supply line 1220. As a consequence, as compared with the structure shown in FIG. 13 and FIG. 14, the number of the power source supply lines can be decreased. When the ratio of the wiring with respect to the whole pixel portion is small, the light shielding by the wiring can be suppressed in the case where the wiring is provided in a direction of the light emission of the EL layer.

The EL elements 1205 and 1215 comprise an anode, a cathode, and an EL layer provided between the anode and the cathode respectively. Note that, according to the present invention, in the case where the anode is the pixel electrode and the cathode is the opposite electrode, either the source region or the drain region of the EL driver TFTs 1204 and the 1214 is connected to the anodes of the EL elements 1205 and 1215. On the contrary, in the case where the anode is the opposite electrode and the cathode is the pixel electrode, either the source region or the drain region of the EL driver TFTs 1204 and 1214 is connected to the cathodes of the EL elements 1205 and 1215. Note that, as the EL driver TFTs 1204 and 1214, either the n-channel TFT or the p-channel TFT may be used. However, in the case where the anodes of the EL elements 1205 and 1215 are pixel electrodes while the cathodes thereof are opposite electrodes, it is preferable that the EL driver TFTs 1204 and 1214 are the p-channel TFTs. Besides, on the contrary, in the case where the anodes of the EL elements 1205 and 1215 are the opposite electrodes and the cathodes thereof are the pixel electrodes, preferably the EL driver TFTs 1204 and 1214 are n-channel TFTs. In FIG. 15A, as the EL driver TFTs 1204 and 1214, the p-channel TFTs are used. The cathodes of the EL elements 1205 and 1215 are connected to the steady-state power sources 1206 and 1216.

Furthermore, when the switching TFT 1201 and 1211 are set in the non-selection state (Off state), a capacitor may be provided for storing the gate voltage of the EL driver TFTs 1204 and 1214. In the case where the capacitor is provided, the capacitor may be connected between the one of the drain region and the source region of the switching TFT 1201 which is not connected to the source signal line and the power source supply line 1220.

Furthermore, an LDD region may be formed within the active layer of the EL driver TFTs 1204 and 1214, and a region may be formed (Lov region) in which the LDD region and the gate electrode overlap through the gate insulating film. By forming the Lov region in the drain region side of the active layer, a capacitance can be formed between the gate electrodes of the EL driver TFTs 1204 and 1214 and the Lov region, and the gate voltages of the EL driver TFT 1204 and 1214 can be stored, whether the EL driver TFT 1204 is an n-channel TFT or a p-channel TFT. In particular, when the EL driver TFTs 1204 and 1214 are n-channel TFTs, the on current can be increased by forming the Lov region in the drain region side of the active layer.

Figure 16A:
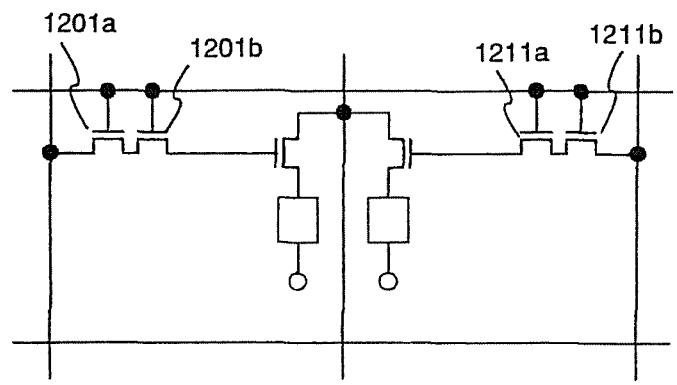
FIGS. 16A and 16B are circuit diagrams of pixel portions of EL displays of the present invention.

Note that, in a circuit diagram shown in FIG. 15A, the switching TFT 1201 and 1211, or the EL driver TFTs 1204 and 1214 may be formed into a multi-gate structure. FIG. 16A shows a circuit diagram of a pixel in which the switching TFTs 1201 and 1211 are formed into the multi-gate structure of a pixel shown in FIG. 15A.

The switching TFT 1201a and the switching TFT 1201b are formed connected in series. The switching TFT 1211a and the switching TFT 1211b are also formed connected in series. Except for the switching TFTs 1201a and 1201b and the switching TFTs 1211a and 1211b, the structure is the same as the circuit diagram shown in FIG. 15A. By making the switching TFTs multi-gate structures, the off current can be lowered, and the gate voltage of the EL driver TFTs 1204 and 1214 can be stored without forming a capacitor, in particular. Therefore, a capacitor for storing the gate voltages of the EL driver TFTs 1204 and 1214 need not be formed. Note that a double gate structure is used in FIG. 16A, but the present invention is not limited to a double gate structure, and any multi-gate structure may be used.

Besides, though not shown, in the case where the EL driver TFT is formed into a multi-gate structure, the deterioration of the EL driver TFT by heat can be suppressed.

Figure 15B:
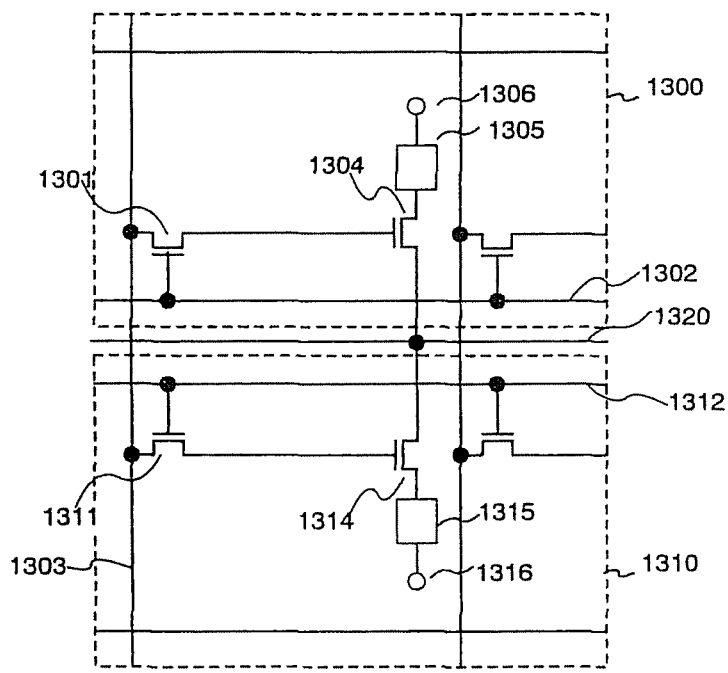

Next, FIG. 15B shows another example of a circuit diagram of a pixel according to the present invention. In FIG. 15B, the pixel 1300 and the pixel 1310 are provided adjacent to each other. In FIG. 15B, reference numerals 1301 and 1311 denote the switching TFTs. Note that, in the present invention, as the switching TFTs 1301 and 1311, either the n-channel TFT or the p-channel TFT can be used. In FIG. 15B, the n-channel TFT is used as the switching TFTs 1301 and 1311. The gate electrodes of the switching TFTs 1301 and the 1311 are connected to the gate signal lines 1302 and 1312 for inputting the gate signal respectively. One of the source region and the drain region of the switching TFTs 1301 and 1311 is connected to the data signal line 1303 (also referred to as a source signal line) for inputting a digital data signal, while the other is connected to the gate electrode of the EL driver TFTs 1304 and 1314 respectively.

Then, one of the source region and the drain region of the EL driver TFTs 1304 and 1314 is connected to the power source supply line 1320, while the other is connected to the EL elements 1305 and 1315 respectively. In this manner, in Embodiment 5, two adjacent pixels share one power source supply line 1320. As a consequence, as compared with the structure shown in FIGS. 13 and 14, the number of power source supply lines can be decreased. When the ratio of the wiring with respect to the whole pixel portion is small, the light shielding by the wiring can be suppressed in the case where the wiring is provided in a direction of light emission of the EL layer. Then, in a circuit diagram shown in FIG. 16B, the power source supply line 1320 is provided in parallel with the gate signal lines 1302 and 1312.

The EL elements 1305 and 1315 comprise an anode, a cathode, and an EL layer provided between the anode and the cathode respectively. Note that, according to the present invention, in the case where the anode is the pixel electrode and the cathode is an opposite electrode, either the source region or the drain region of the EL driver TFTs 1304 and 1314 is connected to the anodes of the EL elements 1305 and 1315. On the contrary, in the case where the anode is the opposite electrode and the cathode is the pixel electrode, either the source region or the drain region of the EL driver TFTs 1304 and 1314 is connected to the cathodes of the EL elements 1305 and 1315. Note that, as the EL driver TFTs 1304 and 1314, either the n-channel TFT or the p-channel 117 may be used. However, in the case where the anodes of the EL elements 1305 and 1315 are pixel electrodes and the cathodes thereof are opposite electrodes, it is preferable that the EL driver TFTs 1304 and 1314 are p-channel TFTs. Besides, on the contrary, in the case where the anodes of the EL elements 1305 and 1315 are opposite electrodes and the cathodes thereof are pixel electrodes, it is preferable that the EL driver TFTs 1304 and 1314 are n-channel TFTs. In FIG. 15B, the p-channel TFTs are used as the EL driver TFTs 1304 and 1314, so that the cathodes of the EL elements 1305 and 1315 are connected to the steady-state power sources 1306 and 1316.

Furthermore, when the switching TFTs 1301 and 1311 are set in the non-selection state (Off state), a capacitor may be provided for storing the gate voltage of the EL driver TFTs 1304 and 1314. In the case where the capacitor is provided, the capacitor is connected between the one of the source region and the drain region of the switching 1301 and 1311 which is not connected to the source signal line, and the power source supply line 1320.

Furthermore, an LDD region may be formed within the active layer of the EL driver TFTs 1304 and 1314, and a region may be formed (Lov region) in which the LDD region and the gate electrode overlap through the gate insulating film. By forming the Lov region in the drain region side of the active layer, a capacitance can be formed between the gate electrodes of the EL driver TFT 1304 and 1314 and the Lov region, and the gate voltage of the EL driver 11304 and 1314 can be stored, whether the EL driver TFT 1304 and 1314 are n-channel TFTs or p-channel TFTs. In particular, when the EL driver TFT 1304 and 1314 are n-channel TFTs, the on current can be increased by forming the Lov region in the drain region side of the active layer.

Figure 16B:
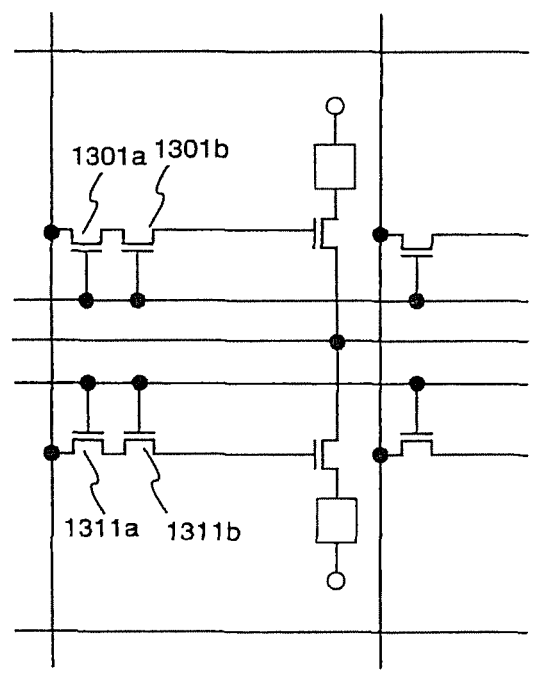

Note that, in a circuit diagram shown in FIG. 15B, the switching TFTs 1301 and 1311 or the EL driver TFTs 1304 and 1314 may be formed into a multi-gate structure. FIG. 16B shows a circuit diagram of a pixel in which the switching TFTs 1301 and 1311 of a pixel shown in FIG. 15B are formed into a multi-gate structure.

The switching TFT 1301a and the switching TFT 1301b are formed connected in series. The switching TFT 1311a and the switching TFT 1311b are also formed connected in series. Except for the switching TFTs 1301a and 1301b and the switching TFTs 1311a and 1311b, the structure is the same as the circuit diagram shown in FIG. 15B. By making the switching TFTs multi-gate structures, the off current can be lowered, and the gate voltage of the EL driver TFTs 1304 and 1314 can be stored without forming a capacitor, in particular. Therefore, a capacitor for storing the gate voltage of the EL driver TFTs 1304 and 1314 need not be formed. Note that a double gate structure is used in FIG. 16B, but Embodiment 5 is not limited to a double gate structure, and any multi-gate structure may be used.

Besides, though not shown, in the case where the EL driver TFT is formed into the multi-gate structure, the deterioration of the EL driver TFTs by heat can be suppressed.

Note that, in Embodiment 5, a resistor may be provided between the pixel electrodes the EL element and the drain region of the EL driver TFT. By providing the resistor, the quantity of current supplied from the EL driver TFT to the EL element is controlled so that the influence of the characteristic of the EL driver TFT on the variation may be prevented. The resistor may be an element showing a resistance value sufficiently larger than the on resistance of the EL driver TFT. Therefore, the structure or the like is not restricted. Note that, the on resistance is a value obtained by dividing the drain voltage of the TFT by the drain current which flows at that time when the TFT is turned on. As a resistance value of the resistor, any in the range of 1 kΩ through 50 MΩ (preferably, 10 kΩ through 10 MΩ, or more preferably 50 kΩ through 1 MΩ) may be selected. When a semiconductor layer having a high resistance value as a resistor is used, the formation is easy and preferable.

Note that it is possible to freely combine Embodiment 5 with Embodiments 1 to 3.

Embodiment 6

There are cases in which various compensations are necessary in displaying an image by an electro-optical device. For example, there are gamma compensation and compensation by strengthening the light emitted by self emitting elements. Further, when handling a signal applied for gamma compensation in a CRT, there are times when it becomes necessary for reverse gamma compensation. In Embodiment 6, a compensation system capable of providing compensation for a digital video signal used in the present invention is explained.

An example of a compensation system which applies compensation to a 4 bit digital video signal is explained below. Note that Embodiment 6 is not limited to this number of bits. The compensation system used in Embodiment 6 applies compensation to a video signal before it is input to the time division gradation data signal generation circuit 114 shown in FIG. 4A. Note that it is necessary for the compensated video signal to be a digital signal, and therefore when the video signal is analog, it is first converted to digital and then the compensation is applied.

Figure 20:
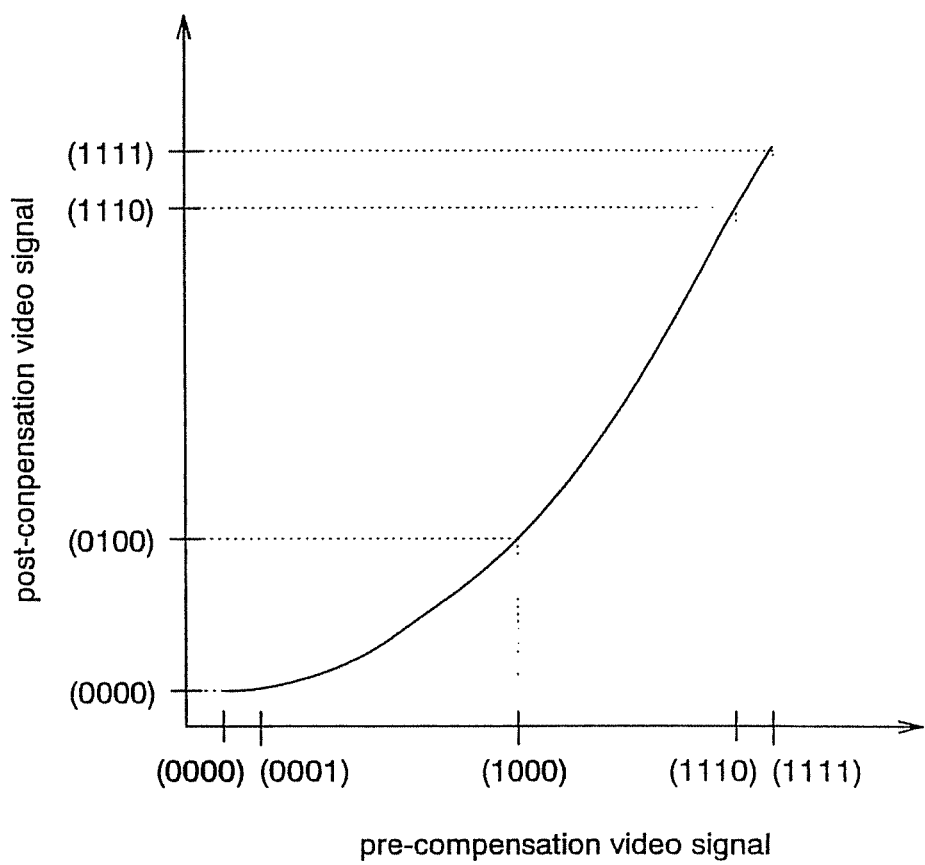
FIG. 20 is a graph showing the relationship between a pre-compensation video signal and a post-compensation video signal.

FIG. 20 is a graph showing a video signal before being input to the compensation system (pre-compensation video signal) on the horizontal axis, and showing the video signal after it is output from the compensation system (post-compensation video signal) on the vertical axis. When applying this type of compensation to the video signal, specifically the compensation system shown in FIGS. 21A and 21B is formed before the time division gradation data signal generator circuit.

Figure 21A:
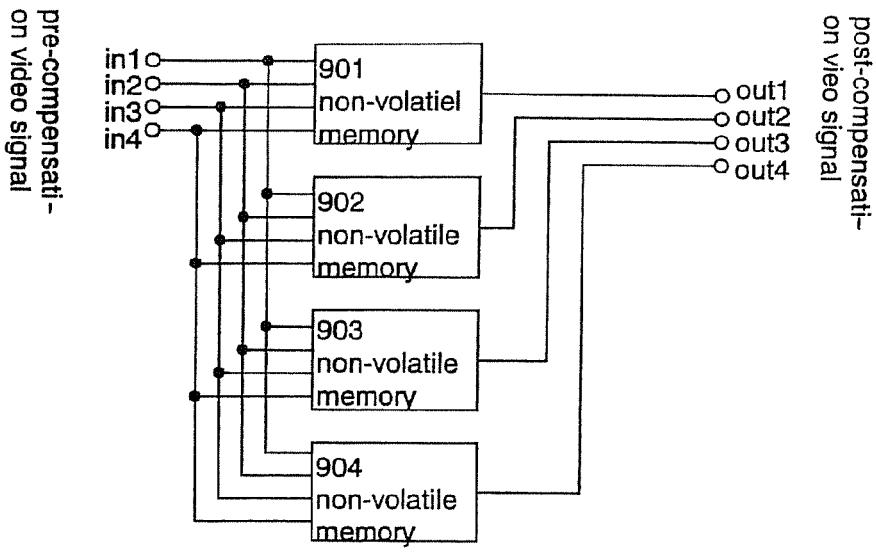
FIGS. 21A and 21B are compensation systems used in an EL display of the present invention.
Figure 21B:
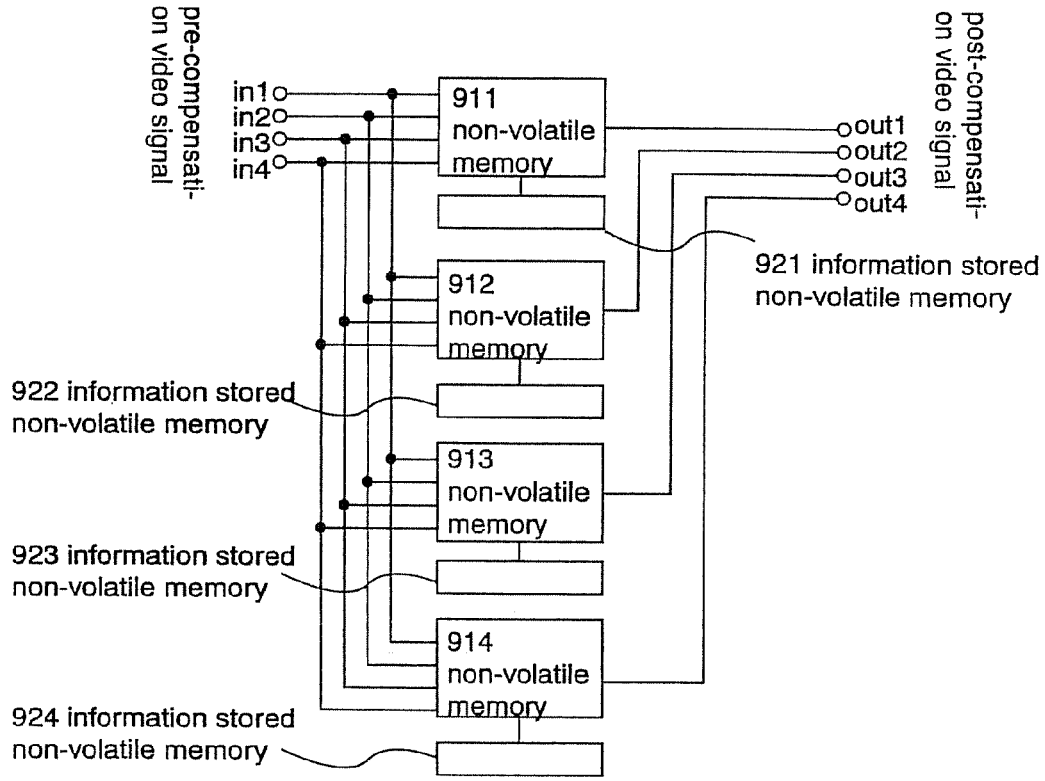

Shown in FIG. 21A is one example of a compensation system used by the present invention. Non-volatile memories 901 to 904, the same number as the number of bits in the video signal, are formed in the compensation system shown in FIG. 21A.

Information for each bit of the pre-compensation video signal is input in order to in1 to in4. Note that the first bit (least sensitive bit, LSB) of the pre-compensation video signal is input to in1, and that the fourth bit (most sensitive bit, MSB) of the pre-compensation video signal is input to in4.

The pre-compensation video signal having 4-bit information is input to all of the non-volatile memories 901 to 904.

A first bit of post-compensation video signal information for output, corresponding to the input pre-compensation video signal, is stored in the non-volatile memory 901. Therefore, the pre-compensation video signal input to the non-volatile memory 901 is converted to the first bit of the post-compensation video signal and then output from out1. Note that the post-compensation video signal information for output, corresponding to the input pre-compensation video signal, is referred to as compensation data in the present invention.

Bits 2 to 4 of the post-compensation video signal information for output, corresponding to the input pre-compensation video signal, are similarly stored in the non-volatile memories 902 to 904. Therefore, the pre-compensation video signasl input to the non-volatile memories 902 to 904 are converted to the bits 2 to 4 of the post-compensation video signal and then output from out2 to out4.

The specific state of the pre-compensation video signal having been transformed to the post-compensation video signal is shown in FIG. 22. For a case in which the pre-compensation video signal input to in1 to in4 has (0000) information, information containing all 0s is output from the non-volatile memories 901 to 904. Therefore, the post-compensation video signal output from out1 to out4 contains (0000) information.

For a case in which the pre-compensation video signal input to in1 to in4 has (1000) information, 0 information is output from the non-volatile memories 901, 903, and 904. Further, 1 information is output from the non-volatile memory 902. The post-compensation video signal output from out1 to out4 therefore contains (0100) information.

In addition, for a case in which the pre-compensation video signal input to in1 to in4 has (1111) information, information containing all is output from the non-volatile memories 901 to 904. Therefore, the post-compensation video signal output from out1 to out4 contains (1111) information.

A compensation such as that shown in FIG. 20 can thus be applied to the video signal by the compensation system using the non-volatile memories 901 to 904.

Another example of a compensation system used by the present invention, different from that shown in FIG. 21A, is shown in FIG. 21B. Volatile memories 911 to 914, the same number as the number of bits in the video signal, and storage use non-volatile memories 921 to 924 are formed in the compensation system shown in FIG. 21B.

Information for each bit of the pre-compensation video signal is input in order to in1 to in4. Note that the first bit (least sensitive bit, LSB) of the pre-compensation video signal is input to in1, and that the fourth bit (most sensitive bit, MSB) of the pre-compensation video signal is input to in4.

The pre-compensation video signal having 4-bit information is input to all of the storage use non-volatile memories 921 to 924.

A first bit of post-compensation video signal information for output, corresponding to the input pre-compensation video signal, is stored in the storage use non-volatile memory 921. Bits 2 to 4 of the post-compensation video signal information for output, corresponding to the input pre-compensation video signal, are similarly stored in the storage use non-volatile memories 922 to 924. Information stored in the storage use non-volatile memories 921 to 924 is then read into the volatile memories 911 to 914, respectively, and stored for a fixed period.

The pre-compensation video signal input to the volatile memory 911 is then converted into bit 1 of post-compensation video signal and output from out1. Further, the pre-compensation video signals input to the volatile memories 912 to 914 are also similarly converted to bits 2 to 4, respectively, of the post-compensation video signal and output from out2 to out4.

The pre-compensation video signal can thus be converted into the post-compensation video signal in accordance with the compensation system shown in FIG. 21B. Note that it is possible to operate volatile memories at high speed, compared with non-volatile memories, and therefore it is possible to operate the compensation system shown in FIG. 21B faster than the compensation system shown in FIG. 21A.

The compensation systems shown in FIGS. 21A and 21B have a memory circuit, such as non-volatile memory, a volatile memory, or a storage use non-volatile memory, divided into the same number as the number of video signal bits, and these memory circuits may also be formed on the same IC chip. Further, they also may be formed using semiconductors on the same substrate as the EL display.

Note that the compensation data stored in the memory circuit in the compensation system of Embodiment 6 is not limited to that used in Embodiment 6.

Embodiment 7

The material used in the EL layer of the EL element in the EL display of the present invention is not limited to an organic EL material, and the present invention can be implemented using an inorganic EL material. However, at present inorganic EL materials have an extremely high driver voltage, and therefore TFTs which have voltage resistance characteristics such that they are able to withstand such a high voltage must be used.

Alternately, if an inorganic EL material having a lower driver voltage is developed in the future, it is possible to apply such a material to the present invention.

Furthermore, it is possible to freely combine the constitution of Embodiment 7 with the constitution of any of Embodiments 1 to 6.

Embodiment 8

Organic materials used as an EL layer in the present invention may be low molecular weight organic materials or polymer (high molecular weight) materials. Known low molecular weight organic materials center around the following: Alq$_3$ (tris-8-quinolinolate aluminum), and TPD (triphenylamine dielectric). A π-conjugate polymer material can be given as an example of such a polymer organic material. Typically, materials such as PPV (polyphenylene vinylene), PVK (polyvinyl carbazole), or polycarbonate can be given as examples.

Polymer (high molecular weight) materials can be formed by simple thin film formation methods such as spin coating (also referred to as solution application), dipping, dispensing, printing, and ink jet printing, and they have a higher heat resistance compared to low molecular weight organic materials.

Further, in the EL elements of the EL display of the present invention, when the EL layers of the EL elements have an electron transporting layer and a hole transporting layer, an electron transporting layer and a pole transporting layer may be composed of an inorganic material, for example, of an amorphous semiconductor such as amorphous Si or amorphous $Si_{1-x}C_x$.

A large amount of trap levels exist within amorphous semiconductors, and a large amount of boundary levels are formed in boundaries at which other layers contact the amorphous semiconductors. Therefore, along with being able to emit light at a low voltage, the brightness of the EL elements can be made higher.

Further, a dopant (impurity) may also be added to an organic EL layer, changing the color of light emitted by the organic EL layer. Materials such as DCM1, nile red, ruberen, coumalin 6, TPB, and quinacridon can be given as examples of dopants.

Furthermore, it is possible to freely combine the constitution of Embodiment 8 with the constitution of any of Embodiments 1 to 7.

Embodiment 9

Next, another method of driving the EL display of the present invention shown in FIG. 1 is explained. A case of performing $2^n$ gray scale display in accordance with an n-bit digital driver method is explained. Note that the timing chart is the same as for the case shown by the embodiment mode of the present invention, and therefore FIG. 2 may be referenced.

The structure of a pixel portion 1500 of an EL display of the present invention is shown in FIG. 1. Gate signal lines (G1 to Gy) for inputting gate signals are connected to gate electrodes of switching TFTs 1501 of each pixel. Further, one of source and drain regions of the switching TFT 1501 of each pixel is connected to source signal lines (also referred to as data signal lines) (S1 to Sx) for inputting digital signals, and the other is connected to gate electrode of EL driver TFT 1504, and to a capacitor 1508 of each pixel. Note that this structure in the embodiment mode has the capacitors 1508, but a structure not including the capacitors 1508 may also be used. There are no limitations upon the present invention by the presence of, or lack of, capacitors.

One of the source and drain regions of the EL driver TFT 1504 of each pixel is connected to power source supply lines (V1 to Vx), and the other is connected to EL elements 1506. The electric potential of the power source supply lines (V1 to Vx) is referred to as an power source electric potential. Further, the electric power source supply lines (V1 to Vx) are connected to the capacitors 1508 of each pixel. Note that the digital data signal is a signal in which an analog or a digital video signal is transformed into a digital signal for performing time division gray scale display, and that it contains image information.

The EL element 1506 is composed of an anode, a cathode, and an EL layer formed between the anode and the cathode. When the anodes are connected to the source regions or the drain regions of the EL driver TFTs 1504, namely when the anodes are the pixel electrodes, then the cathodes which are opposite electrodes are maintained at a constant potential. Conversely, for a case in which the cathodes are connected to the source regions or the drain regions of the EL driver TFTs 1504, namely when the cathodes are the pixel electrodes, then the anodes which are the opposite electrodes are maintained at a constant potential.

The electric potential difference between the steady-state electric potential of the opposite electrodes and the steady power source electric potential of the pixel electrode is an EL driver voltage, and the EL driver voltage is applied to the EL layers.

First, one frame period (F) is divided into n subframe periods (SF1 to SFn). Note that the period in which all of the pixels of the pixel portion display one image is referred to as one frame period (F).

The subframe periods are divided into address periods (Ta) and sustain periods (Ts). The address period is the time required for inputting data into all of the pixels during one subframe period, and the sustain period (also referred to as a turn on period) denotes a period in which the EL element is made to emit light.

The address periods (Ta) of SF1 to SFn become Ta1 to Tan, respectively. The sustain periods (Ts) of SF1 to SFn become Ts1 to Tsn, respectively.

In the beginning, in an address period, the power source supply lines (V1 through Vn) are held at the power source electric potential having the same height as the steady-state potential. In this specification, the power source electric potential in the digital driver address period is referred to as off-power source electric potential. Note that, the height of the off-power source electric potential may be set to the same height of the steady-state potential within the scope in which the EL element 1506 does not emit light. Note that, the EL driver voltage at this time is referred to as off EL driver voltage. Ideally, it is desired that the off EL driver voltage is 0V, but may be set to a level at which the EL element 1506 does not emit light.

Then, the gate signal is input to the gate signal line G1, so that all the switching TFTs 1501 connected to the gate signal line G1 are all turned on.

With the switching TFT 1501 connected to the gate signal line G1 in the On state, the digital data signal is input to the source signal lines (S1 to Sx) in order.

The digital data signal input into the source signal lines (S1 to Sx) is then input to the gate electrodes of the EL driver TFTs 1504 through the switching TFTs 1501, which are in the On state. Further, the digital data signal is also input to the capacitors 1508 of all of the pixels connected to the gate signal line G1, and an electric charge is stored.

Next, the gate signal is input to the gate signal line G2, so that all the switching TFTs 1501 connected to the gate signal line G2 are turned on. Then, in the state in which the switching TFTs 1501 connected to the gate signal line G2 are turned on, the digital data signal is input in order to the source signal lines (S1 through Sx). The digital data signal input to the source signal lines (S1 through Sn) is input to the gate electrode of the EL driver TFTs 1504 via the switching TFTs 1501. Furthermore, the digital data signal is also input, to the capacitor 1508 of all pixels connected to gate signal line G2, and is held.

By repeating the above operations through to the gate signal line Gy, the digital data signal is input to all of the pixels. The period up until the digital data signal is input to all of the pixels is the address period.

The sustain period begins at the same time as the address period is completed. When the sustain period starts, the electric potential of the electric power source supply lines (V1 to Vx) changes from an off-power source electric potential to an on-power source electric potential. In Embodiment 9, the power source electric potential during the digital drive sustain period is referred to as an on-power source electric potential. The on-power source electric potential has an electric potential difference between a level at which the EL elements emit light and the steady-state electric potential. Note that this electric potential difference is referred to as an on EL driver voltage. Note also that the off-power source electric potential and the on-power source electric potential are generically referred to as electric power supply voltages. Further, the on EL driver voltage and an off EL driver voltage are generically referred to as EL driver voltages.

All of the switching TFTs 1501 are set into the Off state in the sustain period. The digital data signal stored in the capacitors 1508 is then input to the gate electrodes of the EL driver TFTs 1504.

When the digital data signal contains "0" information, then the EL driver TFTs 1504 are set into the Off state in the embodiment mode of the present invention. The pixel electrodes of the EL elements 1506 are therefore maintained at the off power source electric potential. As a result, the EL elements 1506 contained in pixels to which the digital data signal containing "0" information is applied do not emit light.

On the other hand, for a case having "1" information in Embodiment 9, the EL driver TFTs 1504 turn on. The pixel electrodes of the EL elements 1506 therefore have the on-power source electric potential. As a result, the EL elements 1506 having pixels to which the digital data signal having "1" information is applied emit light.

An address period again begins at the completion of the sustain period, and when the data signal is input to all of the pixels, a sustain period begins. All of the periods Ts1 to Ts(n−1) become the sustain period at this point. The Ts(n−1) period turns on predetermined pixels here.

Hereinbelow, suppose that a similar operation is repeated with respect to the remaining n−2 sub-frames, so that the sustain periods Ts(n−2), Ts(n−3), Ts1 are set, and a predetermined pixel is lit in respective sub-frames.

One frame period is complete after the n subframe periods are completed.

Note that, from among the n sustain periods Ts1, . . . , Tsn, the brightness of light emitted by the EL elements during at least one sustain period is set to be always lower than the brightness of light emitted by the EL elements in other sustain periods.

If a sustain period in which the brightness of light emitted is 1/m of that emitted in other sustain periods is taken as Tsp (where p is an arbitrary number greater than or equal to 1 and less than or equal to n), then from among the n sustain periods Ts1, ..., Tsn, the length of the sustain periods other than the sustain period Tsp is expressed as $2^{-(n-1)}T$. Further, the length of the sustain period Tsp is expressed as $2^{-(p-1)}T \times m$. Note that m is a positive number greater than 1. Therefore, even if the brightness of light emitted by the EL elements during the sustain period Tsp is 1/m that of the light emitted during the other sustain periods, the length of the sustain period Tsp is set to be $2^{-(p-1)}T \times m$, and the predetermined gray scale display can therefore be obtained.

Consequently, whichever of the n sustain periods Ts1, ..., Tsn is taken as the sustain period Tsp, and however many sustain periods Tsp are formed, if the amount of light emitted by the EL elements during each of the sustain periods Ts1, ..., Tsn is taken as Lm1, ..., Lmn, then it becomes Lm1:Lm2:Lm4: ... :Lm(n−1):Lmn=$2^0$:$2^{-1}$:$2^{-2}$: ... :$2^{-(n-2)}$:$2^{-(n-1)}$. Note that SF1 to Sfn may appear in any order, and therefore the order of appearance of the sustain periods Ts1, ..., Tsn is also arbitrary. By combining the sustain periods, the desired gray scale display from among the $2^n$ gradations, can be performed.

The gradation of each pixel is determined by which subframe periods are selected for light emission during a one frame period. For example, if n=8, and the brightness of pixels having light emitted during all of the sustain periods is taken as 100%, then for a case of the pixels emitting light in Ts1 and Ts2, the brightness is expressed as 75%, and when Ts3, Ts5, and Ts8 are selected, the brightness can be expressed as 16%.

With the present invention, even if the Id-Vg characteristics of the TFTs vary slightly, dispersion in the amount of current output when equal gate voltages are applied can be suppressed by the above structure. It therefore becomes possible to avoid the situation in which the amount of light emitted by EL elements of adjacent pixels differs greatly due to variations in the Id-Vg characteristics, even with the same voltage signal input.

Further, the amount of time light is emitted by the EL elements can be set to $2^{-(p-1)}T \times m$ (where T is a positive constant) in the sustain period Tsp, in which the brightness of light emitted by the EL elements is 1/m of other sustain periods. By using the above structure, and by increasing the number of image gradations, the number of bits n becomes larger, and even if the length of the sustain period expressed by $2^{-(n-1)}T$ becomes shorter, the brightness of light emitted by the EL elements is regulated to be 1/m that emitted in other sustain periods, the length of the sustain period is set to $2^{-(p-1)}T \times m$, and it becomes possible to extend it.

Note that with the above structure of the present invention, the electric potential of the opposite electrodes is always maintained constant, and the electric potential of the pixel electrodes is changed by the address periods and the sustain period, and the off EL driver voltage or the on EL driver voltage is applied to the EL layers. However, the present invention is not limited to this structure. Alternatively, the electric potential of the pixel electrodes may be always maintained constant, and by changing the electric potential of the opposite electrodes by the address period and the sustain period, the off EL driver voltage or the on EL driver voltage may be applied to the EL layers. In this case, regulation of the brightness of the EL elements is performed by controlling the electric potential of the opposite electrodes.

Further, with the above structure of the present invention, the off EL driver voltage is taken as zero and the EL elements are not made to emit light, but the off EL driver voltage may also be set to the same voltage as the on EL driver voltage and light may also be emitted during the address period. In this case, the power source electric potential and the steady-state electric potential are always maintained at a constant value. However, in this case the subframe period becomes a period of emitting light, and therefore the length of the subframe periods is set to SF1, SF2, ..., SFn=$2^0T$, $2^{-1}T$, ..., $2^{-(n-1)}T$, and the length of the subframe period having a brightness of 1/m is set to $2^{-(n-1)}T \times m$. An image having a high brightness compared to that of a driver method in which light is not emitted during the address period can be obtained by the above structure.

In this embodiment, an example of driving by interlaced scanning has been described, but it is also possible to drive by interlacing.

Furthermore, it is possible to combine the constitution of Embodiment 9 with the constitutions of any of Embodiments 1, and 3 to 8.

Embodiment 10

A different method of driving the EL display of the present invention is explained next. A case of performing $2^4$ gray scale display in accordance with a 4-bit digital data signal is explained. Note that the timing chart is the same as for the case shown by Embodiment 2 of the present invention, and therefore FIG. 6 may be referenced.

The structure of a pixel portion of the EL display of Embodiment 10 is the same as that shown in FIG. 1. The gate signal lines (G1 to Gy) for inputting gate signals are connected to a gate electrode of a switching TFT in each pixel. Further, one set of regions from source regions and drain regions of the switching TFTs of each pixel is connected to source signal lines (S1 to Sx) for inputting digital data signals, and the other set of regions is connected to gate electrodes of EL driver TFTs of each pixel, and to capacitors of each pixel. Note that a structure having capacitors is used in Embodiment 10, but a structure not having capacitors may also be used. There are no limitations upon the present invention by the presence of, or lack of, capacitors.

One set of regions from source regions and drain regions of the EL driver TFTs is connected to electric power source supply lines (V1 to Vx), and the other set of regions is connected to EL elements. The electric potential of the electric power source supply lines (V1 to Vx) is referred to as an electric power source electric potential. Further, the electric power source supply lines (V1 to Vx) are connected to the capacitors of each pixel.

The EL elements are composed of an anode and a cathode, and an EL layer formed between the anode and the cathode. When the anodes are connected to the source regions or the drain regions of the EL driver TFTs, namely when the anodes are the pixel electrodes, then the cathodes of the opposed electrodes are held at a constant electric potential. Conversely, for a case in which the cathodes are connected to the source regions or the drain regions of the EL driver TFTs, namely when the cathodes are the pixel electrodes held at a constant electric potential, then the anodes which are the opposite electrodes. Furthermore, the electric potential of the opposite electrodes is referred to as a steady-state electric potential within this specification.

The electric potential difference between the steady-state electric potential of the opposite electrodes and the power source electric potential of the pixel electrodes is an EL driver voltage, and the EL driver voltage is applied to the EL layers.

FIG. 6 shows a timing chart with respect to digital driving of the EL display of this embodiment. First, a one frame period (F) is divided into 4 pieces of subframe periods (SF1 to SF4).

The subframe periods are divided into address periods (Ta) and sustain periods (Ts). The address period is the time required for inputting digital data signal into all of the pixels during one subframe period, and the sustain period (also referred to as a turn on period) denotes a period in which the EL element is made to emit light.

The address periods (Ta) having SF1 to SF4 become Ta1 to Ta4, respectively. The sustain periods (Ts) having SF1 to SF4 become Ts1 to Ts4, respectively.

In the beginning, in an address period, the power source supply lines (V1 through Vx) are held at the power source electric potential having the same height as the steady-state potential. In this specification, the power source electric potential in the digital driver address period is referred to as off-power source electric potential. Note that, the height of the off-power source electric potential may be set to the same height of the steady-state potential within the scope in which the EL element does not emit light. Note that, the EL driver voltage at this time is referred to as off EL driver voltage. Ideally, it is desired that the off EL driver voltage is 0V, but may be set to a level at which the EL element does not emit light.

Then, the gate signal is input to the gate signal line G1, so that all the switching TFTs connected to the gate signal line G1 are all turned on.

With the switching TFT connected to the gate signal line G1 in the On state, the digital data signal is input to the source signal lines (S1 to Sx) in order. The digital data signal has the information "0" and "1" and the digital data signals "0" and "1" will be signals where one will have Hi voltage and the other will have Lo voltage.

The digital data signal input into the source signal lines (S1 to Sx) is then input to the gate electrodes of the EL driver TFTs through the switching TFTs, which are in the On state. Further, the digital data signal is also input to the capacitors of all of the pixels connected to the gate signal line G1, and an electric charge is stored.

Next, the gate signal is input to the gate signal line G2, so that all the switching TFTs connected to the gate signal line G2 are turned on. Then, in the state in which the switching TFTs connected to the gate signal line G2 are turned on, the digital signal is input in order to the source signal lines (S1 through S4). The digital data signal input to the source signal lines (S1 through Sx) is input to the gate electrode of the EL driver TFTs via the switching TFTs. Furthermore, the digital data signal is also input to the capacitor of all pixels connected to the gate signal line G2, and is held.

By repeating the above operations through the gate signal line Gy, the digital data signal is input to all of the pixels. The period up until the digital data signal is input to all of the pixels is the address period.

The sustain period begins at the same time as the address period is completed. When the sustain period starts, the electric potential of the electric power source supply lines (V1 to Vx) changes from an off-power source electric potential to an on-power source electric potential. In this embodiment, the power source electric potential during the digital drive sustain period is referred to as an on-power source electric potential. The on-power source electric potential has an electric potential difference between a level at which the EL elements emit light and the steady-state electric potential. Note that this electric potential difference is referred to as an on EL driver voltage. Note also that the off-power source electric potential and the on-power source electric potential are generically referred to as electric power supply voltages. Further, the on EL driver voltage and an off EL driver voltage are generically referred to as EL driver voltages.

All of the switching TFTs are set into the Off state in the sustain period. The digital data signal stored in the capacitors is then input to the gate electrodes of the EL driver TFTs.

When the digital data signal contains "0" information, then the EL driver TFTs are set into the Off state in the embodiment of the present invention. The pixel electrodes of the EL elements are therefore maintained at the off power source electric potential. As a result, the EL elements 1506 having pixels to which the digital data signal containing "0" information is applied do not emit light.

On the other hand, for a case having "1" information in this embodiment, the EL driver TFTs turn on. The pixel electrodes of the EL elements therefore have the on-power source electric potential. As a result, the EL elements having pixels to which the digital data signal having "1" information is applied emit light.

An address period again begins at the completion of the sustain period, and when the data signal is input to any one of the pixels, a sustain period begins. All of the periods Ts1 to Ts3 become the sustain period at this point. The Ts3 period turns on predetermined pixels here.

Similar operations are repeated subsequently for the remaining 2 subframe periods, Ts2, Ts1 are set in order as sustain periods, and predetermined pixels are turned on in the respective subframes.

One frame period is complete after the 4 subframe periods are completed.

Note that, from among the four sustain periods Ts1, . . . Ts4, the brightness of light emitted by the EL elements during at least one sustain period is set to be always lower than the brightness of light emitted by the EL elements in other sustain periods. In this embodiment, the brightness of light emitted by the EL elements during the sustain periods Ts3 and Ts4 is one-half the brightness of light emitted by the EL elements during the sustain periods Ts1 and Ts2. In other words, the on EL driver voltage during the sustain periods Ts3 and Ts4 is one-half the EL driver voltage during the other sustain periods Ts1 and Ts2.

The length of the sustain periods Ts1 and Ts2, the sustain periods other than the sustain periods Ts3 and Ts4 having an emitted light brightness of one-half that of other sustain periods is expressed as T and $2^{-1}$ T, respectively. Further, the length of the sustain periods Ts3 and Ts4 is expressed as $2^{-2}$ T×2 and $2^{-3}$ T×2, respectively. Namely, the ratio of lengths of the sustain periods Ts1 to Ts4 is $1:2^{-1}:2^{-1}:2^{-2}$. Therefore, even if the brightness of light emitted by the EL elements during the sustain periods Ts3 and Ts4 is one-half that of the light emitted during the other sustain periods, the ratio of lengths of the sustain periods Ts3 and Ts4 to all of the sustain periods, is twice that of a case in which the brightness of light emitted is not set to one-half. Therefore, even though the brightness of light emitted by the EL elements in the sustain periods Ts3 and Ts4 is one half that of the other sustain periods, the length ratio of the sustain periods Ts3 and Ts4 is set to twice as long, and the desired gray scale display can be obtained.

Consequently, in this embodiment, though the light brightness of the EL element in the sustain periods Ts3 and Ts4 is set to one-half, whichever of the 4 pieces of sustain periods Ts1, . . . , Ts4 is given a reduced brightness, and however much the brightness is reduced, and however many low brightness sustain periods are formed, if the amount of light emitted by the EL elements during each of the sustain periods Ts1, Ts4 is taken as Lm1, ..., Lm4, then it becomes Lm1: ... :Lm4=$2^0:2^{-1}:2^{-2}:2^{-3}$. Note that SF1 to SF4 may appear in any order, and therefore the order of appearance of the sustain periods Ts1, ..., Ts4 is also arbitrary. By combining the sustain periods, the desired gray scale display, from among the $2^4$ gradations, can be performed.

The gradation of each pixel is determined by which subframe periods are selected for light emission during one frame period. For example, if n=4, and the brightness of pixels having light emitted during all of the sustain periods is taken as 100%, then for a case of the pixels emitting light in Ts1 and Ts2, the brightness is expressed as 80%, and when Ts2, Ts3, and Ts4 are selected, the brightness can be expressed as 47%.

With the present invention, even if the Id-Vg characteristics of the TFTs vary slightly, dispersion in the amount of current output when equal gate voltages are applied can be suppressed by the above structure. It therefore becomes possible to avoid the situation in which the amount of light emitted by EL elements of adjacent pixels differs greatly due to variations in the Id-Vg characteristics, even with the same voltage signal input.

Further, in a sustain period Tsp in which the brightness of light emitted is 1/m of that emitted in other sustain periods Ts1 to Tsn, if the lengths of the other sustain periods Ts1 to Tsn is taken as $2^{-(n-1)}T$ (where T is a positive constant), then the light emitting time of the El elements can be set as $2^{-(p-1)}T \times m$. In accordance with the above structure, by regulating the brightness of light emitted by the EL elements during the sustain period Tsp to be 1/m that emitted during the other sustain periods, the length ratio of the sustain period Tsp to all of the sustain periods can be extended by a multiple of m compared to a case in which the brightness of light emitted during the sustain period Tsp is not set to 1/m. Therefore, in accordance with increasing the number of gray scale of images, even if the number of bits n becomes larger and the length of the sustain periods becomes shorter, the length of the sustain periods can be extended by lowering the brightness of the light emitted by the EL elements.

Further, an example of driving by non-interlaced scanning is explained in this embodiment, but it is also possible to drive by interlacing.

Furthermore, it is possible to combine the constitution of Embodiment 10 with the constitutions of any of Embodiments 1, and 3 to 8.

Embodiment 11

The EL display device (EL module) formed by performing the present invention is superior to a liquid crystal display device in visibility in bright places because of its self-luminous properties. Therefore, the present invention can be used as a display portion of a direct-view type EL display (indicating a display equipped with an EL module). As the EL display, there are a personal computer monitor, a TV receiving monitor, an advertisement display monitor, and so on.

The present invention can be operated to all electronic equipment that includes displays as constituent parts, including the aforementioned EL display.

As the electronic equipment, there are an EL display, video camera, digital camera, head mounted type display, car-navigator, personal computer, portable information terminal (mobile computer, mobile phone, electronic book, etc.), and picture reproducer provided with recording media (specifically, device which can reproduce a recording medium and equip a display capable of displaying the image such as compact disk (CD), laser disc (LD), or digital video disc (DVD)). Examples of the electronic equipment are shown in FIG. 17.

Figure 17A:
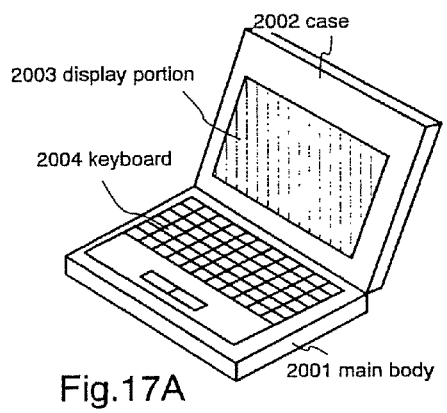
FIGS. 17A to 17E are electronic equipment using an EL display of the present invention.

FIG. 17(A) depicts a personal computer, which includes a main body 2001, case 2002, display portion 2003, and keyboard 2004. The present invention can be used as the display device 2003.

Figure 17B:
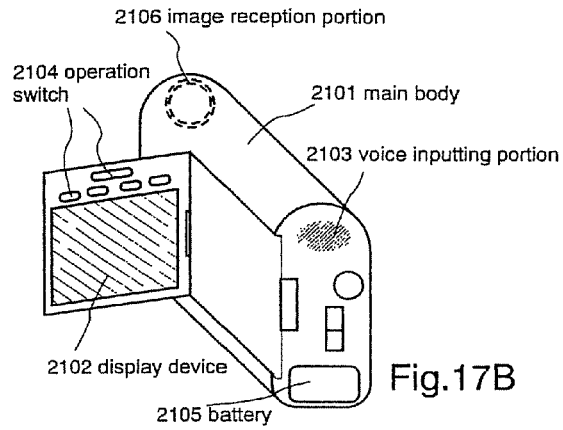

FIG. 17(B) depicts a video camera, which includes a main body 2101, display device 2102, voice inputting portion 2103, operation switch 2104, battery 2105, and image reception portion 2106. The present invention can be used as the display device 2102.

Figure 17C:
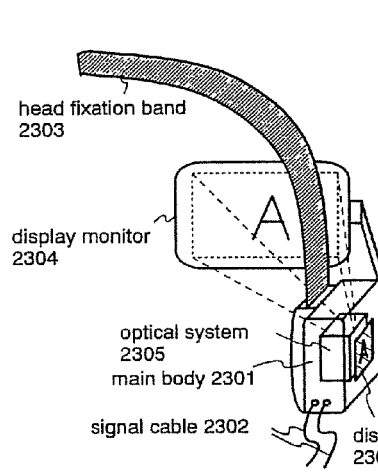

FIG. 17(C) depicts a part of a head mounted type EL display (right side), which includes a main body 2301, signal cable 2302, head fixation band 2303, display monitor 2304, optical system 2305, and display device 2306. The present invention can be used as the display device 2306.

Figure 17D:
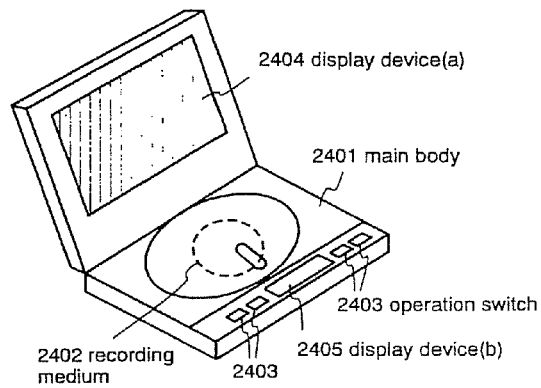

FIG. 17(D) depicts a picture reproducer (specifically, DVD reproducing player) provided with recording media, which includes a main body 2401, recording medium 2402 (CD, LD, DVD, etc.), operation switch 2403, display device (a) 2404, and display panel (b) 2405. The display device (a) 2404 chiefly displays image information, and the display device (b) 2405 chiefly displays character information. The present invention can be used as the display devices (a) 2404 and (b) 2405. The present invention is applicable to a CD player or a game machine as a picture reproducer provided with recording media.

Figure 17E:
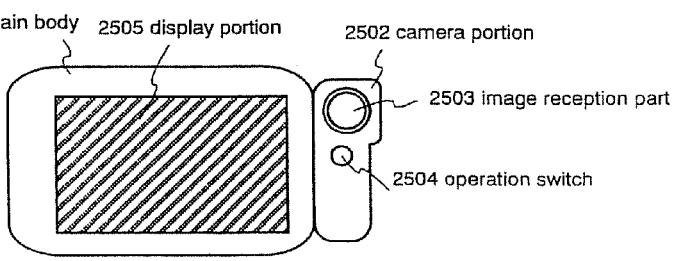
Figure 18:
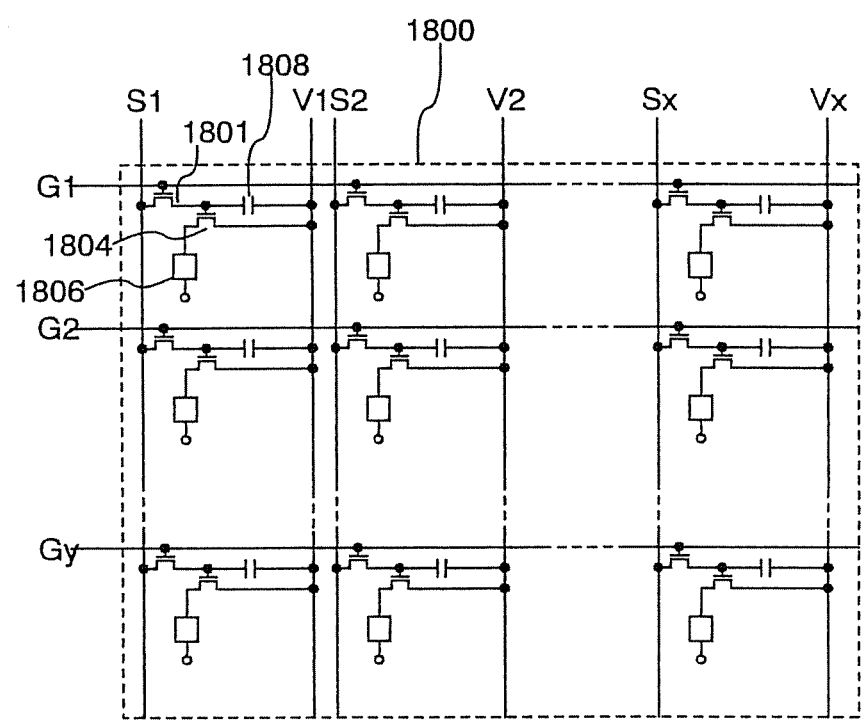
FIG. 18 is a circuit diagram of a pixel portion of an analog type EL display.
Figure 19:
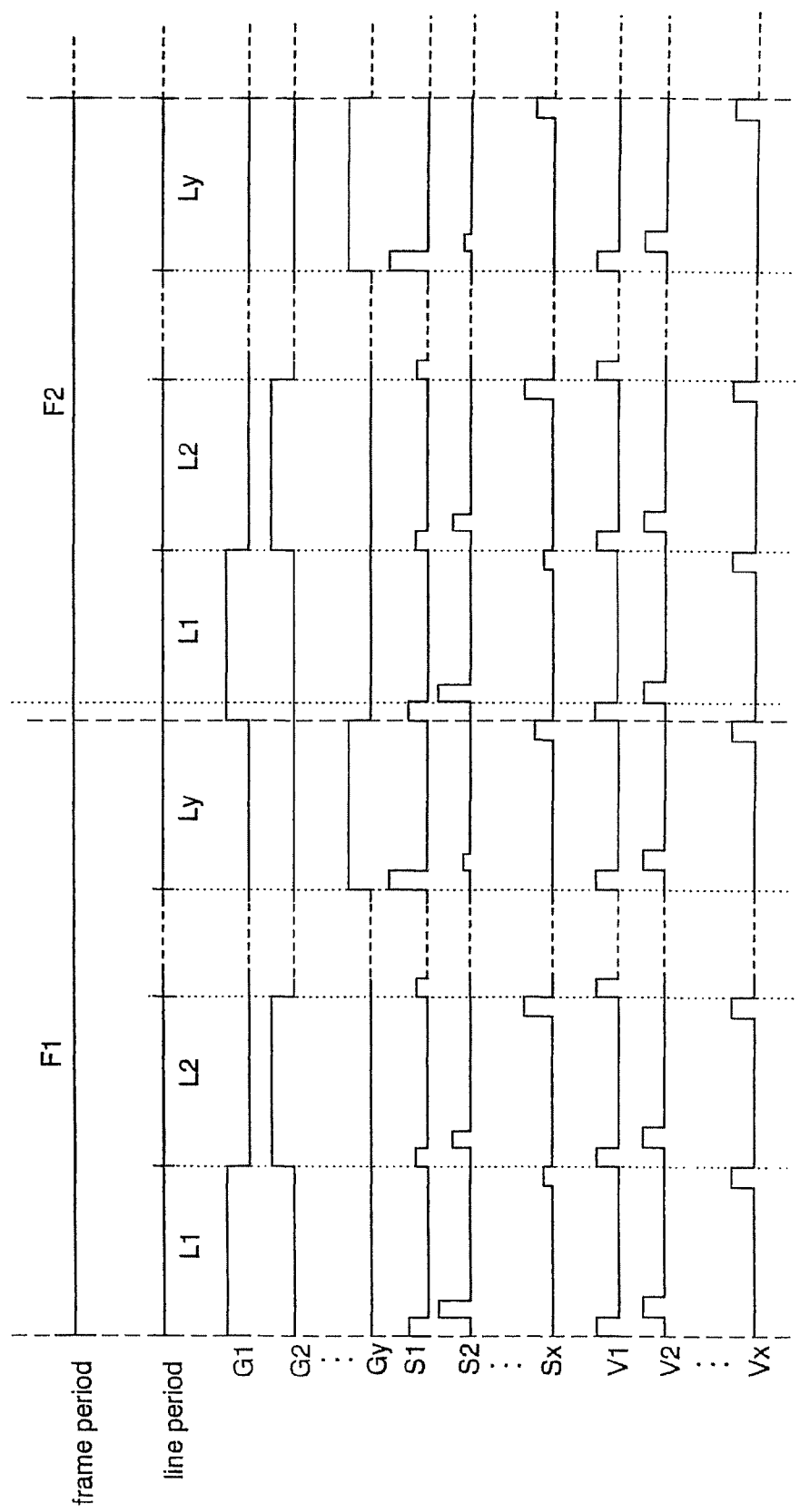
FIG. 19 is a timing chart of an analog type EL display.

FIG. 17(E) depicts a portable (mobile) computer, which includes a main body 2501, camera portion 2502, image reception part 2503, operation switch 2504, and display portion 2505. The present invention can be used as the display device 2505.

If the luminescence brightness of the EL material is enhanced in the future, the present invention will be applicable to a front or rear type projector.

The present invention has a quite wide scope of application, as mentioned above, and is applicable to electronic equipment in all fields. The electronic equipment of this embodiment can be realized by the using any structure resulting from the free combination of embodiments 1 to 10.

With the above structure of the present invention, it becomes possible to regulate the light emission brightness of an EL element in accordance with the value of an EL driver voltage applied to the EL element, and it becomes possible to display a vivid image with good balance between the brightnesses of red color, blue color, and green color light emissions. In addition, even if the amount of current controlled by an EL driver TFT increases due to the applied voltages becoming larger, deterioration of the EL driver TFT can be suppressed.

With the present invention, even if the Id-Vg characteristics of the TFTs vary slightly, dispersion in the amount of current output when equal gate voltages are applied can be suppressed by the above structure. It therefore becomes possible to avoid the situation in which the amount of light emitted by EL elements of adjacent pixels differs greatly due to variations in the Id-Vg characteristics, even with the same voltage signal input.

Further, in a sustain period Tsp in which the brightness of light of El element emitted is 1/m of that emitted in other sustain periods Ts1 to Tsn, if the lengths of the other sustain periods Ts1 to Tsn is taken as $2^{-(n-1)}T$ (where T is a positive constant), then the light emitting time of the EL element can be set as $2^{-(p-1)}T \times m$. In accordance with the above structure, by regulating the brightness of light emitted by the EL elements during the sustain period Tsp to be 1/m that emitted during the other sustain periods, the length ratio of the sustain period Tsp to all of the sustain periods can be extended by a multiple of m compared to a case in which the brightness of light emitted during the sustain period Tsp is not set to 1/m. Therefore, in accordance with increasing the number of display gradations, even if the number of bits n becomes larger and the length of the sustain periods becomes shorter, the length of the sustain periods can be extended by lowering the brightness of the light emitted by the EL elements.

What is claimed is:

1. A light emitting device comprising:
   a semiconductor layer over a first substrate, the semiconductor layer comprising a channel formation region;
   a gate electrode overlapping with the channel formation region;
   a first insulating film over the semiconductor layer and the gate electrode;
   a wiring over the first insulating film;
   a second insulating film over the wiring;
   a first electrode over the second insulating film, wherein the first electrode is electrically connected to the semiconductor layer through the wiring;
   a third insulating film over the second insulating film, and covering an edge portion of the first electrode;
   an EL layer over the first electrode and the third insulating film;
   a second electrode over the EL layer;
   an organic material overlapping with the second electrode and the semiconductor layer; and
   a second substrate over the organic material,
   wherein the second insulating film comprises a resin,
   wherein a first portion of the first electrode overlaps with the channel formation region of the semiconductor layer, and
   wherein the first portion of the first electrode does not overlap with the third insulating film.

2. The light emitting device according to claim 1, further comprising:
   a sealing material between the first substrate and the second substrate.

3. The light emitting device according to claim 1, wherein the first insulating film comprises an insulating film including silicon.

4. The light emitting device according to claim 1, wherein the third insulating film comprises a resin.

5. The light emitting device according to claim 1, wherein a drying agent is provided between the second electrode and the second substrate.

6. The light emitting device according to claim 1, wherein the channel formation region comprises polysilicon.

7. The light emitting device according to claim 1, wherein the gate electrode is located over the semiconductor layer.

8. A light emitting device comprising:
   a semiconductor layer over a first substrate, the semiconductor layer comprising a channel formation region;
   a gate electrode overlapping with the channel formation region;
   a first insulating film over the semiconductor layer and the gate electrode;
   a wiring over the first insulating film;
   a second insulating film over the wiring;
   a first electrode over the second insulating film, wherein the first electrode is electrically connected to the semiconductor layer through the wiring;
   a third insulating film over the second insulating film, and covering an edge portion of the first electrode;
   an EL layer over the first electrode and the third insulating film;
   a second electrode over the EL layer; and
   a second substrate over the second electrode,
   wherein the second insulating film comprises a resin,
   wherein a first portion of the first electrode overlaps with the channel formation region of the semiconductor layer,
   wherein the first portion of the first electrode does not overlap with the third insulating film, and
   wherein enclosed space is formed by the first substrate, the second substrate, and a sealing material.

9. The light emitting device according to claim 8, wherein the first insulating film comprises an insulating film including silicon.

10. The light emitting device according to claim 8, wherein the third insulating film comprises a resin.

11. The light emitting device according to claim 8, wherein a drying agent is provided between the second electrode and the second substrate.

12. The light emitting device according to claim 8, wherein the channel formation region comprises polysilicon.

13. The light emitting device according to claim 8, wherein the gate electrode is located over the semiconductor layer.

14. A light emitting device comprising:
   a semiconductor layer over a first substrate, the semiconductor layer comprising a channel formation region;
   a gate electrode overlapping with the channel formation region;
   a first insulating film over the semiconductor layer and the gate electrode;
   a wiring over the first insulating film;
   a second insulating film over the wiring;
   a first electrode over the second insulating film, wherein the first electrode is electrically connected to the semiconductor layer through the wiring;
   a third insulating film over the second insulating film, and covering an edge portion of the first electrode;
   an EL layer over the first electrode and the third insulating film;
   a second electrode over the EL layer; and
   a second substrate comprising a resin over the second electrode,
   wherein the second insulating film comprises a resin,
   wherein a first portion of the first electrode overlaps with the channel formation region of the semiconductor layer, and
   wherein the first portion of the first electrode does not overlap with the third insulating film.

15. The light emitting device according to claim 14, further comprising:
   a sealing material between the first substrate and the second substrate.

16. The light emitting device according to claim 14, wherein the first insulating film comprises an insulating film including silicon.

17. The light emitting device according to claim 14, wherein the third insulating film comprises a resin.

18. The light emitting device according to claim 14, wherein a drying agent is provided between the second electrode and the second substrate.

19. The light emitting device according to claim 14, wherein the channel formation region comprises polysilicon.

20. The light emitting device according to claim 14, wherein the gate electrode is located over the semiconductor layer.

21. A light emitting device comprising:
a semiconductor layer over a first substrate, the semiconductor layer comprising a channel formation region;
a gate electrode overlapping with the channel formation region;
a first insulating film over the semiconductor layer and the gate electrode;
a wiring over the first insulating film;
a second insulating film over the wiring;
a first electrode over the second insulating film, wherein the first electrode is electrically connected to the semiconductor layer through the wiring;
a third insulating film over the second insulating film, and covering an edge portion of the first electrode;
an EL layer over the first electrode and the third insulating film;
a second electrode over the EL layer;
a fourth insulating film over the second electrode;
an organic material over the fourth insulating film; and
a second substrate over the organic material,
wherein the second insulating film comprises a resin,
wherein the fourth insulating film comprises silicon nitride,
wherein a first portion of the first electrode overlaps with the channel formation region of the semiconductor layer, and
wherein the first portion of the first electrode does not overlap with the third insulating film.

22. The light emitting device according to claim 21, further comprising:
a sealing material between the first substrate and the second substrate.

23. The light emitting device according to claim 21, wherein the first insulating film comprises an insulating film including silicon.

24. The light emitting device according to claim 21, wherein the third insulating film comprises a resin.

25. The light emitting device according to claim 21, wherein a drying agent is provided between the second electrode and the second substrate.

26. The light emitting device according to claim 21, wherein the channel formation region comprises polysilicon.

27. The light emitting device according to claim 21, wherein the gate electrode is located over the semiconductor layer.

28. A light emitting device comprising:
a pixel over a first substrate, the pixel comprising a first thin film transistor and a second thin film transistor,
a first insulating film over the first thin film transistor and the second thin film transistor;
a first electrode over the first insulating film, and electrically connected to the first thin film transistor;
a second insulating film over the first insulating film, and covering an edge portion of the first electrode;
an EL layer over the first electrode and the second insulating film;
a second electrode over the EL layer;
an organic material overlapping with the second electrode and the first thin film transistor; and
a second substrate over the organic material,
wherein the first insulating film comprises a resin,
wherein a first portion of the first electrode overlaps with a first channel formation region of the first thin film transistor,
wherein the first portion of the first electrode does not overlap with the second insulating film, and
wherein a width of the first channel formation region of the first thin film transistor is greater than a width of a second channel formation region of the second thin film transistor.

29. The light emitting device according to claim 28, further comprising:
a sealing material between the first substrate and the second substrate.

30. The light emitting device according to claim 28, wherein the second insulating film comprises a resin.

31. The light emitting device according to claim 28 wherein a drying agent is provided between the second electrode and the second substrate.

32. The light emitting device according to claim 28, wherein each of the first channel formation region and the second channel formation region comprises polysilicon.

33. A light emitting device comprising:
a pixel over a first substrate, the pixel comprising a first thin film transistor and a second thin film transistor,
a first insulating film over the first thin film transistor and the second thin film transistor;
a first electrode over the first insulating film, and electrically connected to the first thin film transistor;
a second insulating film over the first insulating film, and covering an edge portion of the first electrode;
an EL layer over the first electrode and the second insulating film;
a second electrode over the EL layer;
an organic material overlapping with the second electrode and the first thin film transistor; and
a second substrate over the organic material,
wherein the first insulating film comprises a resin,
wherein a first portion of the first electrode overlaps with a first channel formation region of the first thin film transistor,
wherein the first portion of the first electrode does not overlap with the second insulating film, and
wherein a length of the first channel formation region of the first thin film transistor is greater than a length of a second channel formation region of the second thin film transistor.

34. The light emitting device according to claim 33, further comprising:
a sealing material between the first substrate and the second substrate.

35. The light emitting device according to claim 33, wherein the second insulating film comprises a resin.

36. The light emitting device according to claim 33, wherein a drying agent is provided between the second electrode and the second substrate.

37. The light emitting device according to claim 33, wherein each of the first channel formation region and the second channel formation region comprises polysilicon.

* * * * *

UNITED STATES PATENT AND TRADEMARK OFFICE
CERTIFICATE OF CORRECTION

PATENT NO. : 8,933,624 B2  
APPLICATION NO. : 13/783924  
DATED : January 13, 2015  
INVENTOR(S) : Jun Koyama Page 1 of 2

It is certified that error appears in the above-identified patent and that said Letters Patent is hereby corrected as shown below:

In the Specification:

Column 10, Line 63; Change "Lm4:" to --Lm3:--.

Column 13, Line 33; Change "maintained at" to --maintained--.

Column 13, Line 35; Change "TFT 108," to --TFT 110,--.

Column 13, Line 39; Change "TFT 108," to --TFT 110,--.

Column 13, Line 48; Change "faulting" to --forming--.

Column 14, Line 23; Change "switching 201" to --switching TFT 201--.

Column 15, Line 32; Change "ITT" to --TFT--.

Column 16, Line 64; Change "patents" to --Patents--.

Column 17, Line 4; Change "faulting" to --forming--.

Column 20, Line 50; Change "Ts1, Ts4" to --Ts1, ..., Ts4--.

Column 20, Line 54; Change "Ts1, Ts4" to --Ts1, ..., Ts4--.

Column 20, Line 54; Change "Lm1, Lm4," to --Lm1, ..., Lm4,--.

Column 24, Line 60; Change "electro-they mal" to --electro-thermal--.

Column 29, Line 49; Change "driver 11104" to --driver TFT 1104--.

Column 30, Line 24; Change "LET" to --TFT--.

Column 30, Line 58; Change "EFTs" to --TFTs--.

Column 32, Line 52; Change "p-channel 117" to --p-channel TFT--.

Column 33, Line 3; Change "switching 1301" to --switching TFTs 1301--.

Column 33, Line 13; Change "driver 11304" to --driver TFT 1304--.

Column 35, Line 5; Change "all is" to --all 1 is--.

Column 38, Line 59; Change "Ts(n-3), Ts1" to --Ts(n-3), ..., Ts1--.

Signed and Sealed this  
Twenty-sixth Day of May, 2015

Michelle K. Lee  
*Director of the United States Patent and Trademark Office*

Column 39, Line 19; Change "Lm4:" to --Lm3:--.

Column 43, Line 1; Change "Ts1, Ts4" to --Ts1, ..., Ts4--.